US 6,646,944 B2

(12) United States Patent
Shimano et al.

(10) Patent No.: US 6,646,944 B2
(45) Date of Patent: Nov. 11, 2003

(54) SEMICONDUCTOR MEMORY DEVICE

(75) Inventors: Hiroki Shimano, Hyogo (JP); Katsumi Dosaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/164,651

(22) Filed: Jun. 10, 2002

(65) Prior Publication Data

US 2003/0067825 A1 Apr. 10, 2003

(30) Foreign Application Priority Data

Oct. 5, 2001 (JP) ........................................ 2001-310152

(51) Int. Cl.[7] ................................................ G11C 7/00
(52) U.S. Cl. ................... 365/222; 365/149; 365/230.03
(58) Field of Search ............................ 365/222, 230.03, 365/200, 149

(56) References Cited

U.S. PATENT DOCUMENTS 6,415,353 B1 * 7/2002 Leung ........................ 711/106
6,490,215 B2 * 12/2002 Komura et al. ............. 365/222

FOREIGN PATENT DOCUMENTS

JP 2105390 A 4/1990

* cited by examiner

Primary Examiner—Son Mai
(74) Attorney, Agent, or Firm—Burns, Doane, Swecker & Mathis, LLP

(57) ABSTRACT

In a memory sub-block, a refresh activation instruction signal from a main control circuit is taken in by a de-multiplexer in a local control circuit under a predetermined condition and refreshing is executed in the memory sub-block. The de-multiplexer is inhibited from taking in this refresh activation instruction signal when an adjacent memory sub-block is in an inactivated state with the corresponding memory block being in an activated state or when refreshing is completed in the corresponding memory sub-block, and transfers this refresh activation instruction signal to a local control circuit arranged for the memory sub-block on the next stage in a refresh activation instruction signal transferring path. Upon completion of refreshing in all the memory sub-blocks, refreshing is carried out on the next refresh address. It is possible to provide a semiconductor memory device which can fully hide a refreshing operation from outside.

18 Claims, 35 Drawing Sheets

| MEMORY BLOCK RELATED TO NORMAL ACCESS STATE | REFRESH ACCEPTANCE LATCHING STATE | REFRESH ACCEPTANCE PERMISSION SIGNAL |
|---|---|---|
| "H" (ACCESSING) | — | "L" (NOT PERMITTED) |
| "L" (NON-ACCESSING) | "H" (ALREADY ACCEPTED) | "L" (NOT PERMITTED) |
| "L" (NON-ACCESSING) | "L" (UN-ACCEPTED) | "H" (PERMITTED) |

FIG. 31 (CORRESPONDING TO FIG. 8)

F I G. 4 3
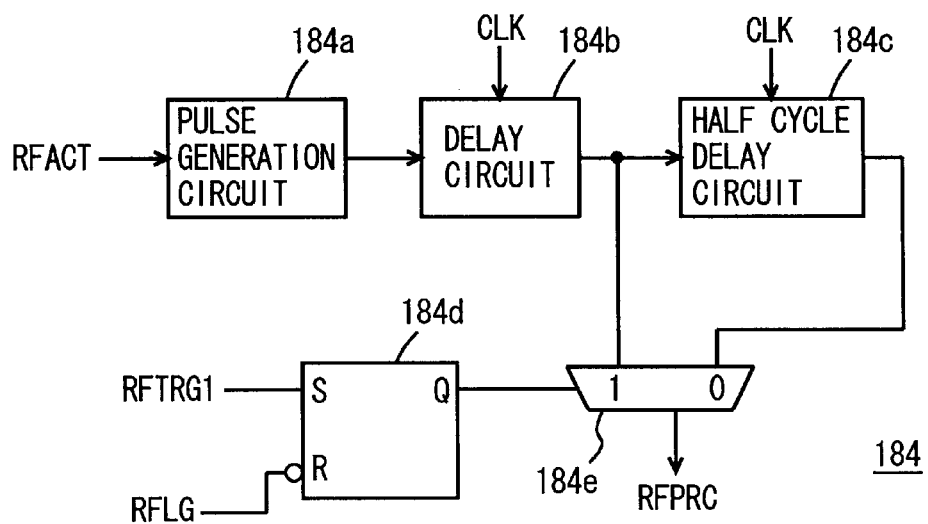

SEMICONDUCTOR MEMORY DEVICE

BACKGROUND OF THE INVENTION

1. Field of the Invention

The present invention relates to a semiconductor memory device, and, more particularly, to a dynamic random access memory (DRAM) that needs to periodically refresh stored data in memory cells. More specifically, the present invention relates to a construction for controlling the refresh of an embedded DRAM that is assembled in a system LSI (Large Scale Integrate Circuit).

2. Description of the Background Art

In the data processing field or the like, a system LSI, formed by integrating a logic such as a processor and a memory device on the same semiconductor chip, has been used in order to process data at a high speed with low power consumption. In this system LSI, since the logic and the memory device are interconnected to each other through on-chip interconnection lines, it is possible to provide at least the following advantages:

(1) Since the load of a signal line is small as compared with an on-board wiring line, it is possible to transmit data/signals at a high speed.

(2) Since there is no limitation of the number of pin terminals, the pitch of signal lines of the data bus is made as small as the memory internal interconnection lines, thereby making it possible to increase the number of data bits, and consequently to widen the band width of data transfer.

(3) In comparison with a construction in which discrete components are arranged on a board, it is possible to reduce the system scale and to achieve a compact small-size system since respective components integrated on the semiconductor chip, and (4) Since a macro reserved as a library can be arranged for a component formed on the semiconductor chip, the designing efficiency is improved.

For the reasons as described above and others, the system LSI has been widely used in various fields. With respect to the memory device to be integrated, memories, such as DRAM (Dynamic Random Access Memory), SRAM (Static Random Access Memory) and flash EEPROM (electrically programmable and erasable read only memory), have been used. Moreover, examples of the logic include a processor for carrying out controlling and processing operations, an analog processing circuit for carrying out an analog signal processing operation, such as analog/digital conversion and digital/analog conversion, and a logical circuit for carrying out logical processing such as specialized image processing.

Among semiconductor memory devices, the DRAM has a memory cell constituted by one capacitor and one transistor, and consequently is small in area occupied by the memory cell, thereby making it possible to achieve a large storage capacity with a small occupied area. However, information is stored in the capacitor of a memory cell in the form of charges. Consequently, the charges stored in this capacitor of a memory cell might be lost to cause the stored data to lose due to a leakage current, such as a junction leakage current between the substrate area and the impurity area of the storage node, a channel leakage current of the memory cell transistor, and a leakage current of the capacitor insulating film. In order to prevent the data loss due to such leakage currents, a refreshing operation for re-writing or restoring memory cell data at predetermined cycles is carried out.

In this refreshing operation, the refreshing is carried out at predetermined time intervals such that, within a maximum refresh time tREFmax determined by a memory cell having the shortest data holding time in the semiconductor chip, the refreshing operation is completed once on all the memory cells in the memory array.

With respect to this refreshing operation, during the normal operation mode for making data accesses to the DRAM, an external logic or an external controller issues a refresh instruction so that refreshing is carried out in the DRAM. Therefore, the refresh instruction needs to be issued every predetermined refresh interval in order to carry out this refreshing in the DRAM, and an access to the DRAM being refreshed needs to be suspended until the refresh cycle of the DRAM is completed. Thus, a complicated controlling and managing process on the memory is required.

In the case of the SRAM, the memory cell is constituted of a flip-flop circuit so that different from the DRAM, no refreshing operation is required. Therefore, in mobile information terminals or the like for which down-sizing is strongly demanded, the system construction using the SRAM that eliminates such a complicated memory controlling and managing process related to refreshing as described above has been widely used, in order to simplify the system construction.

However, in recent years, the mobile information terminal has been greatly improved in function so as to deal with image information as well, and has come to require a memory function with a large storage capacity. The SRAM has a construction in which one memory cell is constituted by four transistors and two load elements, and consequently has a memory cell size of nearly ten times as great as the memory cell size of the DRAM. Therefore, in the case when the SRAM is used for a memory with a large storage capacity, such problems arise that the chip area increases to be unable to satisfy the request for down-sizing, and the chip cost increases greatly, resulting in an increased cost of mobile information terminals.

Therefore, there has been a strong expectation for the DRAM that can achieve a memory with a large storage capacity at a low cost with a small occupied area, as a substitute for the SRAM. However, as described above, the DRAM requires a complex memory controlling operation related to refreshing and the existing DRAM is not compatible with the SRAM, and therefore, it is not easy to adopt the DRAM as a substitute memory for the SRAM.

SUMMARY OF THE INVENTION

It is an object of the present invention to provide a fully hidden refresh DRAM which can completely hide the refreshing operation from outside.

Another object of the present invention is to provide a DRAM having an interface that is compatible with the SRAM.

Still another object of the present invention is to provide a DRAM suitable for installation in a system LSI and easy in memory control.

The semiconductor memory device in accordance with the present invention includes: a plurality of memory sub-blocks each having a plurality of memory cells; a refresh instruction issuing circuit for issuing a refresh instruction for refreshing a memory cell; a refresh address generation circuit for generating a refresh address that specifies a memory cell to be refreshed in each memory sub-block; and a refresh control circuit arranged corresponding to each memory sub-block, and for, upon receipt of the refresh instruction, permitting an execution of refreshing operation on a corresponding memory sub-block in accordance with a received refresh address when the corresponding memory sub-block satisfies a condition different from a predetermined condition.

Upon issuing the refresh instruction, the refresh instruction is commonly issued to the memory sub-blocks inside the memory, and the refreshing operation is executed on a memory sub-block arranged in a specific condition. Therefore, an external memory controller such as a logic is not required to carry out a refreshing operation at all. Thus, it is possible to completely hide the refreshing operation in this semiconductor memory device from outside. Consequently, it becomes possible to achieve a substituting memory for the SRAM, which can be accessed in the same manner as the SRAM.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 43 is a timing chart that represents an operation of a pulse generator shown in FIG. 42;

DESCRIPTION OF THE PREFERRED EMBODIMENTS

First Embodiment

Figure 1:
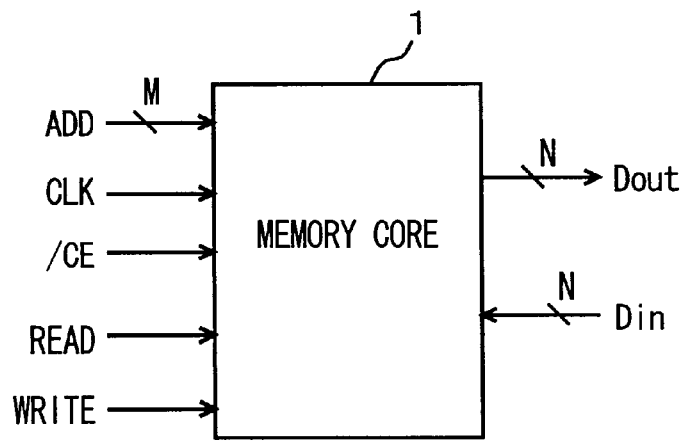
FIG. 1 is a drawing that shows external signals applied to a semiconductor memory device in accordance with the present invention.

FIG. 1 is a drawing that schematically shows a configuration of external signals of a semiconductor memory device in accordance with the present invention. In FIG. 1, this semiconductor memory device is shown as a memory core since it is assembled in a system LSI. A semiconductor memory device (memory core) 1, shown in FIG. 1, receives an externally applied address signal ADD of M bits, an external clock signal CLK, a chip enable signal /CE, a read out instruction signal READ and a write instruction signal WRITE, and outputs output data Dout of N bits and inputs input data Din of N bits.

As shown in FIG. 1, when the chip enable signal /CE is set to the active state at L-level, semiconductor memory device 1 is set to the selected state. When the read-out instruction signal READ or the write instruction signal WRITE is applied, the memory core carries out a memory cell selecting operation in accordance with the currently applied address signal ADD to input the data Din or output the data Dout.

To the semiconductor memory device shown in FIG. 1 receives only the instruction signals READ and WRITE for data accessing and the chip enable signal /CE as externally applied control signals, and when viewed externally, it is operated in the same manner as a normal SRAM. In other words, by correlating the data read-out instruction signal READ and the data writing instruction signal WRITE respectively with the output enable signal OE and the write enable signal/WE for SRAM, semiconductor memory device 1 can be accessed in the same manner as SRAM. This semiconductor memory device 1 has the same interface as a normal clock synchronous type SRAM, and can be used as an SRAM substituting memory.

Figure 2:
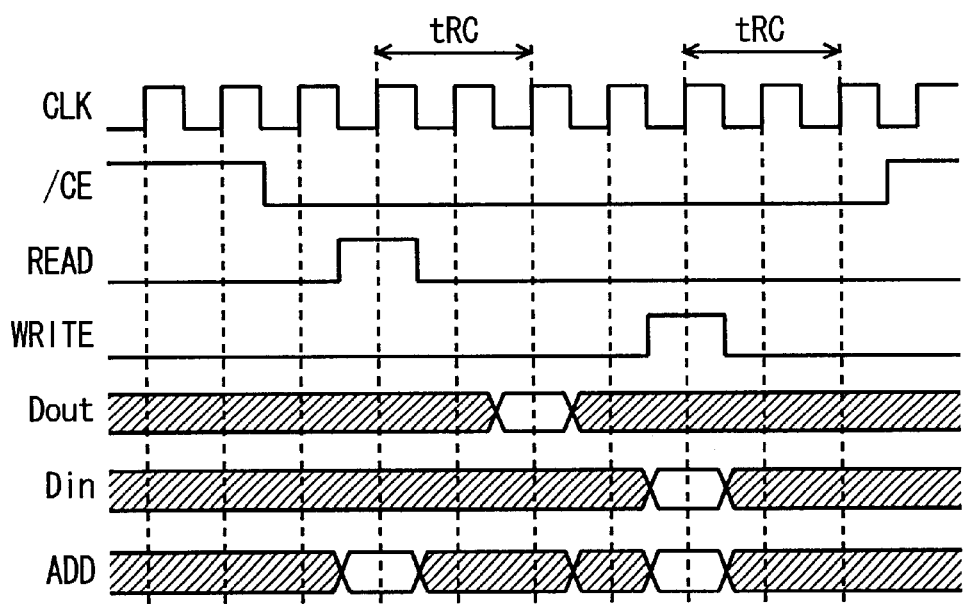
FIG. 2 is a timing chart that represents an operation in data accessing in the semiconductor memory device shown in FIG. 1.

FIG. 2 is a timing chart that represents an operation in data accessing of the semiconductor memory device shown in FIG. 1. As shown in FIG. 2, in the semiconductor memory device 1, in a clock cycle a predetermined number of clock cycles before a clock cycle in which actual data reading is carried out, the chip enable signal /CE is set to the L-level or the activated state. In FIG. 2, in a cycle one clock cycle before the clock cycle in which data reading is carried out, the chip enable signal /CE is set to the activated state. When the chip enable signal /CE is in the H level, the semiconductor memory device 1 is in the stand-by state, and does not accept data accessing.

After a predetermined number of clock cycles have elapsed since the setting of this chip enable signal /CE to the L level, the read-out instruction signal READ is set to the H level in order to provide a data read-out instruction, and an address ADD is externally applied as well. In synchronization with the rise of the clock signal CLK, the semiconductor memory device 1 takes in the data read-out instruction signal READ applied externally, and internally carries out a memory cell selecting operation for reading out data.

After a lapse of a period referred to as column latency CL, data Dout in a memory cell of the address specified by the address signal ADD is outputted. FIG. 2 represents a data read-out operation in the case when the column latency CL is set to 2.

When a data writing operation is carried out, the writing instruction signal WRITE is set to the H level, and write data Din and the external address signal ADD are simultaneously applied in synchronization with the clock CLK. This writing instruction signal WRITE is taken in semiconductor memory device 1 in synchronization with the rising of the clock signal CLK so that the data writing operation is internally carried out.

As illustrated in FIG. 2, the control signals of semiconductor memory device 1 in external accessing are the same as those of a normal clock synchronous type SRAM. When the chip enable signal /CE is in the H level, a refreshing operation is carried out in semiconductor memory device 1 in predetermined intervals. While this chip enable signal /CE is in the L level, when the read-out instruction signal READ or the writing instruction signal WRITE becomes the activated state, an internal refreshing operation is carried out so as not to cause conflict with the data accessing operation. In the case of no data accessing, the refreshing is carried out internally in predetermined intervals.

In order to ensure a time period required for performing a process for preventing conflict between the refreshing and data accessing in semiconductor memory device 1, the chip enable signal /CE is set to the L level in a cycle a predetermined number of clock cycles before an actual data accessing.

When the predetermined cycle for setting this chip enable signal /CE to L level is set to a cycle prior to an appropriate number of cycles, it is possible to set the internal refreshing operation to the completed state at the time of actual data accessing, and therefore, to prevent the conflict between refreshing and data accessing without any sacrifice of the accessing time.

Therefore, in this semiconductor memory device 1, only the data accessing is instructed, and the refreshing operation is automatically carried out internally. Thus, it is not necessary for the external memory controller to supply any refreshing instruction to this semiconductor memory device 1, and it becomes possible to achieve a semiconductor memory device having an interface that is fully compatible with the SRAM.

Figure 3:
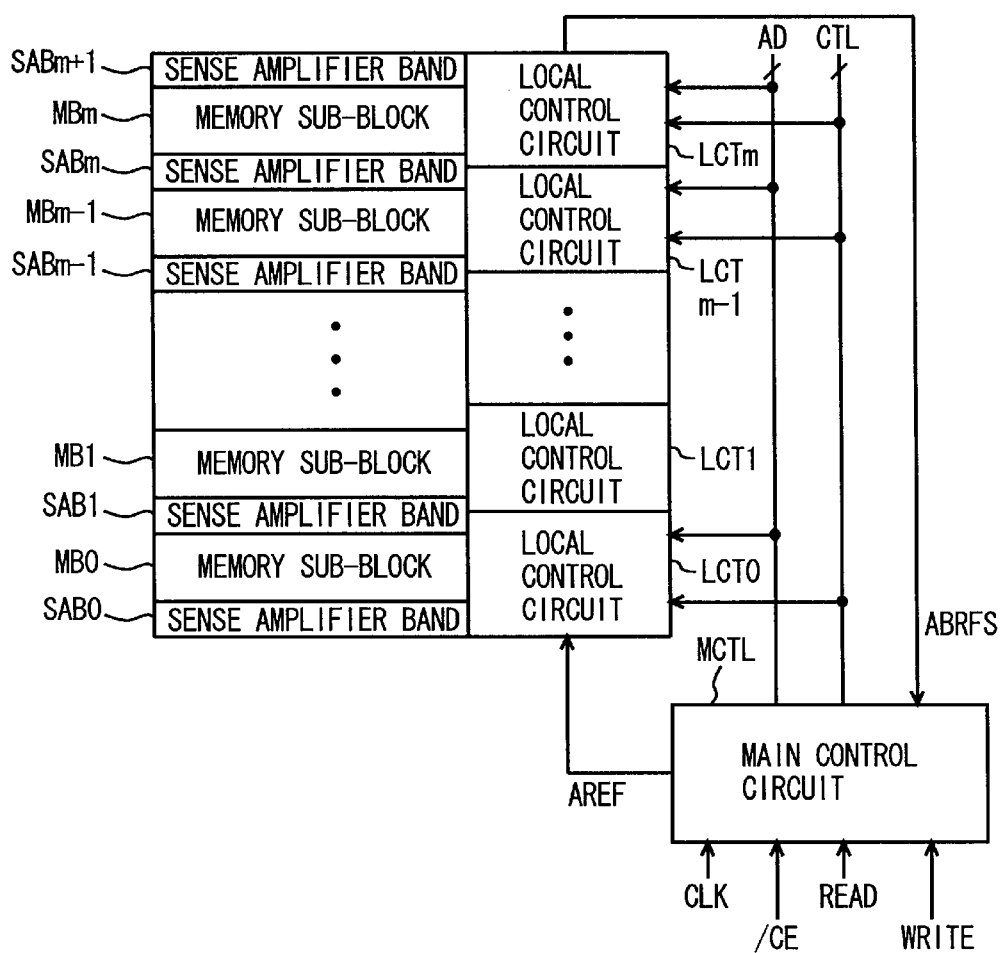
FIG. 3 is a drawing that schematically shows a construction of a main part of the semiconductor memory device in accordance with the present invention.

FIG. 3 is a drawing that schematically shows the construction of an essential part of this semiconductor memory device 1. In FIG. 3, this semiconductor memory device 1 includes: a plurality of memory sub-blocks MB0–MBm, sense amplifier bands SAB1–SABm arranged between the memory sub-blocks MB0–MBm and sense amplifier bands SAB0 and SABm +1 that are arranged outsides of the memory sub-blocks MB0 and MBm, respectively. In each of these memory sub-blocks MB0–MBm, memory cells are arranged in rows and columns. These memory cells are DRAM cells to store information in capacitors. DRAM cell is a 1-transistor/1-capacitor type cell. An arrangement may be used in which data of one bit is stored in two DRAM cells.

A main control circuit MCTL is arranged in common to the memory sub-blocks MB0–MBm, and local control circuits LCT0–LCTm are arranged corresponding to the respective memory sub-blocks MB0–MBm.

The clock signal CLK, the chip enable signal /CE, the data read-out instruction signal READ and the data writing instruction signal WRITE are applied to the main control circuit MCTL. The main control circuit MCTL includes a control circuit for carrying out a refreshing, and in the refreshing, generates an internal refresh instruction AREF for application to local control circuits LCT0–LCTm.

The internal refresh instruction AREF is successively transferred to the local control circuits LCT0–LCTm in a predetermined sequence, and in the case when the refreshing is executable in a corresponding memory sub-block, the refreshing is carried out in accordance with the internal refresh instruction AREF. In the case when no refreshing is carried out in any of the local control circuits LCT0–LCTm, the internal refresh instruction AREF is returned to the main control circuit MCTL as an all block refresh skip instruction signal ABRFS.

When all the block refresh skip instruction signals ABRFS is returned in the activated state, the main control circuit MCTL stops counting the number of times of executed refreshing, and carries out a controlling operation as if the issued refresh instruction AREF were not issued.

A common internal address signal AD and an internal control signal CTL are applied from the main control circuit MCTL to the local control circuits LCT0–LCTm. The local control circuits LCT0–LCTm, the construction of which will be explained later in detail, includes latch circuits for latching control signals, so as to carry out refreshing in parallel with internal data accessing. In accordance with a control signal CTL and a block address signal included in the address signal AD, these local control circuits LCT0–LCTm are individually driven to the activated state, and thus, the row selection for data accessing and the row selection for refreshing can be carried out in parallel in different memory sub-blocks.

Figure 4:
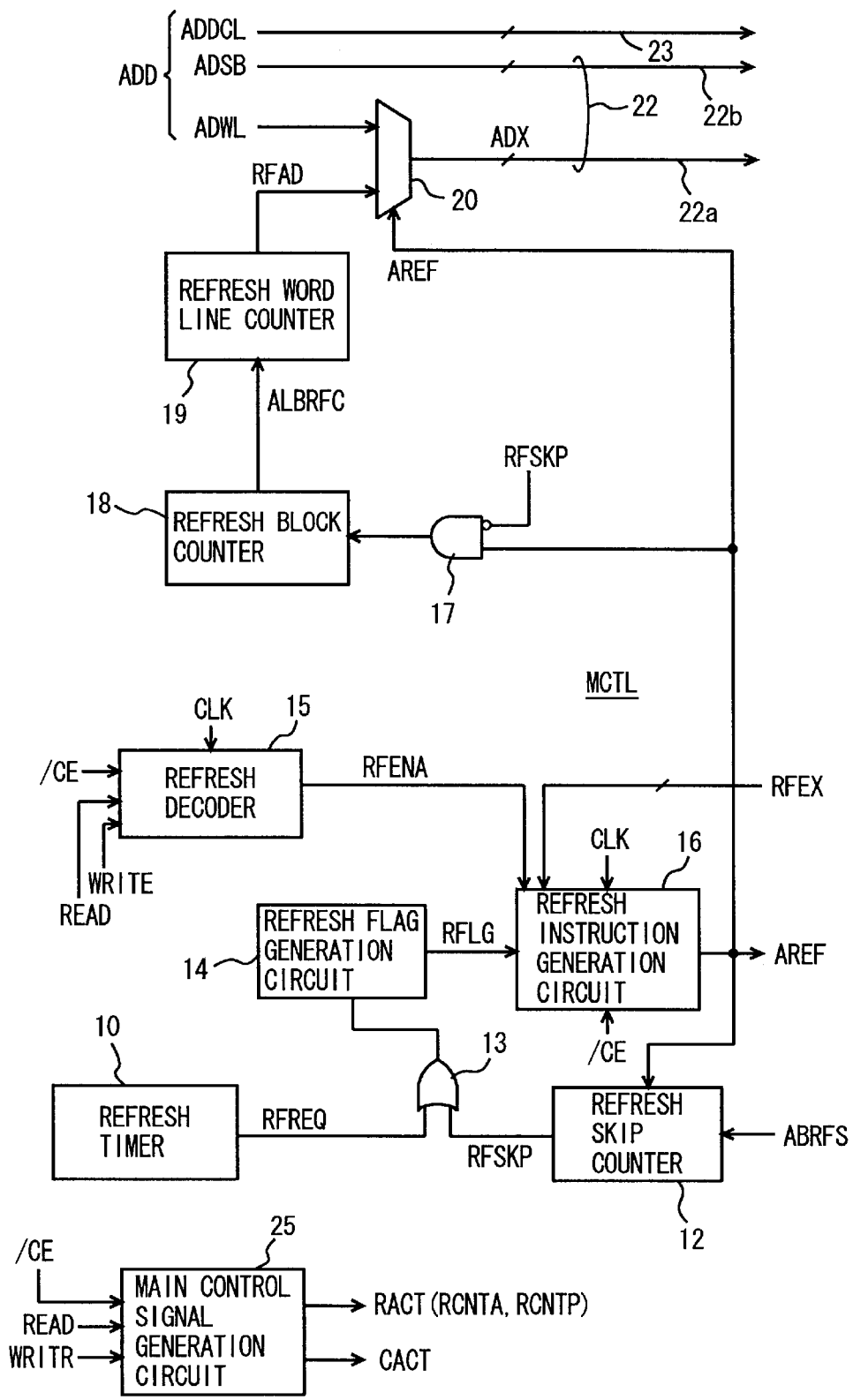
FIG. 4 is a drawing that schematically shows a construction of a main control circuit shown in FIG. 3.

FIG. 4 is a drawing that schematically shows the construction of a main part of the main control circuit MCTL shown in FIG. 3. In FIG. 4, the main control circuit MCTL includes: refresh timer 10 that issues a refresh request RFREQ in predetermined time intervals; refresh skip counter 12 that counts all lock refresh skip signals ABRFS from the local control circuits and subtracts the count in accordance with the internal refresh instruction AREF; an OR circuit 13 receiving refresh request RFREQ from refresh timer 10 and refresh skip flag RFSKP from refresh skip counter 12; a refresh flag generation circuit 14 for generating refresh flags RFLG used for repeatedly executing refreshing periodically in accordance with the output signal from OR circuit 13; a refresh decoder 15 that receives the chip enable signal /CE, the read-out instruction signal READ and the writing instruction signal WRITE, and issues a refresh enable signal RFENA when a data access is specified; and a refresh instruction generation circuit 16 that issues an internal refresh instruction AREF in accordance with the refresh enable signal RFENA and the refresh flag RFLG.

In the arrangement of main control circuit MCTL, refresh block counter 18, refresh word line counter 19 and multiplexer 20 constitute a refresh address generation circuitry for generating a refresh address common to the memory sub-blocks.

When chip enable signal /CE is in the L level and read-out instruction signal READ or writing instruction signal WRITE is in the activated state at the rising of clock signal CLK, refresh decoder 15 determines that a data accessing operation is specified, and issues refresh enable signal RFENA when this data accessing is specified. In other words, in this main control circuit MCTL, in the case when refresh flag RFLG is set in non-issuance of refresh request, when a data accessing operation is carried out in the normal operation mode, a refreshing operation is carried out. Thus, even when a refresh request has been skipped, the skipped refreshing is carried out without newly issuing a refresh request. Consequently, it is possible to prevent the possibility of data decay in memory cells due to prolonged refresh intervals.

In the case when this internal refresh instruction AREF is not taken in by any of memory sub-blocks and no refreshing is carried out, refresh skip counter 12 increments the count by one when all block refresh skip signal ABRFS is returned, and subtracts the count when internal refresh instruction AREF is issued. The minimum value of refresh skip counter 12 is 0, and even when internal refresh instruction AREF is issued when the count is 0, the count of this refresh skip counter 12 is maintained at 0.

When the count of refresh skip counter 12 is 0, refresh skip signal RFSKP is set in the L level. When there is any memory sub-block having refreshing thereof skipped, refresh skip flag RFSKP is maintained at the H level.

In the case when refresh flag RFLG is set, upon activation of refresh enable signal REFNA, refresh instruction generation circuit 16 issues internal refresh instruction AREF in response to the fall of the next clock signal CLK. In the case when refresh flag RFLG is set, upon activation of chip enable signal /CE, the refresh instruction generation circuit 16 issues internal refresh instruction AREF at an interval shorter than a period of issuing refresh request RFREQ. Refresh request RFREQ is issued at a time interval of, for example, several μsec or 10 and several μsec. In the case when refresh flag RFLG is in an assert state (set state) while chip enable signal /CE is in a de-assert state (non-active state), internal refresh instruction AREF is issued every clock cycles required for the refreshing operation, for example, every six clock cycles. Thus, the refreshing that has been skipped are all executed in a short time.

Main control circuit MCTL further includes: a gate circuit 17 receiving internal refresh instruction AREF and refresh skip flag RFSKP; a refresh block counter 18 that counts the output signal of gate circuit 17 for counting the number of blocks that have been refreshed; a refresh word line counter 19 which counts all block refresh completion signal ALBRFC from refresh block counter 18 to generate a refresh word line address; and a multiplexer 20 that selects one of externally applied word line address signal ADWL and refresh word line address signal from refresh word line counter 19 in accordance with internal refresh instruction AREF, and transfers the selected one to a lower address bus 22a.

The address bus 22 further includes buses 22b and 23 that transfer a block address signal ADSB included in an external address and an externally applied column address signal ADDCL, respectively. These externally applied address signals are buffered and transferred to local control circuits LCT0–LCTm.

Row decode circuits for decoding a word line address signal are arranged in local control circuits LCT0–LCTm, and when the corresponding memory sub-block is selected, the word line address signal ADX, transferred through multiplexer 20, is decoded by associated row decode circuit.

Main control circuit MCTL further includes a main control signal generation circuit 25 which receives chip enable signal /CE, read-out instruction signal READ and writing instruction signal WRITE to generate a main row related control signal RACT and a main column related control signal CACT. This main row related control signal RACT includes a main array activation signal RCNTA for activating a selected block and a main pre-charge activation signal RCNTP for pre-charging a selected memory block.

Column related control signal CACT is applied to column related circuitry, not shown, and controls selection of memory cell columns and a data writing and reading operations.

Figure 5:
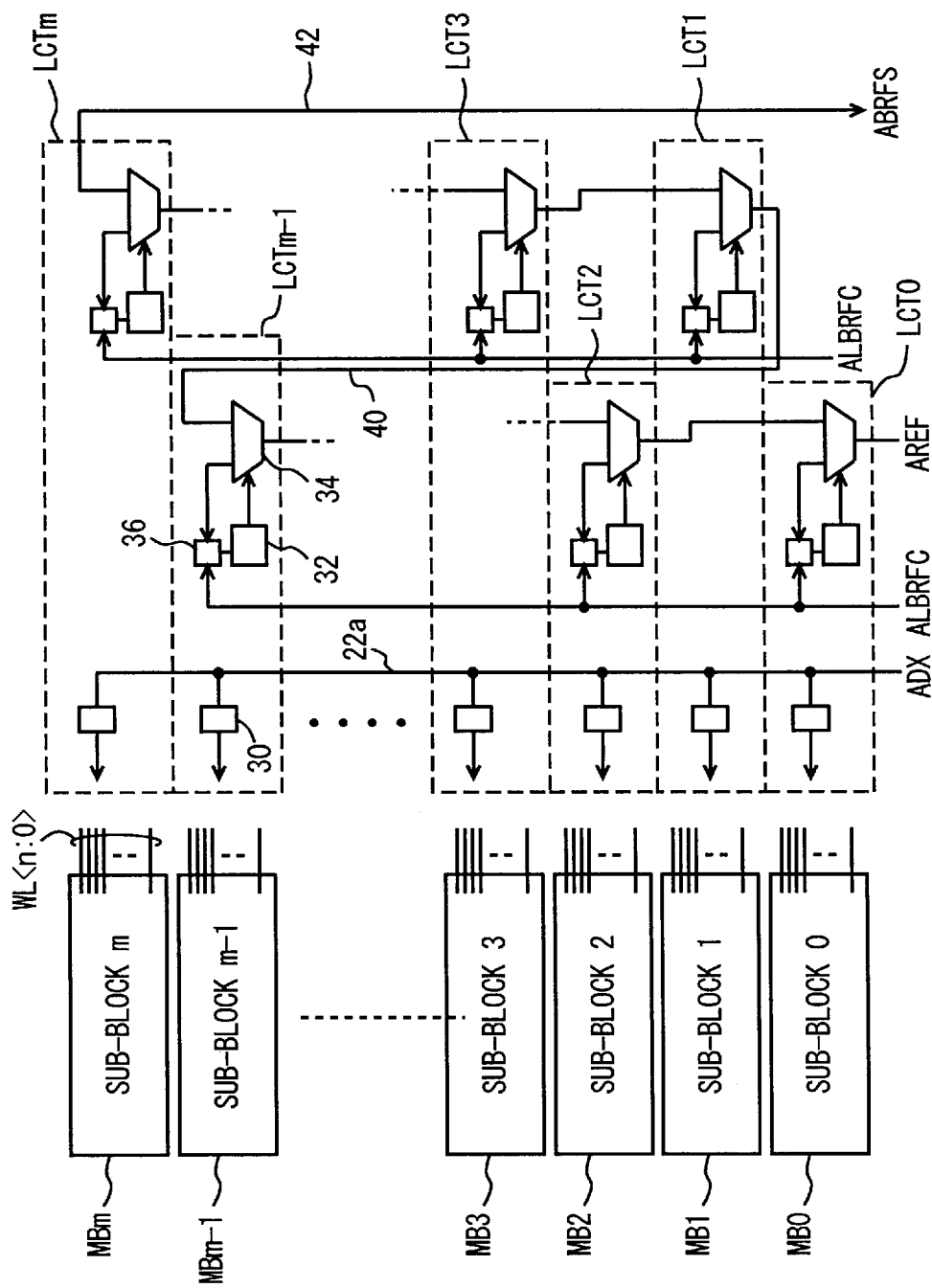
FIG. 5 is a drawing that schematically shows a construction of a refresh instruction transfer path in accordance with a first embodiment of the present invention.

FIG. 5 is a drawing that schematically shows the construction of a part related to refreshing in the local control circuit shown in FIG. 3. In FIG. 5, local control circuits LCT0–LCTm are arranged corresponding to memory sub-blocks MB0–MBm. In these local control circuits LCT0–LCTm, the construction of a part related to refreshing is the same, and therefore, in FIG. 5, only components of local control circuit LCTm−1 are indicated by reference numerals.

Local control circuit LCTm−1 includes: a decoder 30 which decodes a word line address signal ADX transferred through an address bus 22a when activated; a refresh acceptance permission signal generation circuit 32 for controlling an acceptance of the internal refresh instruction signal transferred through the local control circuit located on the previous stage in a transfer sequence of internal refresh instruction AREF; a de-multiplexer 34 which transfers the internal refresh instruction applied thereto according to the output signal of this refresh acceptance permission signal generation circuit 32 to one of the local control circuit located on the next stage in the refresh instruction transfer sequence and a its own latch circuits 36; and a refresh acceptance latch circuit 36 for latching the internal refresh instruction from de-multiplexer 34.

Refresh acceptance latch circuit 36 is reset in response to the assert (activation) of all block refresh completion signal ALBRFC.

Refresh acceptance permission signal generation circuit 32, de-multiplexer 34 and refresh acceptance latch circuit 36 constitute a refresh control circuit for controlling the refreshing operation of an associated memory sub-block.

The transfer sequence of internal refresh instruction AREF is a sequence for successively transferring the internal refresh instruction through local control circuits arranged for every other sub-blocks. In other words, in the construction shown in FIG. 5, internal refresh instruction AREF is successively transferred to even-numbered local control circuits LCT0, LCT2, . . . , LCTm−1 through de-multiplexers 34. Then, the internal refresh instruction from the de-multiplexer 34 of the final even-numbered local control circuit LCTm−1 is transferred to de-multiplexer 34 of local control circuit LCT1 arranged for odd-numbered memory sub-block MB1 through a signal line 40. Thereafter, internal refresh instruction AREF is successively transferred to odd-numbered local control circuits LCT1, LCT3, . . . , LCTm through de-multiplexers 34. All block refresh skip instruction signal ABRFS is returned to the main control circuit through a signal line 42 from de-multiplexer 34 of the final odd-numbered local control circuit LCTm.

Internal refresh instruction AREF is successively transferred to every other memory sub-blocks for the following reasons. In the case when a normal data access is carried out on one memory sub-block, during executing a refreshing operation on the adjacent memory sub-block, there causes a conflict with respect to sense amplifier band (not shown in FIG. 5). Internal refresh instruction AREF is successively transferred to memory sub-blocks that do not share a sense amplifier band. However, in the case in which all the memory sub-blocks MB0–MBm can function as banks and the sense amplifier band is not shared between any memory sub-block, this internal refresh instruction AREF may be successively transferred to local control circuits.

Refresh acceptance latch circuit 36 takes in the internal refresh instruction AREF received from de-multiplexer 34, for transference to the internal local row related control circuit, and is set to a latching state upon completion of the refreshing operation. This latching state of refresh acceptance latch circuit 36 indicates that the refreshing operation has been completed on the row specified by the refresh address in the corresponding memory sub-block.

Refresh acceptance permission signal generation circuit 32 asserts the refresh acceptance permission signal when the following conditions are satisfied: the data accessing operation is not carried out on the corresponding memory sub-block; refresh acceptance latch circuit 36 is not in the latching state; and no data accessing operation is carried out on the adjacent sub-block. In the case in which this sense amplifier band is not shared by the adjacent memory sub-blocks, that is, in the case in which all the memory sub-blocks MB0–MBm can function as banks, this condition of data accessing to the adjacent memory sub-blocks is ignored.

Figures 6, 7:
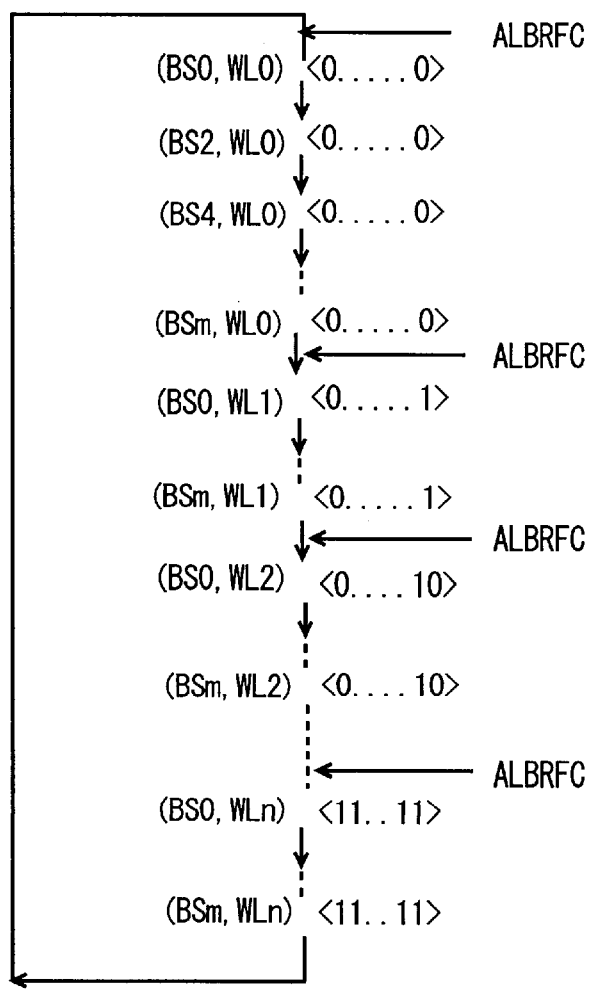
FIG. 6 is a drawing that shows logic in incorporating the refresh instruction in each local control circuit in a table form.
FIG. 7 is a drawing that shows an example of a sequence of the refreshing operation in the first embodiment of the present invention.

FIG. 6 shows the state transition of the refresh acceptance signal generation circuit shown in FIG. 5 in a list. As shown in FIG. 6, when the related memory block (the corresponding memory sub-block or either of the corresponding memory sub-block and the adjacent memory sub-block) is under data accessing, and when the block selection signal, for example, is in the H level, the refresh acceptance permission signal outputted from refresh acceptance permission signal generation circuit 32 is set to the L level (de-asserted) irrespective of the state of the latching signal of the refresh acceptance latch circuit 36, and de-multiplexer 34 transfers the applied internal refresh instruction AREF to the local control circuit on the next stage in the refresh instruction transfer path.

In the case when no data accessing is carried out on the related memory block, if the refresh acceptance latch circuit latches the H level signal, since a refreshing has been carried out on the corresponding memory sub-block, the refresh acceptance permission signal is also set to the L level in this case, internal refresh instruction AREF is transferred to the local control circuit on the next stage in the refresh instruction transfer path.

In the case when no data accessing is carried out on the related memory block and the latching signal of refresh acceptance latch circuit 36 is set to the L level, since no refreshing is carried out on the corresponding memory sub-block, the refresh acceptance permission signal is set to the H level, and the corresponding de-multiplexer transfers the received internal refresh instruction AREF to the refresh acceptance latch circuit.

FIG. 7 is a drawing that shows a progressing sequence of refreshing. FIG. 7 shows a refresh progressing sequence in the case in which no refresh skip block exists and where memory sub-blocks are successively refreshed.

In FIG. 7, signals BS0–BSm are memory sub-block selection signals, and indicate that the corresponding memory sub-blocks are selected in the assert state when asserted.

As illustrated in FIG. 7, first, refresh address <0 . . . 0> is generated, block selection signals BS0, BS2 and BS4 corresponding to even-numbered memory sub-blocks MB0, MB2 and MB4 are successively activated so that word lines WL0 are selected in these memory sub-blocks and a refreshing is carried out.

Upon completion of the refreshing on even-numbered memory sub-blocks, word lines WL0 in odd-numbered memory sub-blocks are sequentially selected and the refreshing is carried out. Upon completion of the refreshing on memory sub-blocks MB0–MBm, all block refresh complete instruction signal ALBRFC is asserted so that the count of refresh word line counter 19 shown in FIG. 4 is incremented by one, to change into <0 . . . 1>.

Again, in accordance with the refresh address, word lines WL1 of even-numbered memory sub-blocks are successively selected and the memory cells on word line WL1 are refreshed, and word lines WL1 of odd-numbered memory sub-blocks are then selected and the refreshing is performed on the memory cell data. When the word lines WL1 of memory sub-blocks MB0–MBm are selected and refreshing is carried out, all block refresh completion instruction signal ALBRFC is asserted, and the count of refresh word line counter 19 is again incremented by one. Thereafter, these operations are repeated, and word lines of the same number are selected in memory sub-blocks MB0–MBm and the refreshing is carried out.

Refresh word line address <11 . . . 11> corresponding to the final word line WLn is generated, and block selection signal BSm to the final memory sub-block MBm is activated. When in this state, a refreshing operation is carried out with the word line WLn being selected, all block refresh completion instruction signal ALBRFC is again asserted so that the count of refresh word line counter 19 is returned to the initial value <0 . . . 0>, and the refreshing operation is again carried out on word line WL0.

When the refreshing is carried out on memory cells on the same row address in all the memory sub-blocks and the refreshing operation is completed on all the memory sub-blocks, the refresh address is updated.

In the case in which a refreshing operation is skipped, the refreshing operation is repeatedly executed until this skipped memory sub-block is refreshed, and the refresh address is not updated until refresh skipped sub-memory block no longer exists.

Figure 8:
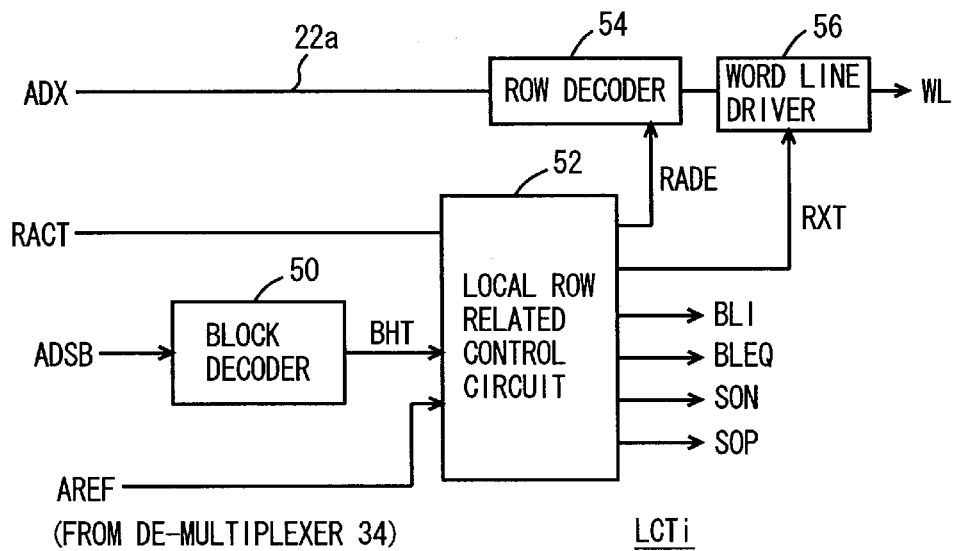
FIG. 8 is a drawing that schematically shows a construction of a local control circuit in accordance with the first embodiment of the present invention.

FIG. 8 is a drawing that schematically shows the construction of a row related control signal generation unit in local control circuit LCTi. In FIG. 8, local control circuit LCTi includes: a block decoder 50 for decoding a block address signal ADSB,; a local row related control circuit 52 that is activated in response to a block hit signal (block selection signal) BHT from block decoder 50 and a main row related control signal RACT, or in response to a refresh instruction signal AREF from de-multiplexer 34 shown in FIG. 5, and when activated, successively activates and inactivates local row related control signals RADE, RXT, BLI, BLEQ, SON and SOP in a predetermined sequence in accordance with main row related control signal RACT or internal refresh instruction AREF; a row decoder 54 which latches and decodes a word line address signal ADX transmitted through an address bus 22a in accordance with row decoder enable signal RADE from local row related control circuit 52; and a word line driver 56 which drives to a selected state a word line WL corresponding to an addressed row in accordance with word line driving timing signal RXT and an output signal of row decoder 54.

Bit line isolation instruction signal BLI is a signal for controlling conduction of bit line isolation gates arranged between a memory sub-block and a sense amplifier band. Bit line pre-charge/equalize instruction signal BLEQ is a signal for controlling the operation of a bit line pre-charge/equalize circuit that is arranged for each pair of bit lines. Sense amplifier activation signals SON and SOP are signals for activating/inactivating sense amplifiers included in the sense amplifier band.

As illustrated in FIG. 8, in local control circuit LCTi, in a normal operation, block decoder 50 decodes block address signal ADSB and in the case when the corresponding memory sub-block is selected, activates block bit signal BHT, and activates/inactivates the row related control signals in a predetermined sequence in accordance with main row related control signal RACT transmitted from the main control circuit. This local row related control circuit 52 is set to a latch state when block bit signal BHT attains the L level, and stops an acceptance operation of main row related activation signal RACT.

The block address signal is transferred to the memory sub-blocks asynchronously to the clock signal, and decoded by block decoder 50 prior to definition of the word line address signal. Therefore, block bit signal BHT is activated when this block address signal ADSB is in the definite state, and inactivated when block address signal ADSB is de-asserted.

Local row related control circuit 52 includes a latch circuit, and when block hit signal BHT is in an activated state, takes in and latches a main row related control signal RACT. This latched state is maintained until a main pre-charge activation signal RPRC for designating a pre-charge is applied. By utilizing the latch function of this local row related control circuit 52, a refreshing operation can be carried out on a memory sub-block in the non-selected state, in parallel with data accessing.

In the refreshing operation, when internal refresh instruction AREF is activated, that is, when refresh instruction AREF is supplied from the corresponding de-multiplexer shown in FIG. 5, local row related control circuit 52 uses internal refresh instruction AREF as a main row related activation signal to activate the row related control signal in a predetermined sequence.

When this row related control circuit 52 is set in the active state and the local row related control signals are in the active state internally, the de-multiplexer 34 transfers internal refresh instruction AREF to the circuit on the next stage, and internal refresh instruction AREF applied to this local row related control circuit 52 is set in a de-asserted state. Therefore, it is possible to prevent conflict between refreshing and normal data accessing.

Moreover, upon activation of row decoder enable signal RADE, row decoder 54 takes in address signal ADX applied thereto, and is set to a latching state. Thus, even when word line address signal ADWL in normal data accessing and refresh word line address signal in refreshing are successively transferred through this address signal bus 22a, since row decoder 50 for a normal accessing operation is in a latching state, the refresh word line address exerts no adverse effect on the normal accessing operation. The same is true for the case in which refreshing is carried out prior to normal accessing.

As illustrated in FIG. 8, local control circuit LCTi is configured to generate necessary internal control signals (row related control signals) in accordance with main row related control signal RACT based upon block bit signal BHT. Thus, even in the case of a memory array having a single bank construction, it is possible to carry out normal accessing and refreshing without any conflict between them.

Figure 9:
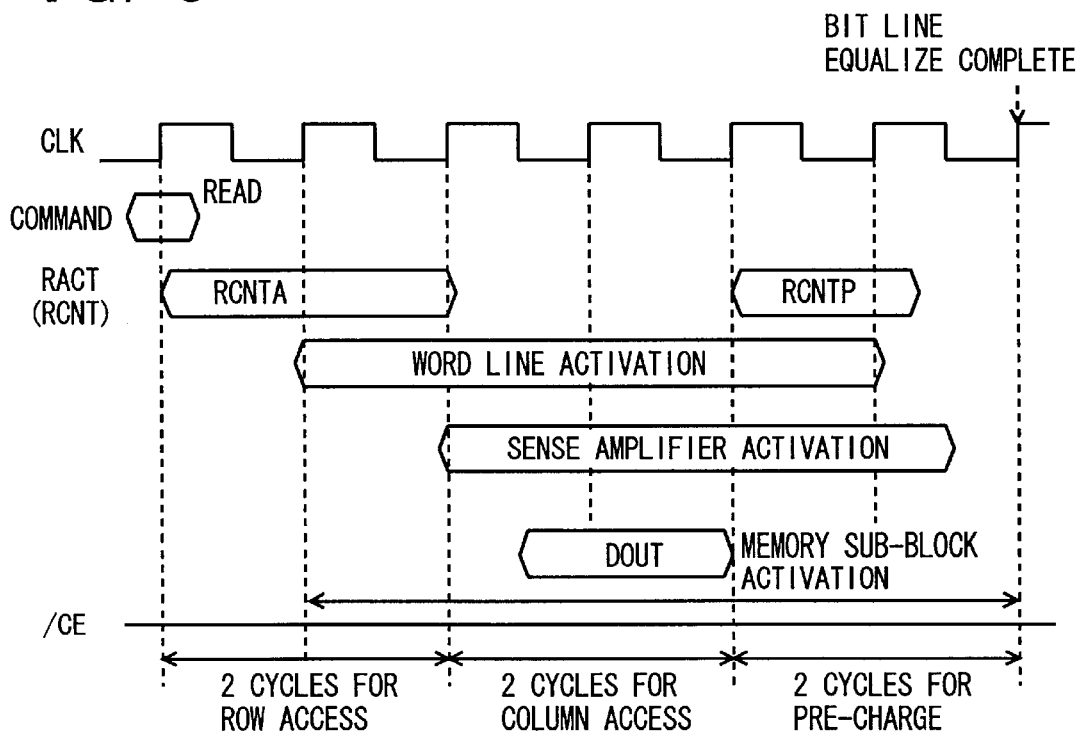
FIG. 9 is a timing chart that represents the operation of the local control circuit in accordance with the first embodiment of the present invention.

FIG. 9 is a timing chart that represents the operation in normal accessing. In the normal accessing mode, chip enable signal /CE is set to the L level. When read-out instruction signal READ for instructing data read-out is applied, main row activation signal RCNTA is generated from the main control circuit and commonly transferred to the memory sub-blocks in synchronization with the rising edge of clock signal CLK.

In the memory sub-block selected by the block address signal, block bit signal BHT outputted from block decoder 50 is activated, and local row related control circuit 52 generates local row related control signals in accordance with this row activation control signal RCNTA. Thus, word line address signal ADX is taken in and decoded by row decoder 54 and word line driving circuit 56 so that a word line is driven to the selected state.

Then, sense amplifier activation signals SON and SOP are activated by this local row related control circuit 52. Two clock cycles are allocated, as a row access cycle, for the period of time until the sense amplifier latches data in the selected memory cell since the data read-out instruction applied thereto.

After activation of the sense amplifier, a column selecting operation and an internal read-out operation of data are carried out in accordance with main column related control signal CACT from the main control circuit so that data DOUT is read out. Two clock cycles are allocated to the column access for carrying out this data read-out operation.

Upon completion of the data read-out operation, the main control circuit then issues main pre-charge activation signal RCNTP. In accordance with this main pre-charge activation signal RCNTP, the selected memory block is returned to the pre-charge state by row related control circuit 52. Two clock cycles are allocated to this pre-charge cycle.

Therefore, after a lapse of 6 clock cycles since read-out instruction signal READ for instructing data read-out is applied, this selected memory sub-block is returned to the pre-charged state to wait the next access. This access sequence for allocating two cycles to row access cycle, column access cycle and pre-charge cycle respectively in an access cycle shown in FIG. 9 is generally used in standard SDRAM (clock synchronous type DRAM). Therefore, during the period of time between the second clock cycle and the sixth clock cycle since read-out instruction signal READ for instruction data read-out is applied, the memory array in the selected memory sub-block is set to the active state.

In order to prevent conflict between refreshing and normal accessing, in a normal accessing operation, the selected memory sub-block is driven to the selected state from the second clock cycle, and in this selected memory sub-block, the local row control circuit is in the latching state. Therefore, after this selected memory sub-block is driven to the selected state, a row related control signal for refreshing can be transmitted. Thus, as illustrated in FIG. 8, main row related control signal RACT for normal data access (normal access) and internal refresh instruction AREF in a refresh mode (refresh activation signal which will be described later) are transferred through different buses. Thus, one clock cycle of the two cycles in row access can be overlapped with the refresh cycle in a normal accessing so that it is possible to prevent a prolongation of the cycle time at the time of normal data accessing in execution of refreshing, as will be described below.

Figure 10:
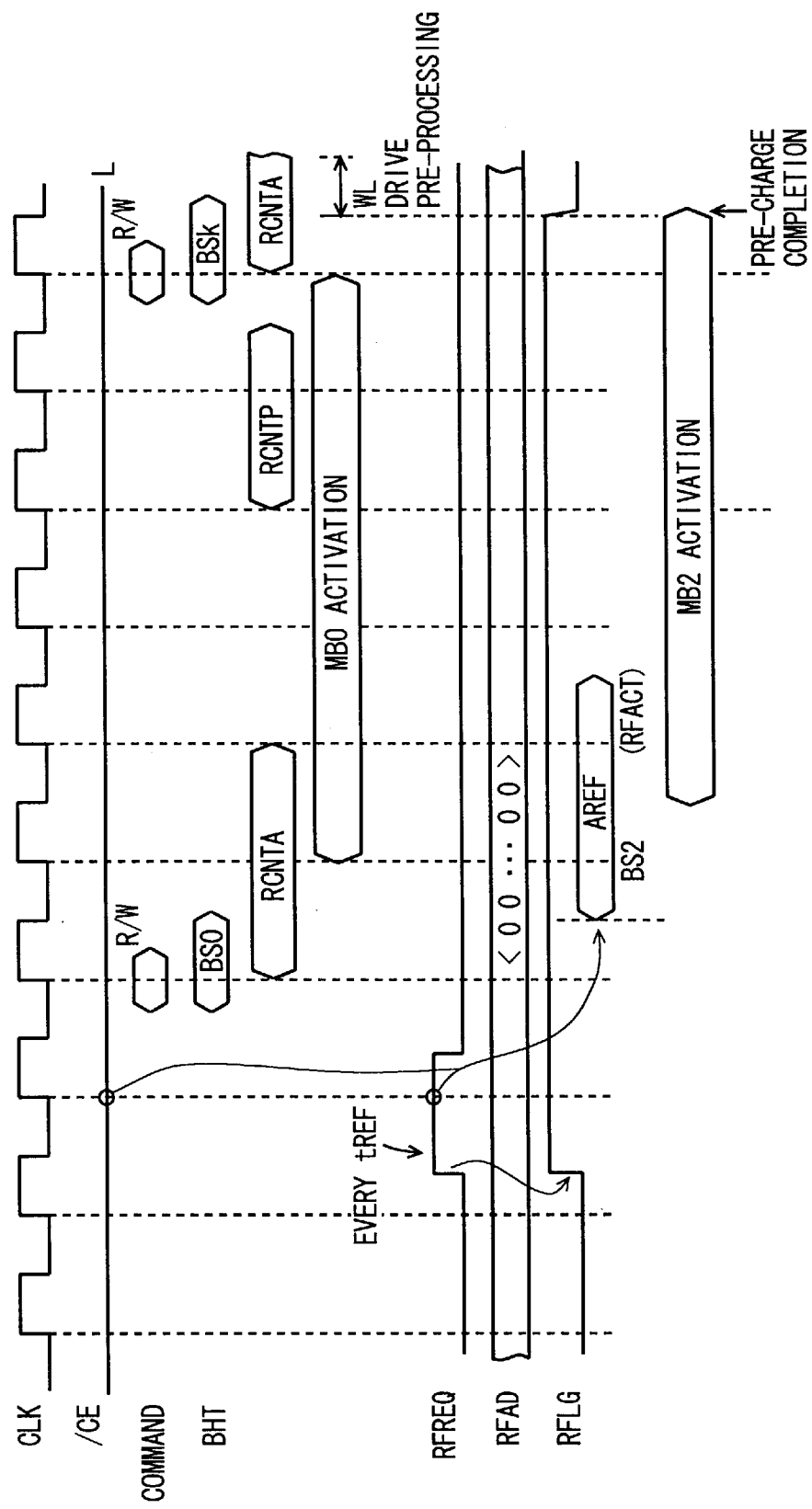
FIG. 10 is a timing chart that shows the sequence of a read-out operation in accordance with the first embodiment of the present invention.

FIG. 10 is a drawing that shows the internal operation timings in the case in which there is a conflict between normal accessing and internal refreshing while chip enable signal /CE is at the L level or the asserted state. In FIG. 10, refresh request RFREQ is issued from a refresh timer every refresh period tREF. When this refresh request RFREQ is issued, refresh flag generation circuit 14 shown in FIG. 4 asserts refresh flag RFLG. Even when this refresh flag RFLG is asserted and raised to the H level, chip enable signal /CE is in an asserted state of the L level at the time when this refresh request RFREQ is issued. Therefore, the issuance of internal refresh instruction AREF is set in the deferred state until data access instruction R/W (activated read-out instruction signal READ or writing instruction signal WRITE) is externally applied next time.

In this deferred state or the waiting state, when data access instruction R/W is applied with memory sub-block MB0 specified, block selection signal BS0 is raised to the selected state as block hit signal BHT. Upon receipt of this data access instruction R/W, refresh instruction generation circuit 16, shown in FIG. 4, issues refresh instruction signal AREF in response to the fall of clock signal CLK of this clock cycle.

Memory sub-block MB0 is set in the normal data accessing state so that, under the control of the refresh acceptance permission signal generation circuit, internal refresh instruction AREF is applied to memory sub-block MB2, and block selection signal BS2 corresponding to memory sub-block MB2 is activated. Therefore, memory sub-block MB2 is activated with a delay of half a clock cycle from the activation of memory sub-block MB0. In accordance with refresh address RFAD <00 . . . >, a refreshing operation is carried out in memory sub-block MB2. After a lapse of 6 clock cycles required for this refreshing, refresh flag RFLG is de-asserted (in accordance with the refresh pre-charge activation signal).

In memory sub-block MB0, after a lapse of 6 clock cycles since the receipt of data access instruction R/W, activation of memory block MB0 is completed in accordance with main row related control signal RACT (RCNTA and RCNTP), and data accessing is permitted for another next memory sub-block MBk.

After a lapse of 6 clock cycles since the first receipt of data access instruction R/W, the next data access instruction R/W is inputted so that the normal access cycle and the refresh cycle overlap with each other only by half the clock cycle. Even when memory sub-block MB2 is subject to data access next, when a word line is to be selected in accordance with the new data access instruction R/W by the internal local control circuit, the memory sub-block has already been returned to the pre-charged state, thereby making it possible to carry out data accessing without any problems. Consequently, even when this refreshing operation is carried out, data access instruction R/W is successively inputted to carry out data accessing without sacrificing any cycle time.

Upon issuance of internal refresh instruction AREF, main refresh activation signal RFACT and main refresh pre-charge activation signal RFPRC are successively issued. In FIG. 10 and the following explanation, these main refresh control signals RFACT and RFPRC are indicated by internal refresh instruction AREF. However, although row activation and pre-charge activation are designated by different signals, these row activation and pre-charge activation may be successively carried out in a predetermined time interval in accordance with a one-shot signal. In this case, the memory cycle is determined in a fixed manner.

Figure 11:
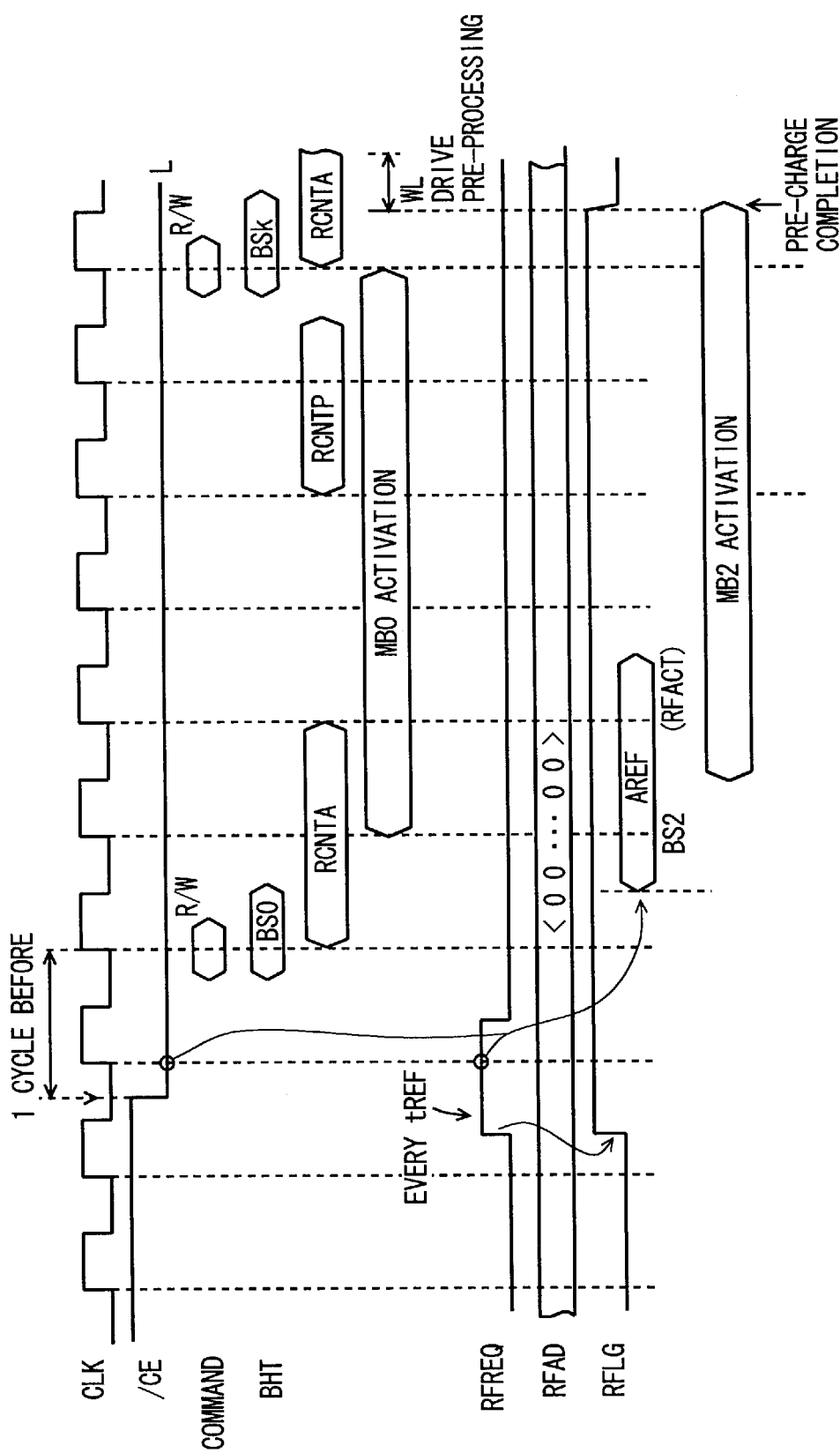
FIG. 11 is a timing chart that shows a sequence of the refresh operation in accordance with the first embodiment of the present invention.

FIG. 11 is a timing chart that represents an operation in transition from the stand-by state to the normal accessing. The stand-by state is set by the de-asserted state (H level) of chip enable signal /CE.

As illustrated in FIG. 11, in transition from the stand-by state to the normal accessing, one clock cycle before the application of data access instruction R/W for carrying out data accessing, chip enable signal /CE is asserted. Even when refresh request signal RFREQ is issued under assertion of chip enable signal /CE and refresh flag RFLG is asserted, chip enable signal /CE is set to the L level (asserted state) at the rising edge of clock signal CLK in the assertion of this refresh request RFREQ. Therefore, in the same manner as the operation shown in FIG. 10, the internal refreshing operation is suspended until data access instruction R/W is issued.

When data access instruction R/W is applied, internal refresh instruction AREF is issued in response to the fall of clock signal CLK at that cycle. Therefore, at the transition from the stand-by state to normal accessing, chip enable signal /CE is set to the L level one clock cycle before the issuance of data access instruction R/W, and issuance of the internal refresh instruction AREF is suspended when chip enable signal /CE is in the L level at the time of issuance of refresh request RFREQ. Consequently, it is possible to carry out the internal refreshing operation without sacrificing any cycle time of normal accessing.

Figure 12:
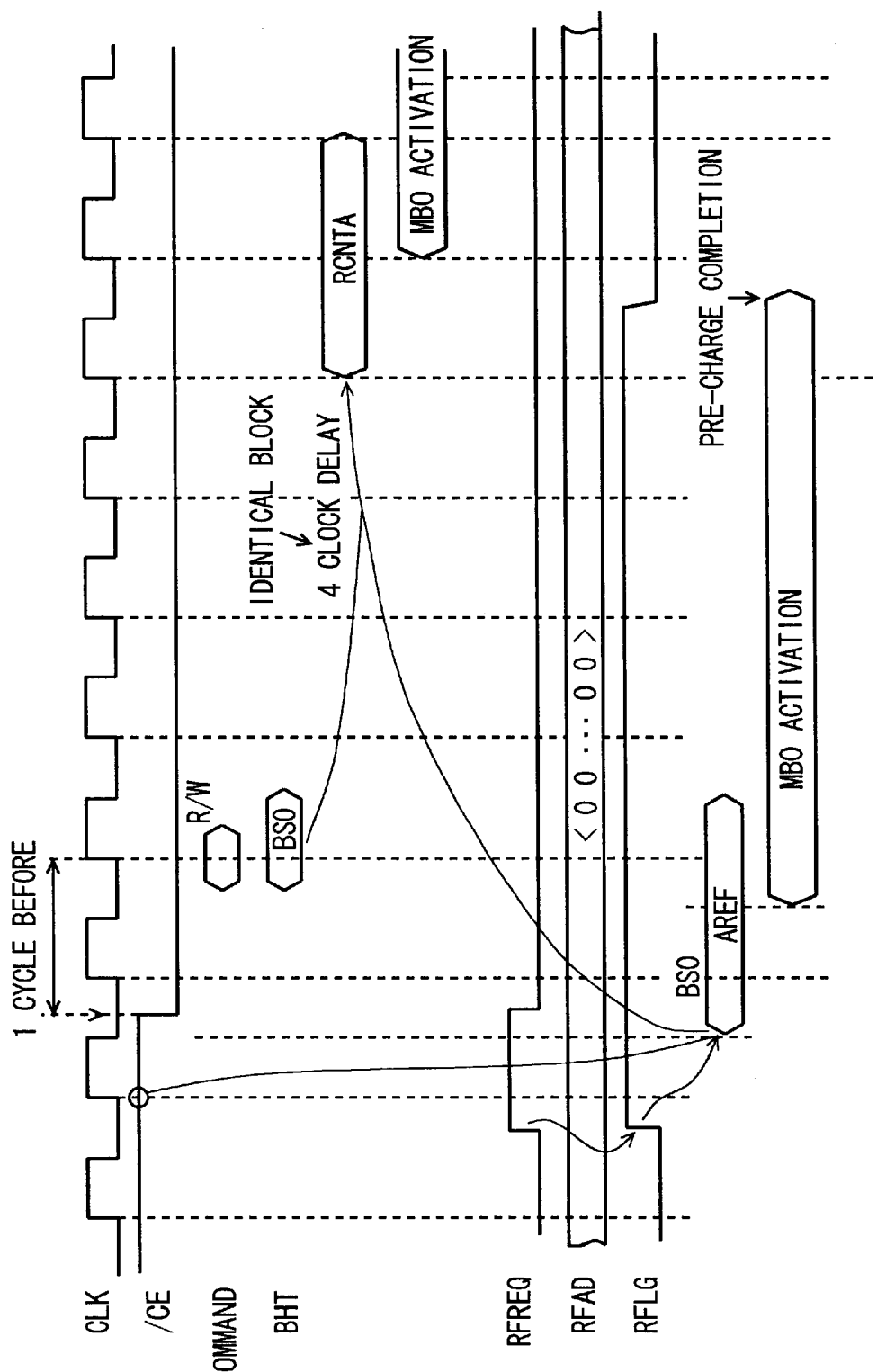
FIG. 12 is a drawing that shows the sequence of the refresh operation in accordance with the first embodiment of the present invention.

FIG. 12 is a timing chart showing another operation sequence in transition from the stand-by state to normal accessing. In FIG. 12, when request RFREQ is issued and refresh flag RFLG is asserted, chip enable signal /CE is in the H level at the rising edge of clock signal CLK. In this state, it is not possible to recognize whether or not data access instruction R/W is issued next. Therefore, in this state, internal refresh instruction AREF is issued in accordance with the assertion of refresh flag RFLG. FIG. 12 shows an operation sequence as one example in which memory sub-block MB0 is activated in accordance with the internal refresh instruction AREF and a refreshing operation is carried out.

Upon issuance of internal refresh instruction AREF, chip enable signal /CE is then lowered to the L level, and in the next clock cycle, data access instruction R/W is applied, and block selection signal BS0 is asserted to specify memory sub-block MB0. In the case when this memory sub-block for data accessing and memory sub-block for refreshing are the same, since refreshing and data accessing conflict each other, this data accessing is set to the waiting state for a period of 4 cycle cycles.

Since refreshing is being carried out, refresh flag RFLG is set to the asserted state for 6 clock cycles, and after the lapse of these 6 clock cycles, memory sub-block MB0 is returned to the pre-charge state. In the same clock cycle as the return of this memory sub-block MB0 to the pre-charge state, main row related activation signal RCNTA is issued for data accessing, and memory sub-block MB0 is activated so that row selection is carried out. Even when data accessing is carried out on the same memory sub-block, since this memory sub-block MB0 has already returned to the pre-charge state prior to activation thereof for data accessing, it is possible to accurately carry out data accessing when memory sub-block MB0 is activated.

Here, in the case in which memory sub-block for refreshing and memory sub-block for data accessing share a sense amplifier band, the data accessing is set to the waiting state for 4 clock cycles.

In the case in which this memory sub-block for refreshing and memory sub-block for data accessing are the same or share a sense amplifier band, a data output delay predicting signal is externally outputted.

In order to detect conflict between these refreshing and normal accessing, an output signal of each de-multiplexer provided for a memory sub-block is transferred back to the main control circuit. Based upon the result of comparison between a block address signal externally applied and the signal for specifying the memory sub-block under refreshing, the main control circuit delays the normal accessing. In the comparison, detection is made as to whether the block address for specifying a memory sub-block to be accessed is specifying a memory sub-block under refresh or a memory sub-block sharing a sense amplifier band with a memory sub-block under refreshing.

In the case when the memory sub-block for refreshing and the memory sub-block for data accessing are different, or there is no conflict with respect to a sense amplifier band, the memory sub-block for accessing is activated in accordance with the data access instruction R/W. Therefore, even when the memory sub-block for refreshing and the memory sub-block specified by the block address signal are different, if a memory sub-block sharing a sense amplifier band with a memory sub-block under refreshing is specified by a block address signal, the data accessing is delayed by 4 clock cycles.

In this case, by imposing a condition that chip enable signal /CE should be asserted 5 clock cycles before the application of data access instruction R/W in normal accessing for data accessing, it becomes possible to eliminate the necessity of avoiding conflict so that no delay in data accessing is caused.

Figure 13:
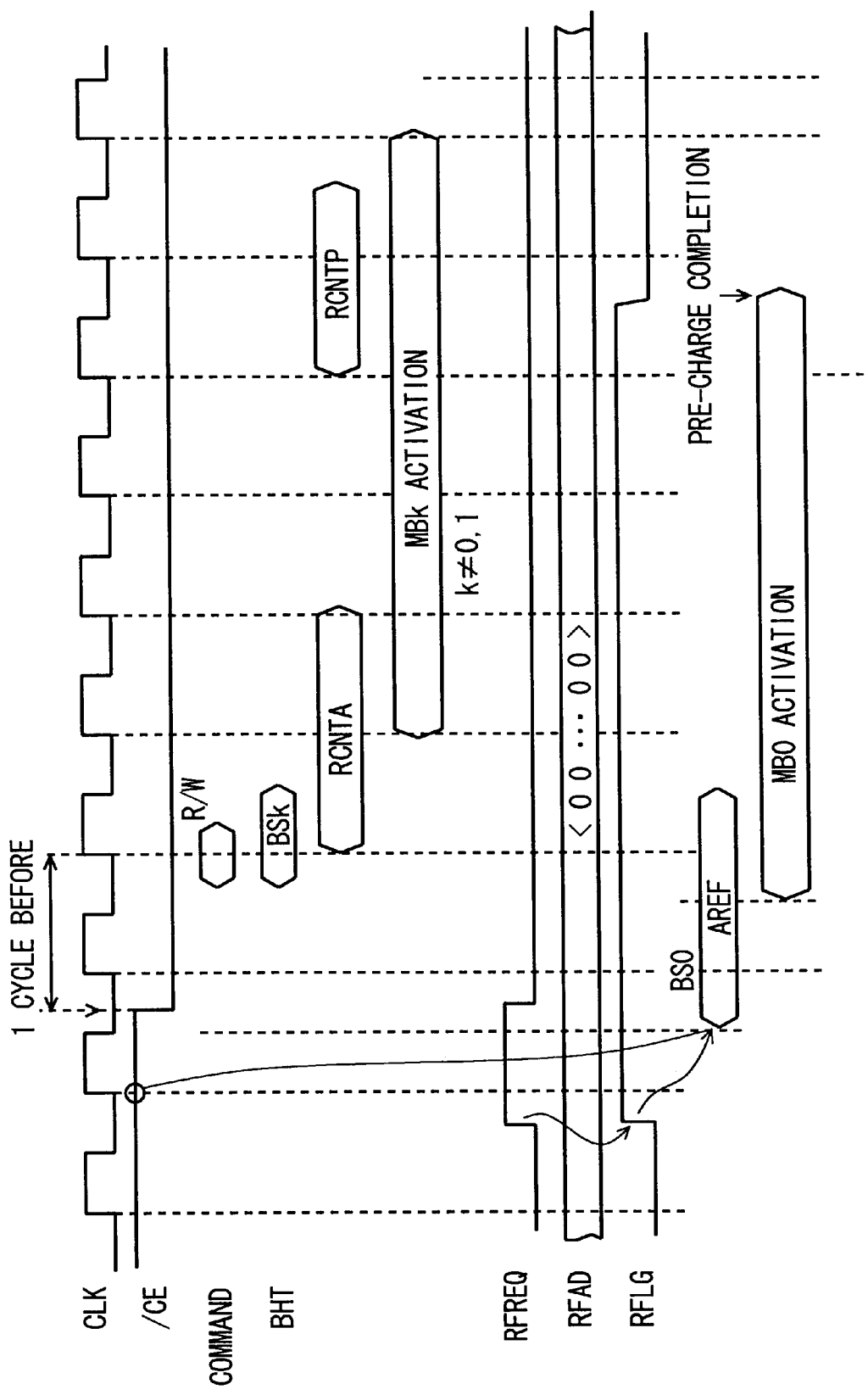
FIG. 13 is a drawing that shows the sequence of the refresh operation in accordance with the first embodiment of the present invention.

FIG. 13 is a drawing that shows a sequence of the refreshing operation and normal access in transition from the stand-by state to normal accessing.

In an operation sequence shown in FIG. 13, when chip enable signal /CE is in the H level, refresh request RFREQ is issued. Since chip enable /CE is in the H level at the rising edge of clock signal CLK, internal refresh instruction AREF is issued in response to the fall of clock signal CLK within that clock cycle.

In the next clock cycle, chip enable signal /CE is set to the L level, and data access instruction R/W is applied. If memory block MBk is specified and does not share a sense amplifier band with memory sub-block MB0 for refreshing, main row related activation signal RCNTA is issued in accordance with this data access instruction R/W, and the memory sub-block MBk is activated so that data accessing is carried out. Therefore, in this case, the data accessing is carried out without adverse effects from refreshing.

In the case in which chip enable signal /CE is set in the H level for a long time, since data access instruction R/W is not issued, internal refresh instruction AREF is issued internally in accordance with refresh flag RFLG, and a refreshing is successively carried out on memory sub-blocks.

Constructions of Respective Parts

Figure 14:
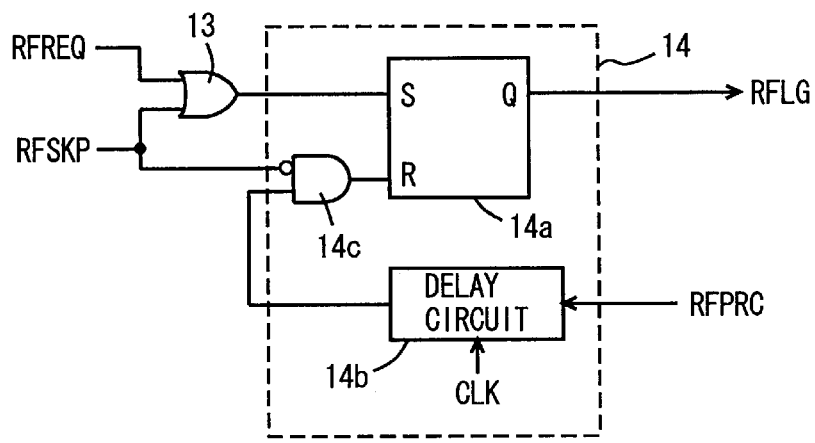
FIG. 14 is a drawing that shows an example of a construction of a refresh flag generation circuit shown in FIG. 4.

FIG. 14 is a drawing that schematically shows an example of the construction of the refresh flag generation circuit 14 shown in FIG. 4. In FIG. 14, the refresh flag generation circuit 14 includes a set/reset flip-flop 14a that is set in response to the rise of the output signal of an OR circuit 13 shown in FIG. 4 to generate refresh flag RFLG, a delay circuit 14b that delays refresh pre-charge activation signal RFPRC by a predetermined time (for example, 1 clock cycle period), and a gate circuit 14c that receives the output signal of the delay circuit 14b and a refresh skip signal RFSKP. When refresh skip signal RFSKP is in the L level, the gate circuit 14c outputs a signal in the H level upon receipt of H level of the output signal of delay circuit 14b, so that set/reset flip-flop 14a is reset.

In the refreshing operation, upon issuance of internal refresh instruction AREF, refresh pre-charge activation signal RFPRC to specify a pre-charging operation is issued after a lapse of a predetermined time period (for example, after a lapse of 5 clock cycles) since the issuance of refresh activation signal RFACT. Therefore, this refresh pre-charge activation signal RFPRC corresponds to main pre-charge activation signal RCNTP contained in main row related control signal RACT in normal accessing.

Figure 15:
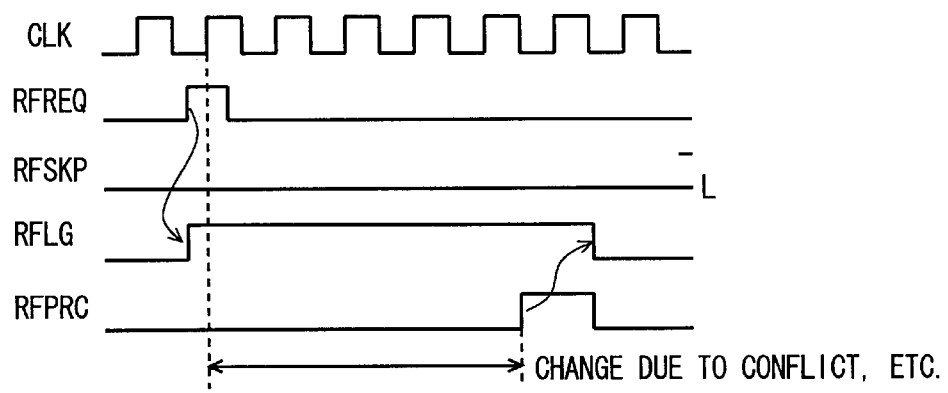
FIG. 15 is a timing chart that represents the operation of the refresh flag generation circuit shown in FIG. 14.

FIG. 15 is a timing chart that represents an operation of the refresh flag generation circuit 14 shown in FIG. 14. FIG. 15 shows the operation carried out in a state in which refresh skip signal RFSKP is set in the L level.

As shown in FIG. 15, when refresh request RFREQ is issued, set/reset flip-flop 14a is set in accordance with this refresh request RFREQ so that refresh flag RFLG is asserted.

When this refresh flag RFLG is asserted, after a lapse of a period of predetermined clock cycles after performing an avoidance for conflict in refreshing internally, refresh pre-charge activation signal RFPRC is activated This refresh pre-charge activation signal RFPRC is delayed by 1 clock cycle period in delay circuit 14b, and applied to gate circuit 14c. Therefore, this refresh flag RFLG is de-asserted after a lapse of 1 clock cycle period since the activation of refresh pre-charge activation signal RFPRC, thereby indicating the completion of a refreshing period.

Figure 16:
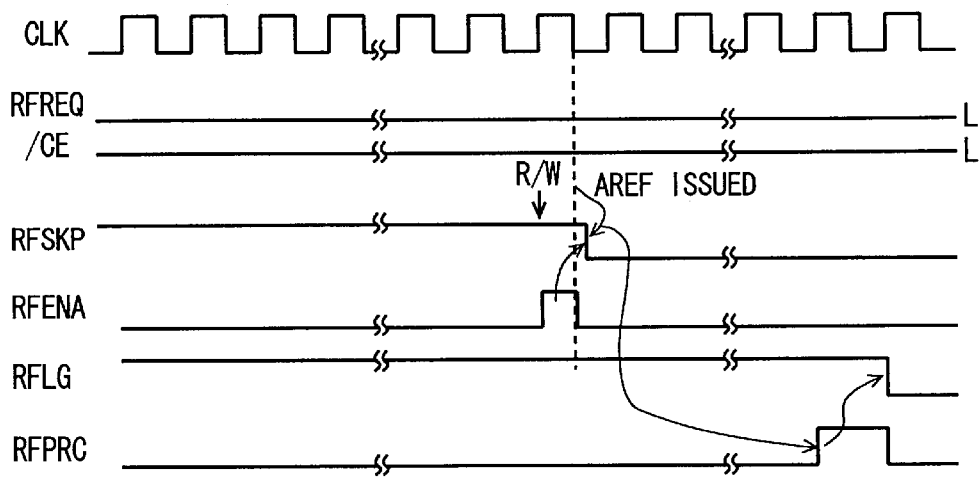
FIG. 16 is a timing chart that shows another sequence of the operation of the refresh flag generation circuit shown in FIG. 14.

FIG. 16 is a timing chart that represents the operation of refresh flag generation circuit 14 shown in FIG. 14 at the time when refresh skip signal RFSKP is in the H level.

When chip enable signal /CE is in the L level and refresh skip signal RFSKP is in the H level, refresh flag RFLG is in an asserted state. In this state, refresh enable signal RFENA is activated upon issuance of data access instruction R/W, and in accordance with this refresh enable signal RFENA, internal refresh instruction AREF is issued.

In the state where refresh skip signal RFSKP is in the H level, the output signal of gate circuit 14c is in the L level, and set/refresh flip-flop 14a is maintained in the set state to maintain refresh flag RFLG in the asserted state. In accordance with fresh enable signal RFENA, internal refresh instruction AREF is issued, and when the count of refresh skip counter 12, shown in FIG. 4, becomes 0, refresh skip signal RFSKP is set to the L level (de-asserted).

Therefore, when refresh pre-charge activation signal RFPRC is issued in accordance with the issuance of internal refresh instruction AREF, set/reset flip-flop 14a is reset after a lapse of 1 clock cycle in accordance with the output signal from gate circuit 14c so that refresh flag RFLG is de-asserted. Thereafter, every time refresh request RFREQ is issued, refresh flag RFLG is de-asserted.

Figure 17:
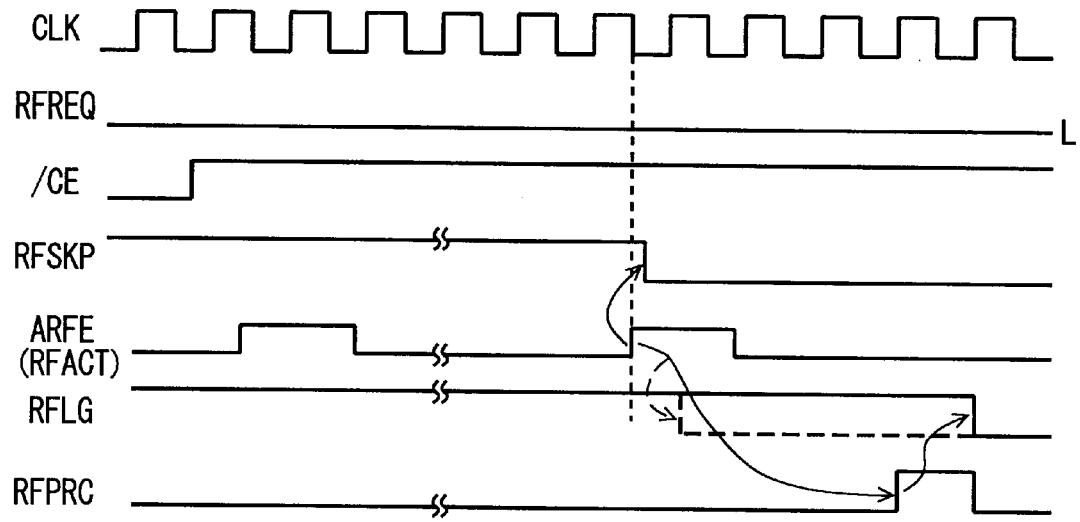
FIG. 17 is a timing chart that shows a further sequence of the operation of the refresh flag generation circuit shown in FIG. 14.

FIG. 17 is a timing chart that represents the operation of refresh flag generation circuit 14 when in de-assertion of chip enable signal /CE, refresh skip signal RFSKP is in the H level.

If refresh skip signal RFSKP is still in the H level when chip enable signal /CE goes to the H level, this indicates that a memory cell to be refreshed is not still refreshed. Therefore, in this state, as will be described in detail, internal refresh instruction AREF is issued from refresh instruction signal generation circuit at a predetermined interval such as 6 clock cycles. In accordance with the issuance of this refresh instruction signal AREF, the count in the skip count circuit is decremented. The same operation is repeated until the count of this skip counter circuit becomes 0 and refresh skip signal RFSKP is de-asserted so that internal refresh instruction AREF is issued. While refresh skip signal RFSKP is set in the H level, the output signal of gate circuit 14c shown in FIG. 14 is maintained in the L level and refresh flag RFLG is maintained in the H level.

When refresh skip signal RFSKP is set in the L level in accordance with the issuance of internal refresh instruction AREF, gate circuit 14c resets set/reset flip-flop 14a in accordance with refresh pre-charge activation signal RFPRC issued in this refresh cycle, and de-asserts refresh flag RFLG.

Therefore, by this refresh flag RFLG, it is possible to accurately carry out refreshing on memory sub-blocks over which refreshing has been skipped. The chip enable signal /CE is set in the H level, and even when after a lapse of a predetermined period, refresh request RFREQ is issued, this refresh request is ignored when refresh flag RFLG is in the H level. Here, the period of issuance of refresh instruction signal AREF during the H level of refresh flag RFLG is set to an interval sufficiently shorter than that in a normal refresh cycle (several $\mu$ seconds to several tens of $\mu$ second), that is, for example, to 6 clock cycles. Thus, it becomes possible to complete refreshing on skipped memory sub-blocks until this refresh request RFREQ is issued.

Figure 18:
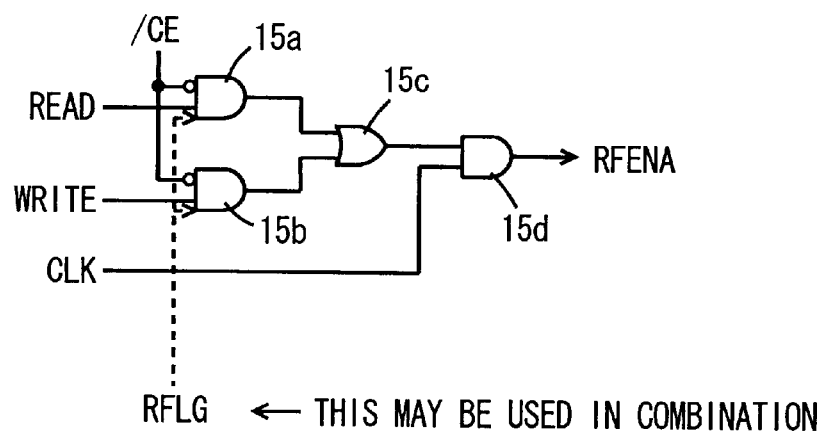
FIG. 18 is a drawing that shows an example of a construction of a refresh decoder shown in FIG. 4.

FIG. 18 is a drawing that shows an example of the construction of a refresh decoder 15 shown in FIG. 4. In FIG. 18, a refresh decoder 15 includes a gate circuit 15a receiving chip enable signal /CE and read-out instruction signal READ, a gate circuit 15b receiving chip enable signal /CE and writing instruction signal WRITE, an OR circuit 15c receiving output signals of gate circuits 15a and 15b, and an AND circuit 15d receiving the output signal of OR circuit 15c and clock signal CLK for generating refresh enable signal RFENA.

Gate circuits 15a and 15b function as buffer circuits when chip enable signal /CE is in the L level, and generate output signals in accordance with data read-out instruction signal READ and data writing instruction signal WRITE, respectively. These gate circuits 15a and 15b output the signals of L level when chip enable signal /CE is in the H level.

In the arrangement of refresh decoder 15 shown in FIG. 18, in a normal accessing with chip enable signal /CE being set in the L level, refresh enable signal RFENA is activated when clock signal CLK goes high, in response to the data accessing instruction.

Here, in the arrangement of refresh decoder 15 shown in FIG. 18, refresh flag RFLG may be further applied to gate circuits 15a and 15b, to generate refresh enable signal RFENA when this refresh flag RFLG is in the H level (indicated by a broken line). In the case in which this refresh flag RFLG is used, only the period in which refreshing is required, refresh enable signal RFENA is generated, thereby making it possible to reduce the current consumption. In a data accessing operation between refresh intervals, refresh enable signal RFENA is maintained in the inactive state.

Figure 19:
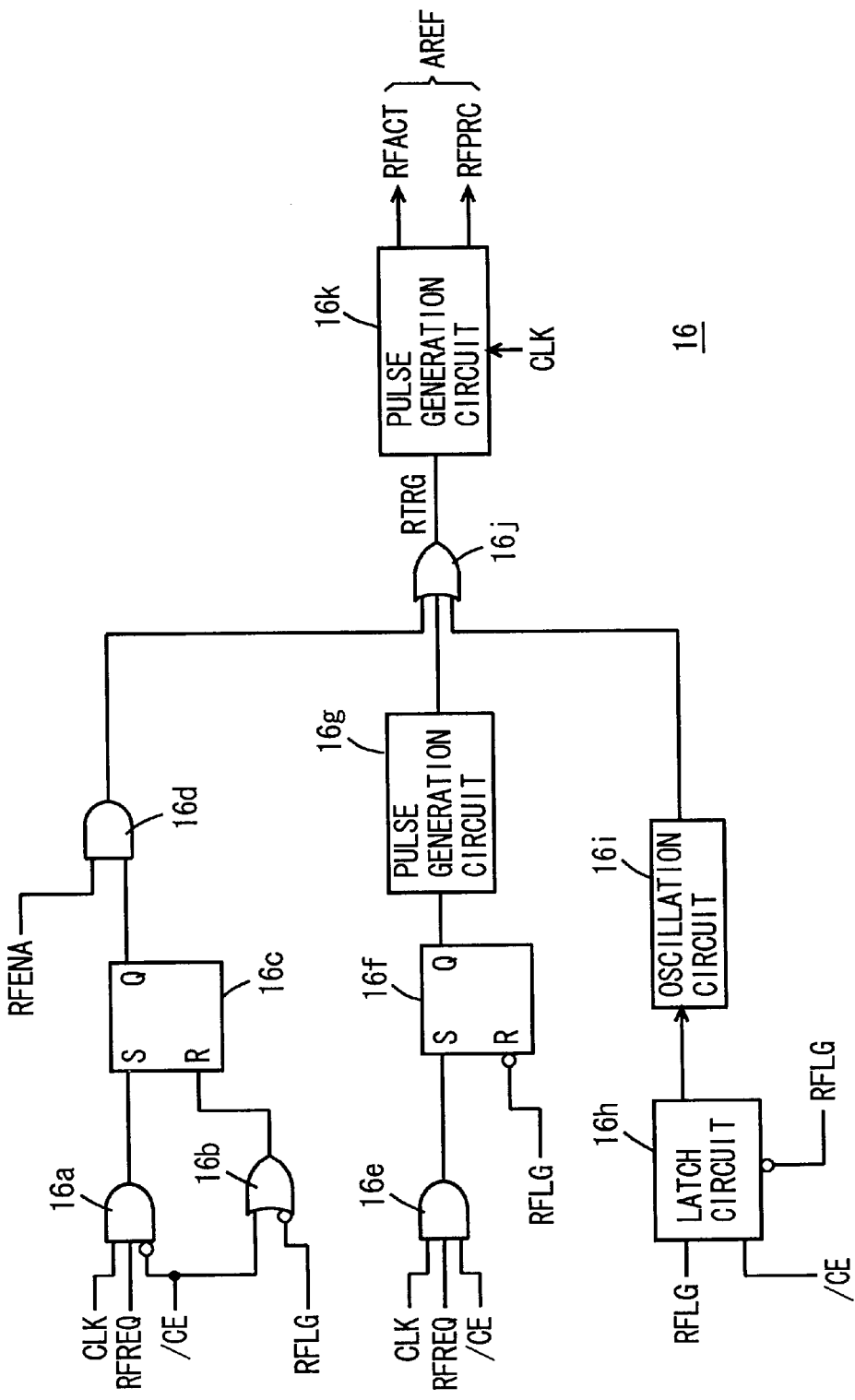
FIG. 19 is a drawing that shows an example of a construction of a refresh instruction generation circuit shown in FIG. 4.

FIG. 19 is a drawing that schematically shows one example of the construction of refresh instruction signal generation circuit 16 shown in FIG. 4. In FIG. 19, refresh instruction signal generation circuit 16 includes a gate circuit 16a receiving clock signal CLK, refresh request RFREQ and chip enable signal /CE, a gate circuit 16b receiving chip enable signal /CE and refresh flag RFLG, set/reset flip-flop 16c that is set in response to the rise of the output signal of gate circuit 16a, and reset in response to the rise of the output signal of gate circuit 16b, and an AND circuit 16d receiving the output signal of set/reset flip-flop 16c and refresh enable signal RFENA.

Gate circuit 16a outputs a signal of the H level when chip enable signal /CE is in the L level and refresh request signal RFREQ and clock signal CLK are in the H level.

Gate circuit 16b outputs a signal of H level when chip enable signal /CE is in the H level or refresh flag RFLG is in the L level.

Set/reset flip-flop 16c is a flip-flop of the edge trigger type.

Upon issuance of refresh request RFREQ, gate circuit 16a outputs a signal of H level when chip enable signal /CE is in the L level at the rising edge of clock signal CLK so that set/reset flip-flop 16c is set. When the refreshing operation is completed with chip enable signal /CE being in the L level and refresh flag RFLG goes to the L level, this set/reset flip-flop 16c is reset.

In this case, upon issuance of refresh request, it is indicated that data accessing is next executed, AND circuit 16d generates a refresh trigger signal in accordance with refresh enable signal RFENA from the refresh decoder shown in FIG. 18.

While, after refresh request RFREQ has been issued, refresh flag RFLG is maintained in the H level with this refreshing being skipped, flip-flop 16c is in the set state so that an internal refresh instruction is issued in accordance with refresh enable signal RFENA.

Refresh instruction signal generation circuit 16 further includes an AND circuit 16e for receiving clock signal CLK, refresh request RFREQ and chip enable signal /CE, a set/reset flip-flop 16f that is set in response to the rise of the output signal of AND circuit 16e, and also reset in response to the fall (de-assertion) of refresh flag RFLG and a pulse generation circuit 16g for generating a one-shot pulse signal having a predetermined time width in accordance with the output signal of set/reset flip-flop 16f.

When refresh request RFREQ is issued, this AND circuit 16e outputs a signal of H level while chip enable signal /CE is in the H level at the rising edge of clock signal CLK so that set/reset flip-flop 16f is set. When the output signal of this set/reset flip-flop 16f is in the H level, pulse generation circuit 16g generates a one-shot pulse signal in response to the fall of clock signal CLK. This set/reset flip-flop 16f is reset when refresh flag RFLG goes to the L level, thereby stopping the pulse generating operation of pulse generation circuit 16e.

Therefore, in the case when chip enable signal /CE is in the H level and in the stand-by state, since no data accessing is executed, set/reset flip-flop 16f is always set in response to refresh request RFREQ so that pulse generation circuit 16g generates a refresh-trigger-use pulse signal.

In the case when chip enable signal /CE is in the H level upon issuance of refresh request, since it is not possible to predict whether or not data accessing is next executed, a refresh instruction is issued in accordance with refresh request RFREQ. Therefore, refreshing is always executed with no memory sub-block skipped (since no data accessing is carried out on memory sub-blocks). In this state, when refresh request RFREQ is issued, refresh flag RFLG goes to the L level after a lapse of a predetermined period of time so that set/reset flip-flop 16f is reset.

Therefore, even in the case when upon issuance of refresh request RFREQ, clock signal CLK goes high and chip enable signal /CE then goes to the L level, a refreshing operation is executed prior to data accessing in accordance with refresh request RFREQ. Therefore, in the case when, upon issuance of refresh request RFREQ, chip enable signal /CE is in the H level at the rising edge of clock signal CLK, the refreshing operation is always executed in any of memory sub-blocks with refresh skip signal RFSKP being set in the L level, and refresh flag RFLG is de-asserted after a lapse of a predetermined time since the issuance of this refresh request.

Refresh instruction generation circuit 16 further includes: a latch circuit 16h for accepting and latching refresh flag RFLG in response to the rise of chip enable signal /CE; an oscillation circuit 16i which carries out an oscillating operation during the H level of the output signal of latch circuit 16h to generate a pulse signal in a predetermined period; an OR circuit 16j which receives the output signal of AND circuit 16d; the output signal of pulse generation circuit 16g and the output signal of oscillation circuit 16i to generate a refresh trigger signal RTRG; and a pulse generation circuit 16k which upon activation of refresh trigger signal RTRG, generates an internal refresh instruction AREF in synchronization with the fall of clock signal CLK.

This pulse generation circuit 16k issues a refresh activation signal RFACT as internal refresh instruction AREF, and also issues a refresh pre-charge activation signal RFPRC after a lapse of a predetermined period of time.

Latch circuit 16h is constituted by, for example, an edge trigger type D latch, and takes in refresh flag RFLG in response to the rise of chip enable signal /CE. While chip enable signal /CE is in the L level, this latch circuit 16h is in the latching state, with no change in its output signal. This latch circuit 16h is reset in response to the fall of refresh flag RFLG.

Therefore, in the case when chip enable signal /CE goes to the H level, if refresh flag RFLG is in the H level, oscillation circuit 16i carries out an oscillation operation in a predetermined cycle in accordance with refresh flag RFLG latched in latch circuit 16h, and this oscillation operation is continued until refresh flag RFLG is set to the L level, to generate a refresh trigger signal. This oscillation circuit 16i may be constituted by, for example, a ring oscillator or a counter for counting clock signal CLK. Any arrangement may be used for this oscillation circuit 16i, provided that it generates a refresh trigger signal in predetermined periods in order to execute a refresh operation in a short period when there is a skipped refresh operation even after the transition to the stand-by state.

Figure 20:
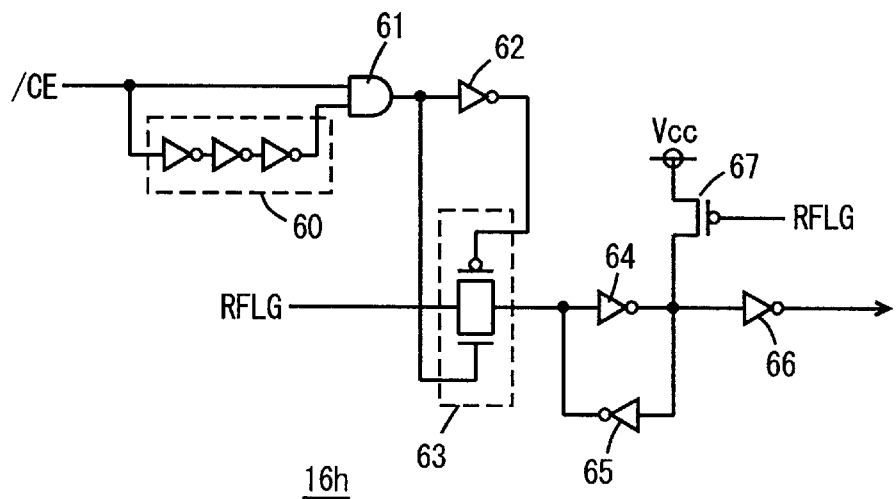
FIG. 20 is a drawing that shows an example of a construction of a latch circuit shown in FIG. 19.

FIG. 20 is a drawing that shows an example of the construction of latch circuit 16h shown in FIG. 19. In FIG. 20, latch circuit 16h includes: an inversion delay circuit 60 for inverting and delaying chip enable signal /CE by a predetermined period of time; an AND circuit 61 receiving the output signal of inversion delay circuit 60 and chip enable signal /CE; an inverter 62 for inverting the output signal of inversion delay circuit 61; a transmission gate 63 that is selectively rendered conductive in accordance with the output signal of AND circuit 61 and the output signal of inverter 62 to pass refresh flag RFLG when rendered conductive; an inverter 64 for inverting the signal received through transmission gate 63; an inverter 65 for inverting the output signal of inverter 64 for transmission to the input of inverter 64; an inverter 66 for inverting the output signal of inverter 64; and a P channel MOS transistor (insulated gate type field effect transistor) 67 rendered conductive when refresh flag RFLG is in the L level to pre-charge the input node of inverter 64 to the power supply voltage Vcc level.

In this latch circuit 16h shown in FIG. 20, a one-shot pulse signal is generated from AND circuit 61 at the rise of chip enable signal /CE to make transmission gate 63 conductive. During the conduction of transmission gate 63, refresh flag RFLG is transmitted internally, and latched by inverters 64 and 65. Therefore, when refresh flag RFLG is in the H level at the time of the rise of chip enable signal /CE, the output signal of latch circuit 16h is set to the H level. Thus, oscillation circuit 16i shown in FIG. 19 is activated and the oscillating operation is carried out to generate a refresh trigger signal at predetermined intervals. Oscillation circuit 16i carries out the oscillating operation until refresh skip signal is set to the L level and refresh flag RFLG is de-asserted, to generate a refresh trigger signal at predetermined periods.

When refresh skip signal RFSKP is set to the L level, refresh flag RFLG goes to the L level. Accordingly, MOS transistor (insulated gate type electric field effect transistor) 67 is rendered conductive, and the output node of inverter 64 is set to the H level with the output signal being set in the L level. Thus, when the output signal of latch circuit 16h goes to the L level, the oscillating operation of oscillation circuit 16i is stopped.

This transmission gate 63 is made conductive only when chip enable signal /CE goes to the H level, and is then maintained in the nonconductive state. Therefore, the utilization of this latch circuit, 16h prevents any adverse effects from exerting on the pulse generating operation of pulse generation circuit 16g shown in FIG. 19.

Figure 21:
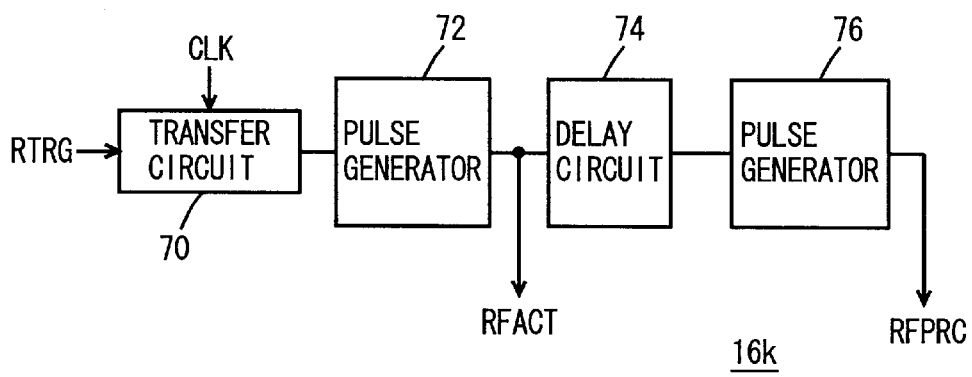
FIG. 21 is a drawing that schematically shows a construction of a pulse generation circuit shown in FIG. 19.

FIG. 21 is a drawing that schematically shows the construction of pulse generation circuit 16k shown in FIG. 19. In FIG. 21, this pulse generation circuit 16k includes: a transfer circuit 70 which transfers refresh trigger signal RTRG from OR circuit 16j shown in FIG. 19 in accordance with clock signal CLK; a pulse generator 72 for generating a pulse having a predetermined time width as a refresh activation signal RFACT in response to the rise of the output signal of transfer circuit 70; a delay circuit 74 for delaying the output signal of pulse generator 72 by a predetermined time; a pulse generator 76 for generating a pulse having a predetermined time width as a refresh pre-charge activation signal RFPRC in response to the output signal of delay circuit 74.

Internal refresh instruction ARFE is provided by these pulse signals RFACT and RFPRC.

Figure 22:
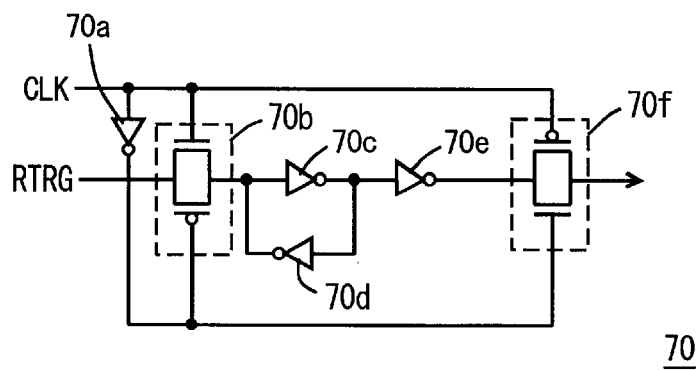
FIG. 22 is a drawing that shows an example of a construction of a transfer circuit shown in FIG. 21.

FIG. 22 is a drawing that shows one example of the construction of transfer circuit 70 shown in FIG. 21. In FIG. 22, transfer circuit 70 includes: an inverter 70a for inverting clock signal CLK; a transmission gate 70b that is selectively rendered conductive in accordance with clock signal CLK and the output signal of inverter 70a; an inverter 70c for receiving a signal applied through transmission gate 70b; an inverter 70d for inverting the output signal of inverter 70c for transmission to the input of inverter 70c; an inverter 70e for receiving the output signal of inverter 70c; and a transmission gate 70f rendered conductive complementarily to transmission gate 70b in accordance with clock signal CLK and the output signal of inverter 70a and passing the output signal of inverter 70e when made conductive.

In transfer circuit 70 in FIG. 22, when clock signal CLK is set in the H level, transmission gate 70b is set in the conductive state while transmission gate 70f is set in the non-conductive state. Therefore, in the case in which refresh trigger signal RTRG changes in synchronization with the rise of this clock signal CLK, refresh trigger signal RTRG is latched by inverters 70c and 70d during the H level period of clock signal CLK.

When clock signal CLK goes to the L level, transmission gate 70b is set to the non-conductive state and transmission gate 70f is set in the conductive state so that refresh trigger signal RTRG, taken in during the H level period of clock signal CLK, is transferred through transmission gate 70f. Therefore, the transfer signal from this transfer circuit 70 can change in synchronization with the fall of clock signal CLK.

Figure 23:
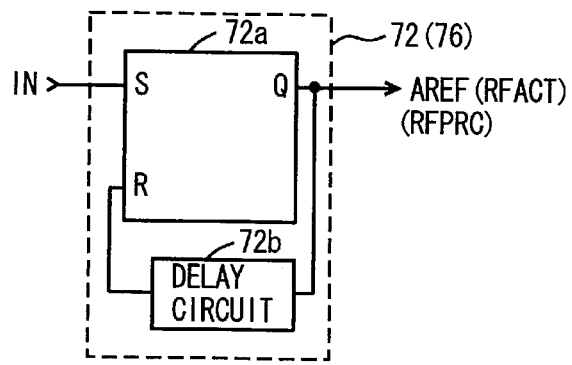
FIG. 23 is a drawing that schematically shows a construction of a pulse generator shown in FIG. 21.

FIG. 23 is a drawing that shows an example of the constructions of pulse generators 72 and 76 shown in FIG. 21. Since these pulse generators 72 and 76 have the same construction, only the construction of pulse generator 72 is shown in FIG. 23, and output signals of pulse generator 76 are indicated within parentheses.

In FIG. 23, pulse generator 72 includes a set/reset flip-flop 72a that is set in response to the rise of output signal IN of transfer circuit 70, and a delay circuit 72b for delaying the output signal of set/reset flip-flop 72a by a predetermined period of time to apply the resultant signal to reset input R of set/reset flip-flop. This delay circuit 72b may be an analog delay circuit or a transfer circuit for transferring a received signal in accordance with clock signal CLK. During the delay time of this delay circuit 72b, internal refresh instruction AREF or refresh activation signal RFACT is maintained in the active state (H level).

In the case of pulse generator 76, refresh pre-charge activation signal RFPRC is outputted from the set/reset flip-flop 72a.

Figure 24:
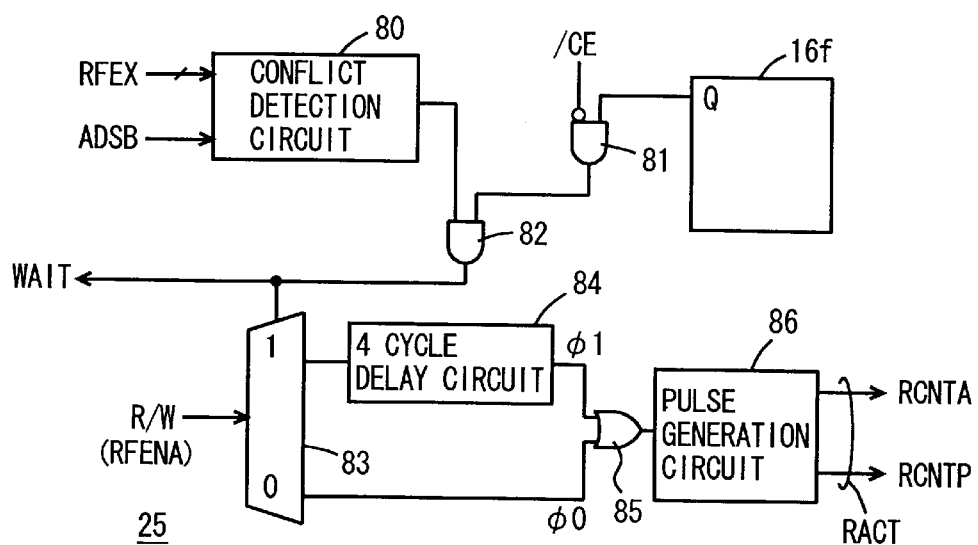
FIG. 24 is a drawing that schematically shows a construction of a main control signal generation circuit shown in FIG. 4.

FIG. 24 is a drawing that schematically shows the construction of a row related control signal generator of main control signal generation circuit 25 shown in FIG. 4. In FIG. 24, main control signal generation circuit 25 includes: a conflict detection circuit 80 that receives refresh execution block instruction signals RFEX from memory sub blocks and externally applied block address signal ADSB and detects whether an instruction for data accessing is applied to a memory sub-block that shares sense amplifier band with a refresh block or a refresh block; a gate circuit 81 receiving the output signal of flip-flop 16f shown in FIG. 19 and chip enable signal /CE; an AND circuit 82 receiving the output signal of conflict detection circuit 80 and the output signal of gate circuit 81; a de-multiplexer 83 for switching transfer paths of data access instruction R/W in accordance with the output signal of AND circuit 82; a 4-cycle delay circuit 84 for delaying the output signal from de-multiplexer 83 by 4 clock cycles; an OR circuit 85 receiving output signal φ1 of 4-cycle delay circuit 84 and output signal φ0 of de-multiplexer 83; and a pulse generation circuit 86 for activating row related control signals RCNTA and RCNTP in a predetermined sequence in accordance with the output signal of OR circuit 85.

Upon issuance of refresh request, set/reset flip-flop 16f is set when chip enable signal /CE is in the H level at the rising edge of clock signal CLK. When chip enable signal /CE is in the L level, gate circuit 81 generates its output in accordance with the output signal of set/reset flip-flop 16f. Therefore, in the case when a normal accessing operation is started with chip enable signal /CE being set in the L level, if a refreshing is already executed, the output signal of gate circuit 81 is set to the H level.

In accordance with received block address signal ADSB and refresh execution block instruction signal RFEX indicating a memory sub-block under refreshing, conflict detection circuit 80 determines whether the access memory sub-block and refresh memory sub-block causes a conflict. In this conflict determination, the determination is made as to whether or not there is a conflict in a sense amplifier band. At the time of conflict between the refreshing and normal accessing, a data output delay prediction signal WAIT is externally outputted from AND circuit 82, thereby setting an external device to the waiting state.

When data output delay prediction signal WAIT, outputted from AND circuit 80, is in the H level, de-multiplexer 83 applies data access instruction R/W to 4-cycle delay circuit 84. In the case when data output delay prediction signal WAIT outputted from AND circuit 80 is in the L level with no conflict between refreshing and normal accessing, this data access instruction R/W is applied to OR circuit 85 as signal φ0. Here, data access instruction R/W is a signal equivalent to refresh enable signal RFENA outputted from refresh decoder 15 shown in FIG. 18.

Therefore, in the case when these refreshing and normal accessing conflict each other, 4-cycle delay circuit 84 drives the signal φ1 to the active state with a delay of 4 clock cycles.

Pulse generation circuit 86 has the same construction as pulse generation circuit 16k shown in FIG. 21, except that the transfer circuit on the input stage changes its output signal in synchronization with the rise of clock signal CLK. Thus, when the output signal of OR circuit 85 is set to the H level, main row related control signals RCNTA and RCNTP are respectively activated for predetermined periods of time.

At the time of conflict between these refreshing and normal accessing, it is necessary to delay an externally applied address signal by 4 clock cycles for transference. Therefore, as illustrated in FIG. 25, on the stage preceding multiplexer 20 for switching external address and refreshing address, a circuit, which delays word line address signal ADWL externally applied by 4 clock cycles at the time of conflict between refreshing and normal accessing, is arranged.

Figure 25:
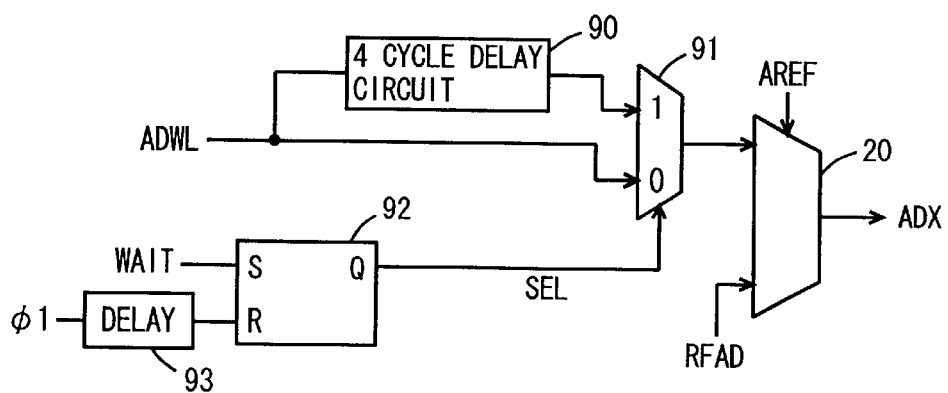
FIG. 25 is a drawing that more specifically shows the construction of an address switching unit shown in FIG. 4.

In other words, in FIG. 25, on the stage preceding multiplexer 20 making a selection between refresh address signal RFAD and externally applied address signal ADWL, a 4-cycle delay circuit 90 for delaying externally applied word line address signal ADWL by 4 cycles and a multiplexer 91 for selecting one of the output signal of this 4-cycle delay circuit 90 and externally applied word line address signal ADWL are arranged.

In order to control the multiplexer 91, there are arranged a delay circuit 93 for delaying output signal φ1 of 4-cycle delay circuit 84 shown in FIG. 24 by a predetermined period of time and a set/reset flip-flop 92, which is set in response to the activation of data output delay prediction signal WAIT, and also reset in response to the activation of the output signal of delay circuit 93. In the case when the output signal of this set/reset flip-flop 92 is in the H level with normal accessing and refreshing conflict each other, multiplexer 91 selects the output signal of 4-cycle delay circuit 90. When set/reset flip flop 92 is in the reset state, multiplexer 91 selects externally applied word line address signal ADWL.

Figure 26:
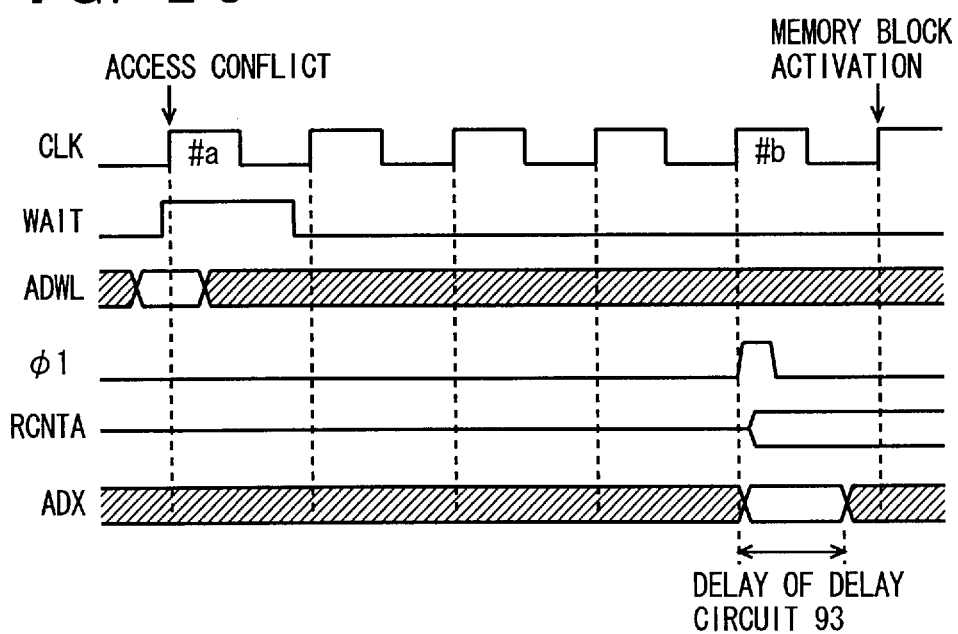
FIG. 26 is a timing chart that represents an operation of the circuit shown in FIG. 24 and FIG. 25.

FIG. 26 is a timing chart that represents the operation of an address switching unit shown in FIG. 25. Referring to FIG. 26, description will be given of the operation of the address switching unit shown in FIG. 25.

In the case when normal accessing and refreshing conflict each other, data output delay prediction signal WAIT is set to the H level for a predetermined period of time, thereby predicting an output delay to an external processor or the like. In response to the activation of this data output delay prediction signal WAIT, set/reset flip-flop 92 is set, and multiplexer 91 selects the output signal of 4-cycle delay circuit 90. When accessing conflict occurs in clock cycle #a, word line address signal ADWL is delayed by a period of 4 cycles and outputted through 4-cycle delay circuit 90.

After a lapse of 4 cycles from the occurrence of this accessing conflict, in a clock cycle #b, output signal φ1 of 4-cycle delay circuit 84 shown in FIG. 24 is activated so that row related control signal RCNTA is activated in pulse generation circuit 86 shown in FIG. 24. In the clock cycle #b, set/reset flip-flop 92 is in the set state so that multiplexer 91 selects the output of 4-cycle delay circuit 90.

In this clock cycle #b, word line address signal ADWL, externally applied in advance, reaches multiplexer 91, and word line address signal ADW, applied in the clock cycle #a, is transmitted onto the internal address bus as address signal ADX in place of refresh address. Since this address signal ADX and main row related activation signal RCNTA are transmitted in the same direction, the selected memory sub-block can receive these signals substantially at the same timing, and the selection of a word line is carried out in accordance with word line address signal ADWL.

After a lapse of the delay time of delay circuit 93, set/reset flip-flop 92 is reset, and multiplexer 91 selects externally applied word line address signal ADWL.

Figure 27:
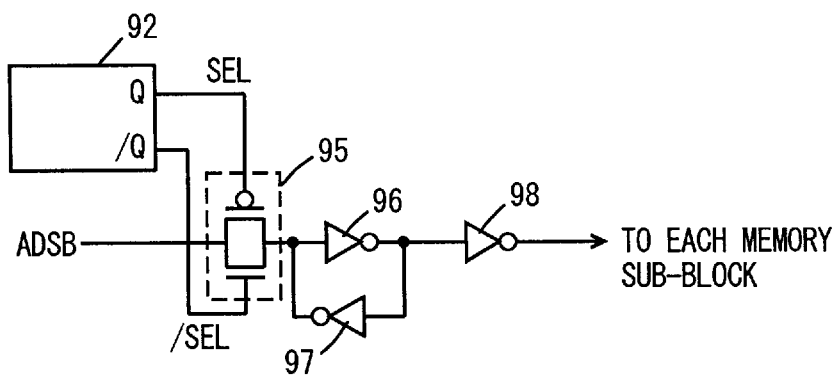
FIG. 27 is a drawing that shows an example of a construction of a control unit for a block address signal shown in FIG. 4.

FIG. 27 is a drawing that schematically shows the construction of a part for transmitting a block address signal. In FIG. 27, a block address transmission unit includes: a transmission gate 95 for transmitting externally applied block address signal ADSB in accordance with complementary output signals SEL and /SEL of set/reset flip-flop 92 shown in FIG. 25; an inverter 96 for inverting the output signal of transmission gate 95; an inverter 98 which inverts the output signal of inverter 96 and transmits the resultant signal to each memory sub-block; and an inverter 97 which inverts the output signal of inverter 96 and transmits the resultant signal to the input of inverter 96.

Figure 28:
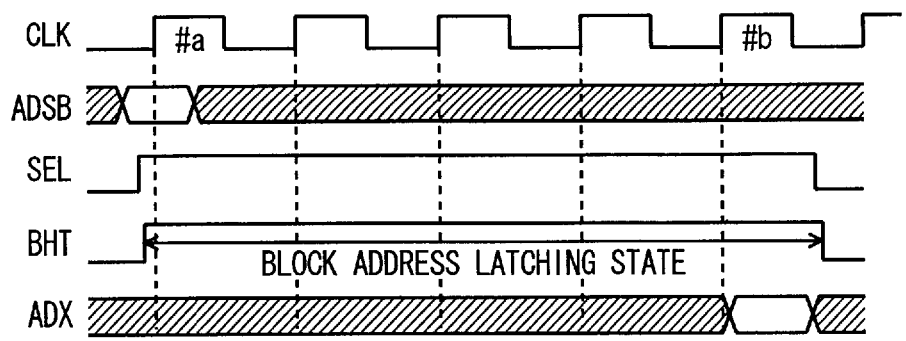
FIG. 28 is a timing chart that represents an operation of the circuit shown in FIG. 27.

This block address transmission unit is arranged in the main control circuit. Now, referring to a timing chart shown in FIG. 28, description will be given of the operation of a block address transmission unit shown in FIG. 27.

In the case in which an accessing conflict occurs in the cycle clock #a, since this block address signal ADSB is transmitted asynchronously to clock signal, output signal SEL of set/reset flip-flop 92 is activated earlier than the rise of clock signal CLK so that transmission gate 95 is set to the non-conductive state. This block address signal ADSB is latched by inverters 96 and 97. In accordance with this block address signal ADSB, the block decoder is operated in each memory sub-block and block hit signal BHT indicating that a corresponding memory sub-block is selected is activated when the corresponding memory sub-block is addressed.

Since transmission gate 95 is in the nonconductive state during the H level of output signal SEL of set/reset flip-flop 92, this block hit signal BHT is maintained in the active state in accordance with the latched block address signal. Refreshing has already been executed on the corresponding memory sub-block, and the local row related control circuit is in the latched state. Therefore, even when block hit signal BHT is driven to the selected state in accordance with block address signal in the normal accessing state, no adverse effects are exerted to the refreshing operation.

After a lapse of 4 clock cycles since the accessing conflict, set/reset flip-flop 92 is reset in the clock cycle #b, output signal SEL is set to the L level and transmission gate 95 is set in the conductive state. Accordingly, block address signal ADSB is set to an indefinite state, and block hit signal BHT is driven to the non-selected state in accordance with the current block address signal.

During the clock cycle #b, word line address ADX corresponding to the external address is transmitted. Since block hit signal BHT has already been in the selected state in accordance with the latched block address signal, it is possible to accurately select the memory sub-block, and to select a corresponding memory cell.

Figure 29:
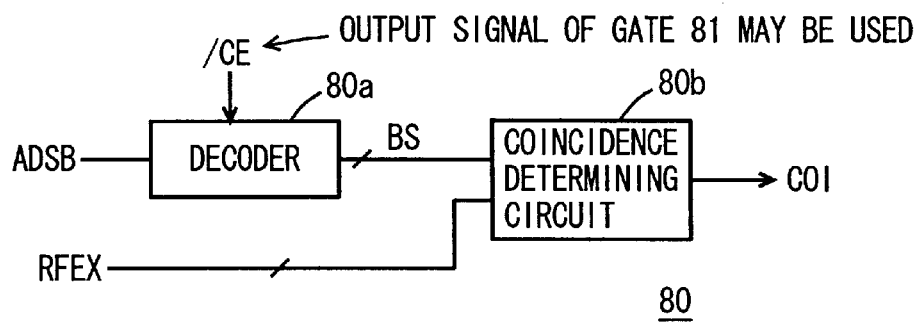
FIG. 29 is a drawing that schematically shows an example of a construction of a conflict detection circuit shown in FIG. 24.

FIG. 29 is a drawing that schematically shows the construction of conflict detection circuit 80 shown in FIG. 25. In FIG. 29, conflict detection circuit 80 includes a decoder 80a which decodes block address signal ADSB applied to generate a block selection signal BS in activation of chip enable signal /CE, and a coincidence determining circuit 80b which receives block selection signal BS outputted from decoder 80a and refresh execution block instruction signals RFEX from the memory sub-blocks and makes a determination as to whether block selection signal BS and refresh execution block instruction signal RFEX respectively designate a memory block sharing a sense amplifier band each other.

With respect to a memory sub-block having a conflict in sense amplifier band with a memory sub-block under refreshing, when block selection signal BS is activated, this coincidence determining circuit 80b drives a coincidence instruction signal COI to an activated state. In other words, in the case when a memory sub-block under refreshing or a memory sub-block sharing a sense amplifier band with a memory sub-block under refreshing is specified by the block selection signal, this case is determined as a block conflict, and a conflict avoiding operation is carried out.

Figure 30:
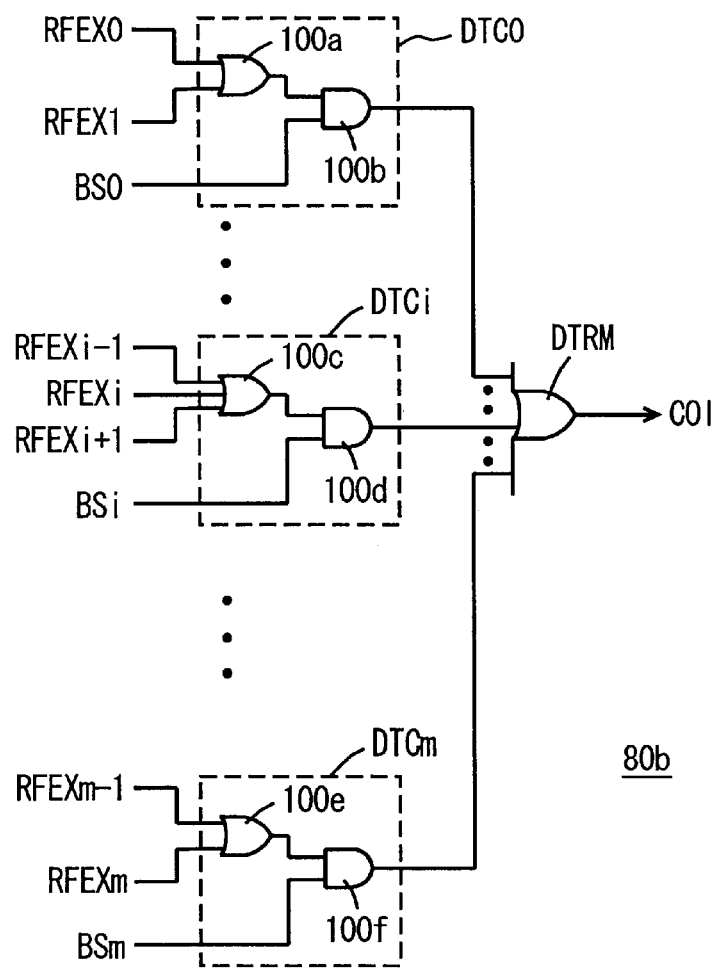
FIG. 30 is a drawing that shows an example of a construction of a coincidence determination circuit shown in FIG. 29.

FIG. 30 is a drawing that shows an example of the construction of coincidence determining circuit 80b shown in FIG. 29. In FIG. 30, coincidence determining circuit 80b includes coincidence detection circuits DTC0–DTCm arranged corresponding to respective memory sub-blocks MB0–MBm, and an OR circuit DTRM which receives output signals from these coincidence detection circuits DTC0–DTCm to output a coincidence instruction signal COI based on the result of determination.

Each of coincidence detection circuits DTC0–DTCm includes an OR circuit that indicates whether or not refreshing is being carried out on its own memory block and adjacent memory blocks, and an AND circuit receiving the output signal of this OR circuit and the corresponding block selection signal. Specifically, coincidence detection circuit DTC0 corresponding to memory sub-block MB0 includes an OR circuit 100a receiving refresh execution block instruction signals RFEX0 and RFEX1 and an AND circuit 100b receiving the output signal of OR circuit 100a and block selection signal BS0.

Coincidence detection circuit DTCi corresponding to memory sub-block MBi includes OR circuit 100c receiving refresh execution block instruction signals RFEXi−1, RFEXi and RFXi+1, and an AND circuit 100d receiving the output signal of OR circuit 100c and block selection signal BSi.

Coincidence detection circuit DTCm corresponding to memory sub-block MBm includes an OR circuit 100e receiving refresh execution block instruction signals RFEXm−1 and RFEXm and an AND circuit 100f receiving the output signal of OR circuit 100e and block selection signal BSm.

The output signals of these AND circuits 100b, 100d and 100f are supplied to OR circuit DTRM.

Each of refresh execution block instruction signals RFEX0–RFEXm is a signal returned back from the local control circuit to the main control circuit, and is set to the active state of H level when the corresponding memory sub-block is under refreshing. With respect to a memory sub-block that is specified in normal accessing, in the case in which either of the selected memory sub-block or adjacent memory sub-blocks sharing a sense amplifier band with this selected memory sub-block is under refreshing, either one of these coincidence detection circuits DTC0–DTCm outputs a signal of H level so that coincidence determination result instruction signal COI is set to the H level. Thus, it is recognized that a conflict is occurring between refreshing and normal accessing.

Figure 31:
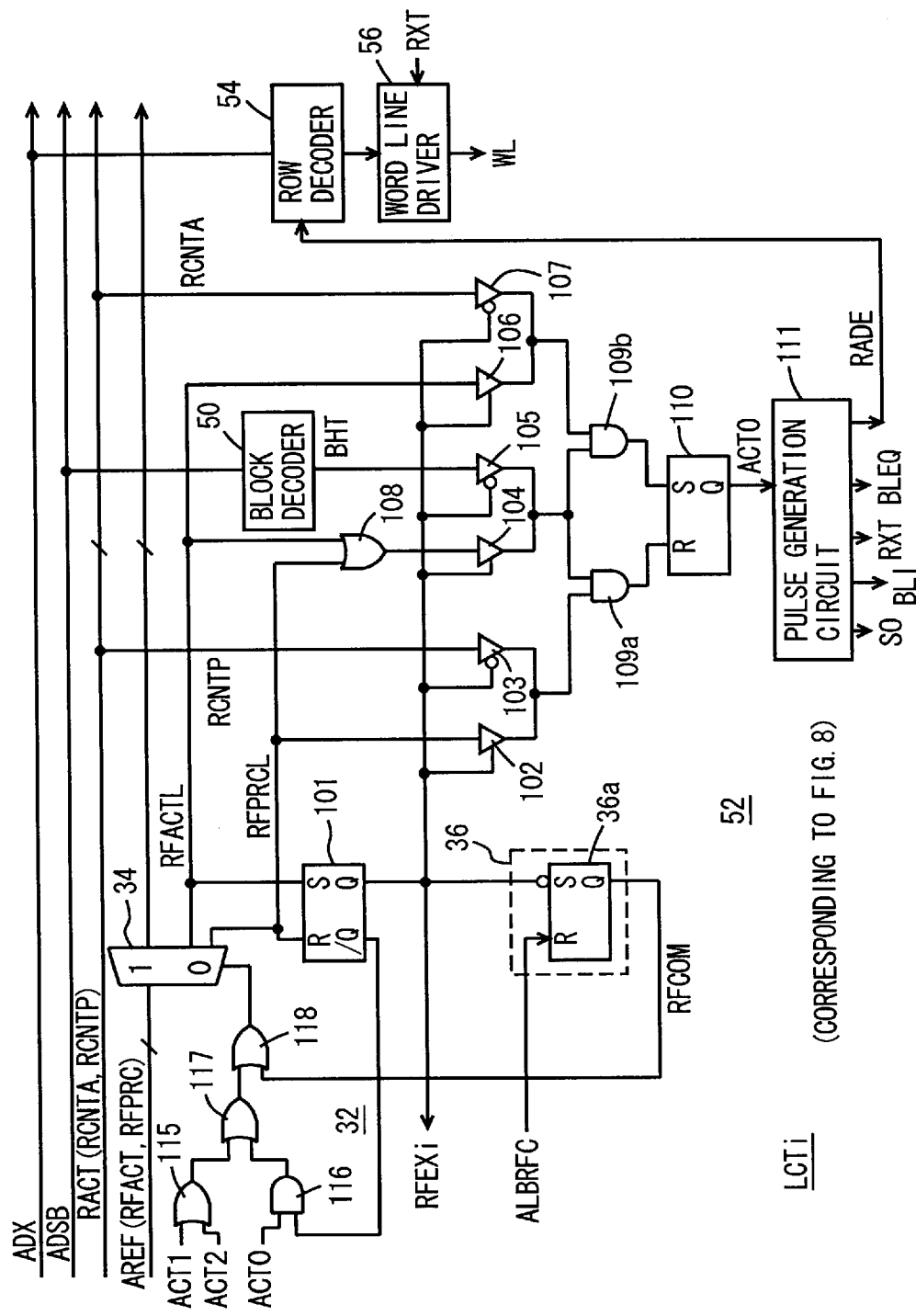
FIG. 31 is a drawing that schematically shows the construction of a local control circuit in accordance with the first embodiment of the present invention.

FIG. 31 is a drawing that shows one example of the construction of local control circuit LCTi shown in FIG. 8. In FIG. 31, in order to control the refreshing operation, local control circuit LCTi includes a set/reset flip-flop 101 which is set upon activation of local refresh activation signal RFACTL from de-multiplexer 34 for receiving internal refresh instruction AREF, and reset in response to activation of local refresh pre-charge instruction signal RFPRCL.

Local row related control circuit 52 includes: an OR circuit 108 receiving local refresh activation signal RFACTL and local refresh pre-charge instruction signal RFPRCL; a tri-state buffer circuit 102 which is activated upon activation of a signal from output Q of set/reset flip-flop 101, that is, refresh execution block instruction signal RFEXi, to transmit local refresh pre-charge instruction signal RFPRCL; tri-state buffer circuits 103 and 107 which are activated upon inactivation of refresh execution block instruction signal RFEXi, to respectively transmit main row pre-charge activation signal RCNTP and main row activation signal RCNTA from the main control circuit; a tri-state buffer circuit 104 which is activated upon activation of refresh execution block instruction signal RFEXi to pass an output signal of OR circuit 108, and a tri-state buffer circuit 105 which is activated upon inactivation of refresh execution block instruction signal RFEXi for transmitting block bit signal BHT from block decoder 50.

Upon activation of local refresh activation signal RFACTL, this set/reset flip-flop 101 activates refresh execution block instruction signal RFEXi for transmission to the main control circuit. This local refresh activation signal RFACTL taken in during this refreshing operation is utilized as a block hit signal. Therefore, even when internal refresh instruction AREF is successively transmitted to memory sub-blocks without specifying a memory sub-block, de-multiplexer 34 selects internal refresh instruction AREF so that when local refresh activation signal RFACTL is activated, the corresponding memory sub-block is selected.

The outputs of tri-state buffer circuits 102 and 103 are connected together, and the outputs of tri-state buffer circuits 104 and 105 are connected together. The outputs of tri-state buffers 106 and 107 are connected together. These tri-state buffer circuits 102–107 are each set to the output high impedance state when inactivated.

Local row related control circuit 52 includes: an AND circuit 109a receiving an output signal of tri-state buffer circuit 102 or 103 and an output signal of tri-state buffer circuit 104 or 105; an AND circuit 109b receiving an output signal of tri-state buffer circuit 104 or 105 and an output signal of tri-state buffer circuit 106 or 107; a set/reset flip-flop 110 which is set in response to the rise (activation) of the output signal of AND circuit 109b, and reset in response to activation of the output signal of AND circuit 108a; and a pulse generation circuit 111 which drives row related control signals RADE, BLEQ, RXT, BLI and SO in a predetermined sequence in response to activation of output signal ACT0 of set/reset flip-flop 110.

Output signal (array activation signal) ACT0 of this set/reset flip-flop 110 is utilized as a row selecting operation instruction signal for the corresponding memory sub-block, and maintained in the active state while the corresponding memory sub-block is in the selected state.

This local control circuit LCTi further includes a set/reset flip-flop 36a which is set in response to the fall of refresh execution block instruction signal RFEXi outputted from set/reset flip-flop 101, and reset in response to the activation of all block refresh completion instruction signal ALBRFC, and outputs refresh completion signal RFCOM. This set/reset flip-flop 36a corresponds to refresh acceptance latch circuit 36 shown in FIG. 5.

This local control circuit LCTi further includes: an OR circuit 115 receiving array activation signals ACT1 and ACT2 of adjacent sub-blocks; an AND circuit 116 receiving array activation signal ACT0 of the corresponding memory block array and an output signal of output/Q of set/reset flip-flop 101; an OR circuit 117 receiving the output signal of OR circuit 115 and the output signal of AND circuit 116; and an OR circuit 118 receiving the output signal of OR circuit 117 and refresh completion instruction signal RFCOM from set/reset flip-flop 36a. A connection path of de-multiplexer 34 is established in accordance with the output signal of OR circuit 118.

These gate circuits 115–118 correspond to refresh acceptance permission signal generation circuit 32 shown in FIG. 5.

In this construction of local control circuit LCTi shown in FIG. 31, in the case in which an adjacent memory block is selected state with array activation signal ACT1 or ACT2 being set in the H level, de-multiplexer 34 transfers internal refresh instruction AREF (RFACT and RFPRC) to a memory sub-block on the next stage through OR circuits 115, 117 and 118. Moreover, in the case when the corresponding memory sub-block is under normal accessing with array activation signal ACT0 being in the activated state, set/reset flip-flop 101 is in the reset state, and the output signal of AND circuit 116 is set in the H level. Thus, in the same manner, de-multiplexer 34 transfers this internal refresh instruction AREF to a memory sub-block on the next stage.

Figure 32:
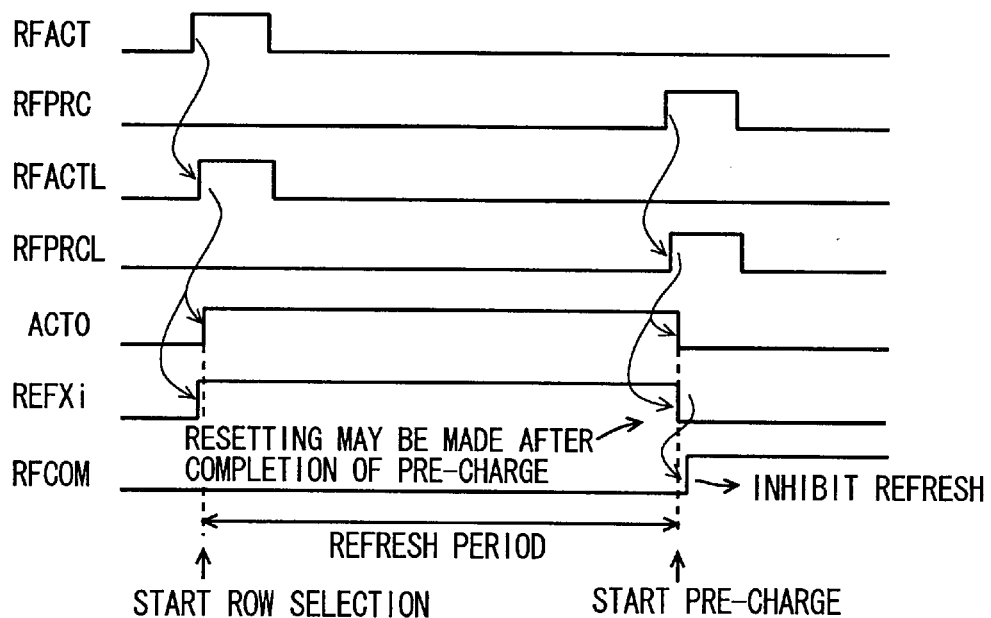
FIG. 32 is a timing chart that represents an operation of a row related local control circuit shown in FIG. 31.

Now, referring to FIG. 32, a description will be given of the operation in which refreshing is carried out on the corresponding memory sub-block in local control circuit LCTi.

During the refreshing operation on the corresponding memory sub-block, the output signal of OR circuit 118 is in the L level, and de-multiplexer 34 is set so as to acquire internal refresh instruction AREF. When refresh activation signal RFACT is activated in accordance with this internal refresh instruction AREF, local row activation signal RFACTL is activated through this de-multiplexer 34, set/reset flip-flop 101 is set, and refresh execution block instruction signal RFEXi is set in the H level.

When refresh execution block instruction signal RFEXi is activated, tri-state buffer circuits 102, 104 and 106 are activated. Therefore, when local refresh activation signal RFACTL is activated, the output signal of OR circuit 108 is set to the H level. Accordingly, the output signals of tri-state buffer circuits 104 and 106 attain the H level, the output signal of AND circuit 109 attains the H level, and set/reset flip-flop 110 is set. Thus, array activation signal ACT0 is activated. Upon activation of this array activation signal ACT0, pulse generation circuit 111 activates/inactivates local row related control signals in a predetermined sequence, and in accordance with the current refresh address signal, a refresh row is driven to the selected state by row decoder 54 and word line driver 56, and refreshing on the memory cells is performed.

During the activation period of refresh execution block instruction signal RFXi, the output signal of AND circuit 116 is set in the L level and the output signal of OR circuit 115 is also set in the L level so that de-multiplexer 34 is maintained in a state of accepting internal refresh instruction signal AREF. Therefore, upon activation of refresh pre-charge instruction signal RFPRC, local refresh pre-charge instruction signal RFPRCL from de-multiplexer 34 is activated so that the output signal of OR circuit 108 attains the H level. Accordingly, the output signals of tri-state buffer circuits 102 and 104 attain the H level so that set/reset flip-flop 110 is reset through AND circuit 109a.

The resetting of set/reset flip-flop 110 inactivates array activation signal ACT0, and pulse generation circuit 111 returns local row related control signals to the respective pre-charged states in a predetermined sequence.

Moreover, in response to activation of this local refresh pre-charge instruction signal RFPRCL, set/reset flip-flop 101 is reset, and refresh execution block instruction signal RFEXi is inactivated so that the main control circuit is signaled of the fact that the refreshing operation on this memory sub-block is completed.

In response to the inactivation of refresh execution block instruction signal RFEXi, set/reset flip-flop 36a is set, refresh completion instruction signal RFCOM is set to the H level so that the connection paths of de-multiplexer 34 are switched to inhibit acceptance of internal refresh instruction AREF. Thereafter, internal refresh instruction AREF is transferred to a memory sub-block on the next stage.

Here, refresh execution block instruction signal RFEXi from set/reset flip-flop 101 may be inactivated after all the row related control signals in pulse generation circuit 111 are returned to the pre-charged states and the pre-charging of the corresponding memory sub-block is completed. In other words, after a lapse of the so-called RAS pre-charge time tRP, this refresh execution block instruction signal RFEXi may be inactivated.

Figure 33:
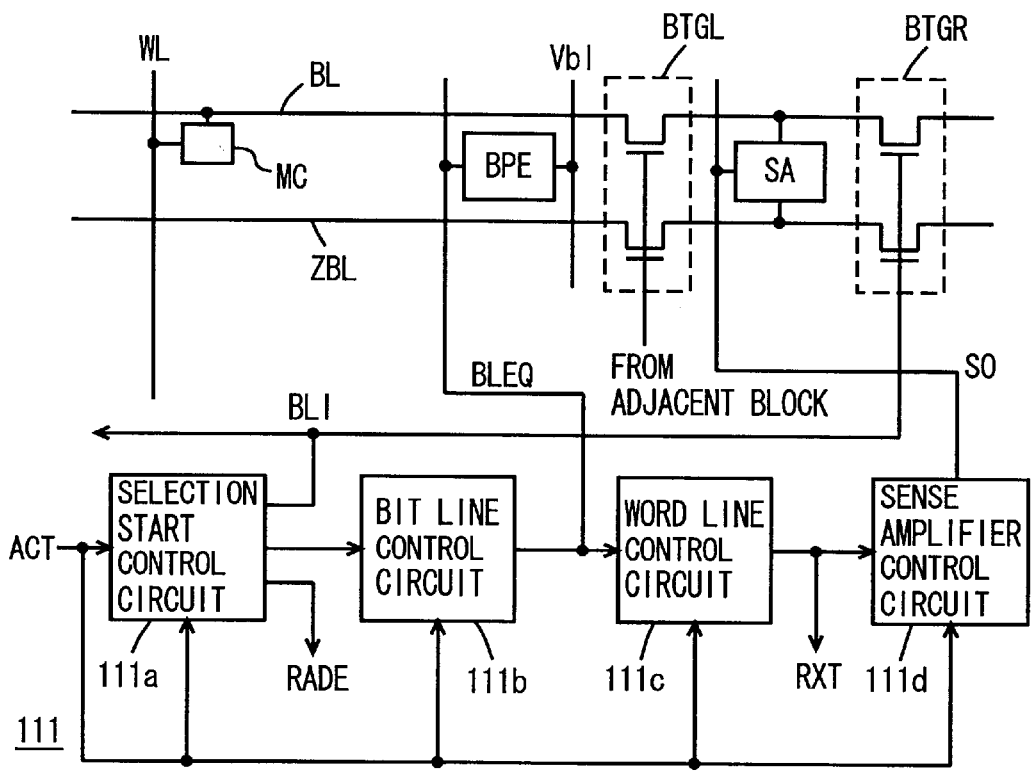
FIG. 33 is a drawing that schematically shows the construction of a pulse generation circuit shown in FIG. 31.

FIG. 33 is a drawing that schematically shows the construction of pulse generation circuit 111 shown in FIG. 31. FIG. 33 specifically shows the construction related to one pair of bit lines in the corresponding memory sub-block. Bit lines BL and ZBL are arranged so as to form a pair, and a memory MC is arranged corresponding to a crossing of a bit line in a pair and a word line WL. In FIG. 33, a memory cell MC is arranged corresponding to a crossing of bit line BL and word line WL.

These bit lines BL and ZBL are provided with a bit line pre-charge/equalize circuit BPE which pre-charges and equalizes bit lines BL and ZBL to the intermediate voltage Vb1 upon activation of bit line equalize instruction signal BLEQ.

Bit lines BL and ZBL are connected to sense amplifier SA through bit line isolation gate BTGL. This sense amplifier SA is further connected to an adjacent memory sub-block through bit line isolation gate BTGR.

In the arrangement of bit lines shown in FIG. 33, an alternate arranged, shared sense amplifier configuration is used so that in sense amplifier bands on both of the sides of memory sub-block, sense amplifiers are arranged on alternate columns.

Bit line isolation gate BTGL is controlled in conduction by bit line isolation instruction signal BLI from the local row related control circuit provided on the adjacent memory block.

Pulse generation circuit 111 includes: a selection start control circuit 111a which drives bit line isolation instruction signal BLI to the L level in response to the activation of array activation signal ACT and activates row address decode enable signal RADE; a bit line control circuit 111b which drives bit line equalize instruction signal BLEQ to the inactive state in accordance with the output signal of this selection start control circuit 111a; a word line control circuit 111c which, after a lapse of a predetermined period of time since the activation of bit line equalize instruction signal BLEQ, drives word line driving timing signal RXT to the selected state; and a sense control circuit 111b which, after a lapse of a predetermined period of time since the activation of word line driving timing signal RXT, activates sense amplifier activation signal SO.

Sense amplifier SA includes a P sense amplifier constituted by P-channel MOS transistors and an N sense amplifier constituted by N-channel MOS transistors, and sense amplifier activation signals are supplied to these P sense amplifier and N sense amplifier. However, in FIG. 33, P sense amplifier activation signal and N sense amplifier activation signal are shown being applied as sense amplifier activation signal SO.

Selection start control circuit 111a includes a BLI driver, and drives bit line isolation instruction signal BLI to a boosted voltage level when setting to the H level. This bit line isolation instruction signal BLI is supplied to a bit line isolation gate provided for a memory sub-block that shares a sense amplifier band with the corresponding memory sub-block, and in FIG. 33, bit line isolation instruction signal BLI, outputted by selection start control circuit 111a, is applied to bit line isolation gate BTGR.

In the arrangement of pulse generation circuit 111 shown in FIG. 33, bit line isolation instruction signal BLI is driven to the L level in response to the activation of array activation signal ACT, and row address decode enable signal RADE is driven to the selected state. Then, after a predetermined delay time, bit line isolation instruction signal BLEQ is inactivated, and word line driving timing signal RXT and sense amplifier activation signal SO are then driven to the activated state at predetermined timings. When array activation signal ACT is set to the L level, these circuits 111a–111d are returned to the initial state so that the local row related control signals are returned to the pre-charged states.

Pulse generation circuit 111, shown in FIG. 33, is equivalently constituted by delay circuits, and activates/inactivates the corresponding row related control signals by delaying applied signals by predetermined periods of time.

Here, row address decode enable signal RADE and word line driving timing signal RXT are applied to row decoder 50 and word line driver 56 respectively shown in FIG. 31.

Main row activation signal RCNTA, main pre-charge activation signal RCNTP, refresh activation signal RFACT and refresh pre-charge activation signal RFPRC each may be constituted by control signals having a plurality of phases, and the respective local row related control signals may have their activation/inactivation timing set in accordance with these control signals having a plurality of phases in the pulse generation circuits.

Modification of Local Row Related Control Circuit

Figure 34:
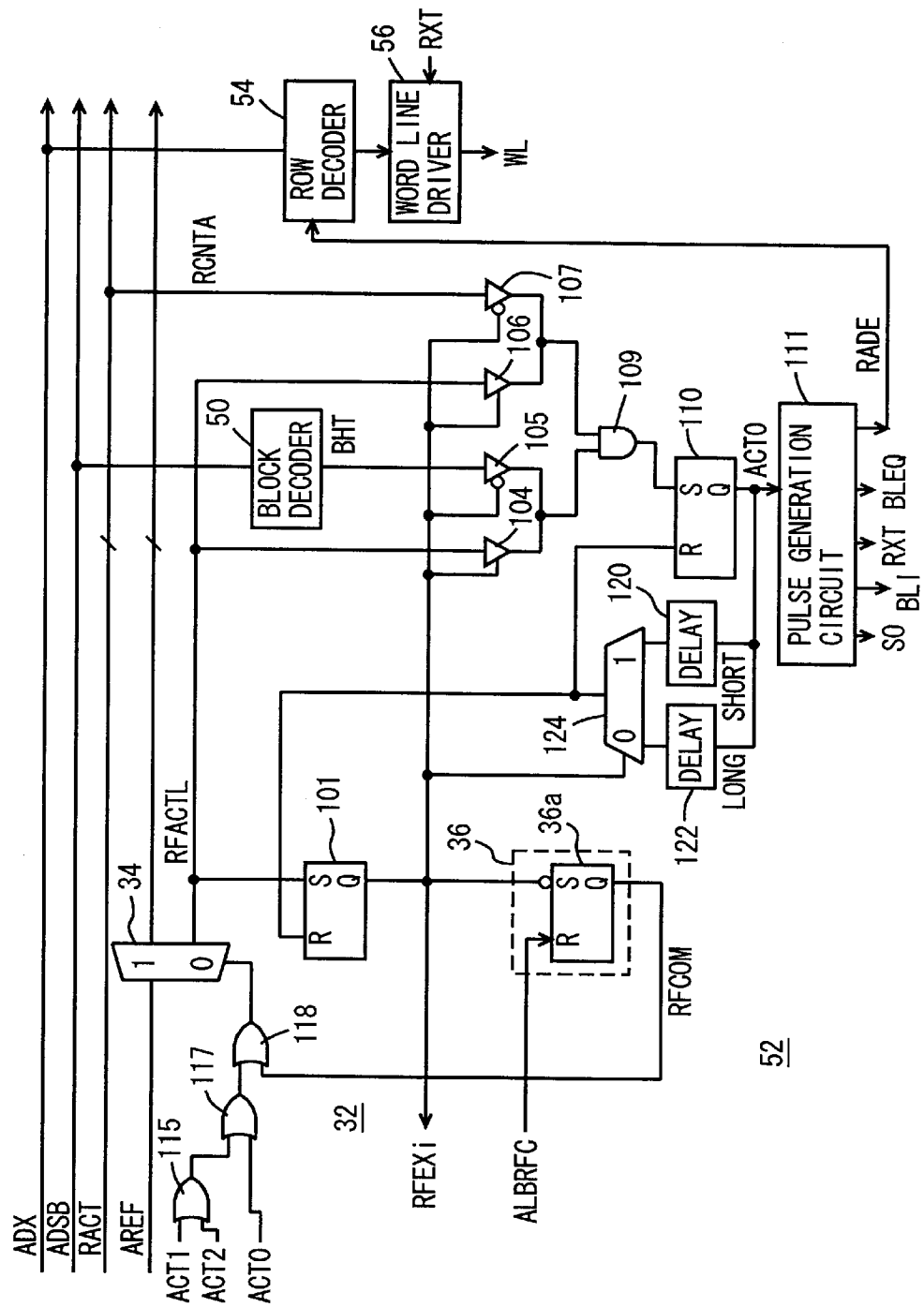
FIG. 34 is a drawing that shows a modification of the control circuit in accordance with the first embodiment of the present invention.

FIG. 34 is a drawing that shows a modification of the local control circuit in accordance with a first embodiment of the present invention. In the local control circuit shown in FIG. 34, row related activation signal RACT and internal refresh instruction AREF are each generated from the main control circuit in the form of a one-shot pulse. In accordance with one-shot pulse signals, a refreshing operation is carried out in a selected memory sub-block by driving a word line to the selected state for an activation period that is determined internally.

De-multiplexer 34 selects internal refresh instruction AREF to generate local refresh activation signal RFACTL for the corresponding memory sub-block or to transfer this internal refresh instruction AREF to the circuit on the next stage. In order to control the de-multiplexer 34, the following OR circuits are provided: an OR circuit 115 receiving array activation signals ACT1 and ATCT2; an OR circuit 117 receiving the output signal of OR circuit 115 and array activation signal ACT0; and an OR circuit 118 receiving the output signal of OR circuit 117 and refresh completion instruction signal RFCOM.

Therefore, in the case when the array is in the activated state in the corresponding memory sub-block or the adjacent memory sub-block, de-multiplexer 34 transfers internal refresh instruction AREF to the next stage.

The set/reset flip-flop 110 for generating array activation signal ACT0 is set in response to the output signal of AND circuit 109, similarly to the construction shown in FIG. 31. However, at the time of the resetting, the resetting operation is carried out in accordance with the output signal of multiplexer 124. Multiplexer 124 selects one of the output signals of delay circuits 120 and 122 that delay array activation signal ACT0 by predetermined periods of time, respectively, in accordance with refresh execution block instruction signal RFEXi. In other words, when refresh execution block instruction signal RFEXi is in the activated state, multiplexer 124 selects the output signal of delay circuit 120 having a shorter delay time, and applies the selected signal to the reset input of set/reset flip-flop 110. When refresh execution block instruction signal RFEXi is in the inactivated state, multiplexer 124 selects the output signal of delay circuit 122 having a longer delay time, and applies the selected signal to the reset input of set/reset flip-flop 110. The output of the multiplexer 124 is also supplied to the reset input of set/reset flip-flop 101 outputting refresh execution block instruction signal RFEXi.

In the construction shown in FIG. 34, in the normal operation mode, or in normal accessing, in accordance with block hit signal BHT from block decoder 50 and the activation of row related activation signal RACT, set/reset flip-flop 110 is set so that array activation signal ACT0 is activated. After a lapse of the delay time of delay circuit 122, set/reset flip-flop 110 is reset, array activation signal ACT0 is inactivated, and the corresponding memory sub-block is returned to the pre-charged state. Therefore, during the delay time of this delay circuit 122, row selection and column selection are performed so that accessing is made on a selected memory cell.

Here, in the refreshing operation, in the case when the corresponding memory sub-block is in the inactive state, de-multiplexer 34 selects internal refresh instruction AREF and local refresh activation signal RFACTL is activated so that set/reset flip-flop 101 is set. When local refresh activation signal RFACTL is activated, the output signals of tri-state buffer circuits 104 and 106 attain the H level, and set/reset flip-flop 110 is set. The setting of this set/reset flip-flop 110 activates array activation signal ACT0 so that de-multiplexer 34 stops taking in internal refresh instruction AREF, and transfers the received instruction to the next stage.

However, refresh activation signal RFACTL is already taken in, and the selection of a memory cell is carried out for refreshing the selected memory cell in accordance with array activation signal ACT0 and the refresh address. After a lapse of the delay time of delay circuit 120, multiplexer 124 resets set/reset flip-flop 110 in accordance with the output signal of the delay circuit 120 so that array activation signal ACT0 is inactivated.

Moreover, in accordance with the output signal of this multiplexer 124, set/reset flip-flop 101 is reset so that refresh execution block instruction signal RFEXi is also driven to the inactivated state. In response to the inactivation of the refresh execution block instruction signal RFEXi, set/reset flip-flop 36a is set and refresh completion instruction signal RFCOM is activated and accordingly, de-multiplexer 34 is set so as to transfer internal refresh instruction AREF to the next stage circuit.

Figure 35:
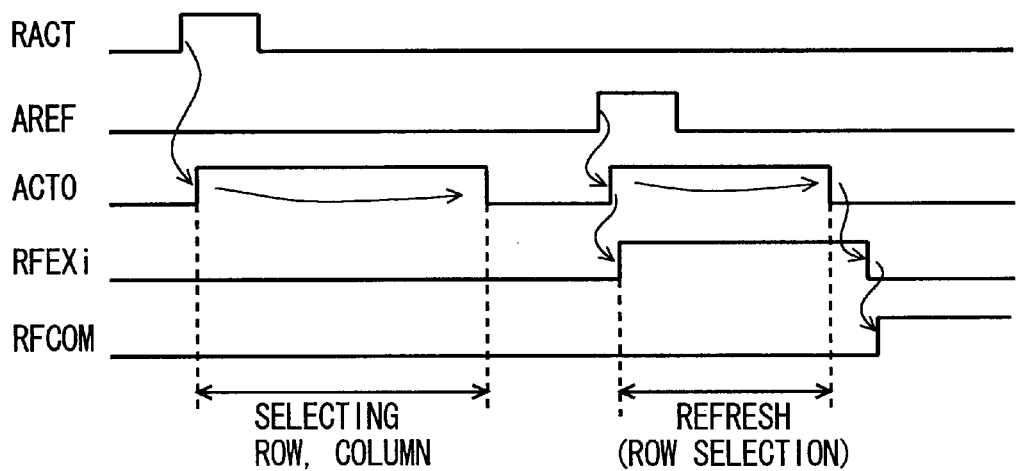
FIG. 35 is a timing chart that represents an operation of a local row related control circuit shown in FIG. 34.

Therefore, in the case of the construction of the local control circuit shown in FIG. 34, as shown in its operation timing chart of FIG. 35, in the row accessing operation, array activation signal ACT0 is activated during the delay time of delay circuit 122 in accordance with row related activation signal RACT, and in the refreshing operation, array activation signal ACT0 is activated during the delay time of delay circuit 120 in accordance with internal refresh instruction AREF. Therefore, in normal accessing, during the period of activation of the array activation signal ACT0, selection of row and column is carried out and the data accessing is made on a selected memory cell. In refreshing, during the activation of array activation signal ACT0, row selection is performed so that refreshing is carried out on the storage data in the memory cells. No column selection is carried out in the refreshing operation.

In a normal accessing, the memory cycle is determined by the delay time of delay circuit 122, and therefore, it is not particularly necessary to issue a pre-charge command so that it is possible to carry out a data accessing operation at a high speed within a predetermined cycle time.

Modification of Local Control Circuit

Figure 36:
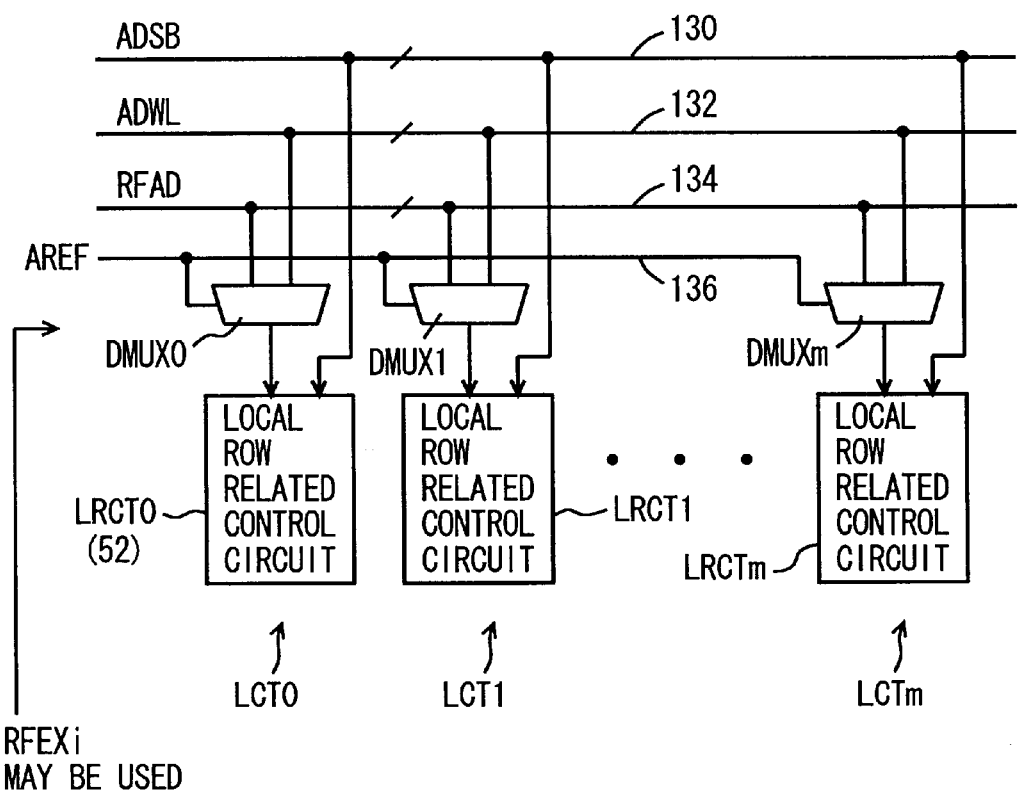
FIG. 36 is a drawing that schematically shows a modification of the first embodiment of the present invention.

FIG. 36 is a drawing that shows a modification of the address switching unit. In FIG. 36, de-multiplexers DMUX0–DMUXm for selecting one of refresh address signal RFAD and normal word line address signal ADWL are provided corresponding to the respective local control circuits LCT0–LCTm. De-multiplexers DMUX0–DMUXm each select one of refresh address signal RFAD and normal word line address signal ADWL in accordance with internal refresh instruction AREF, for transmission to the corresponding local row related control circuits LRCT0–LRCTm. Block address signal ADSB is also supplied to the local row related control circuits LRCT0–LTCTm.

Block address signal ADSB is transmitted from an address input circuit commonly to local control circuits LCT0–LCTm through a block address bus 130. Word line address signal ADWL is transmitted from a word line address input circuit included in the main control circuit commonly to local control circuits LCT0–LCTm through a word line address bus 132. Refresh address signal RFAD from the refresh address generation circuit is commonly transmitted to local control circuits LCT0–LCTm through a refresh address bus 134.

In the case of the construction shown in FIG. 36, the input section of each of local control circuits LCT0–LCTm selects one of refresh address signal RFAD and normal word line address signal ADWN. Therefore, the loads of signal lines for transferring respective bits of address buses 132 and 134 can be made the same and the operation timings of row related circuits in normal accessing and in refreshing are made the same. Thus, it becomes possible to stably operate the row related circuits during the normal accessing operation and the refreshing operation.

Here, in the construction shown in FIG. 36, address de-multiplexers DMUX0–DMUXm have their connecting paths determined in accordance with internal refresh instruction AREF. However, local row related control circuits LRCT0–LRCTm may individually establish their connection paths in accordance with refresh execution block instruction signals RFEXi. In the refreshing operation, refresh address signal RFAD is taken in by any of local row related control circuits LRCT0–LRCTm so as to carry out the refreshing operation.

Here, in the construction shown in FIG. 36, the following construction may be employed. In each of local row related control circuits LRCT0–LRCTm, detection is be made as to a conflict between normal accessing and refreshing, and each result of the conflict detection is transmitted to the central control circuit, and the access conflict is determined in the central control circuit in accordance with these conflict detection signals. In other words, the following construction may be employed, in which coincidence detection circuits DCT0–DCTm as shown in FIG. 30 are respectively arranged in local row related control circuits LRCT0–LRCTm and in accordance with refresh execution block instruction signals RFEX of adjacent blocks, a conflict between refreshing and normal accessing is detected. Here, these results of coincidence determination need to be made prior to issuance of main row related control signal RACT (main row activation signal RCNTA).

Figure 37:
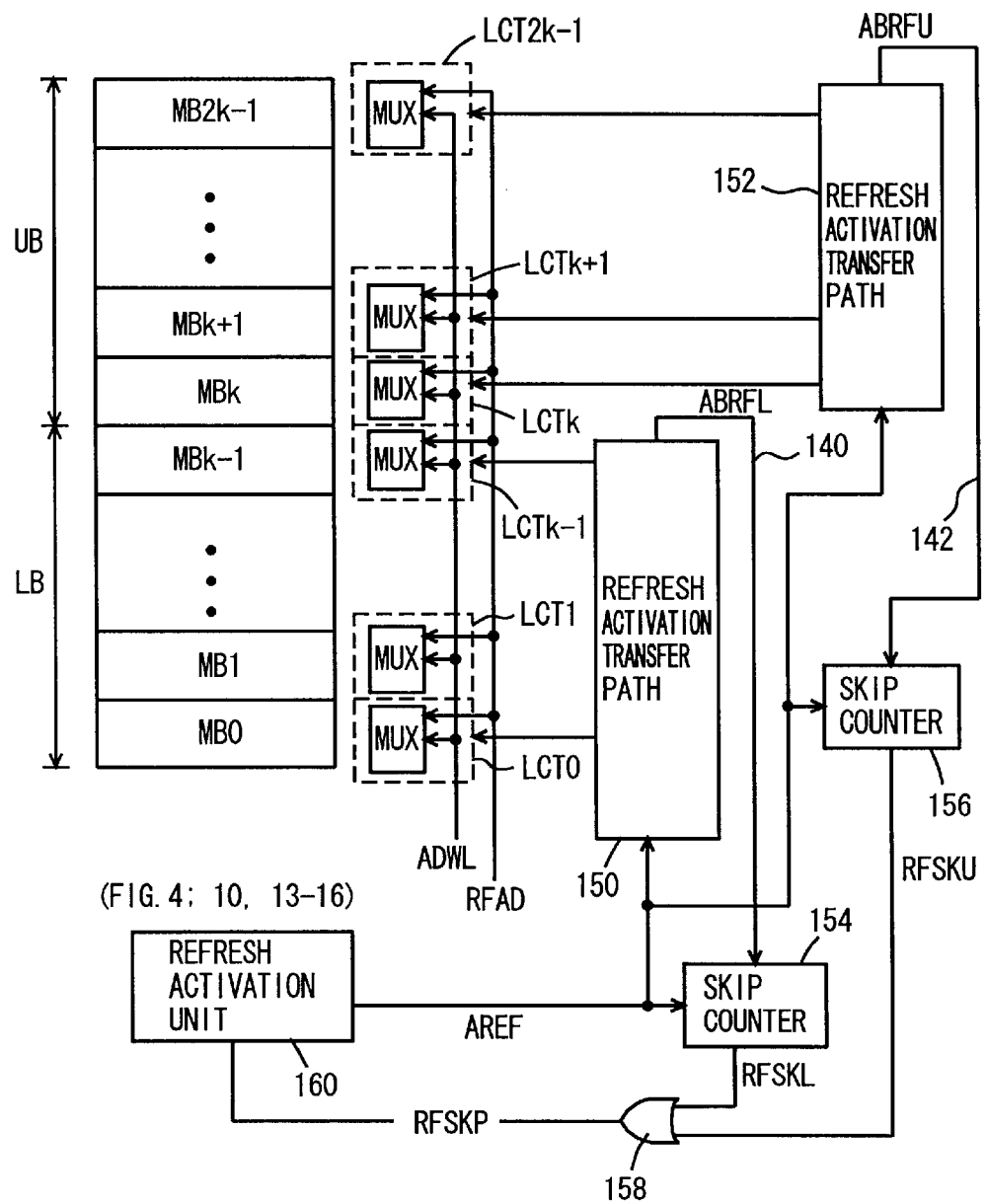
FIG. 37 is a drawing that schematically shows the construction of a main part of a semiconductor memory device in accordance with a second embodiment of the present invention.

As described above, in accordance with the first embodiment of the present invention, a refreshing is performed on a refresh executable memory sub-block with conflict between normal accessing and refreshing being prevented. Thus, it is possible to carry out refreshing while completely hiding the refreshing operation from outside and to eliminate the necessity of applying any refreshing control externally and it becomes possible to achieve a pseudo SRAM interface through which accessing is made with only data access instruction Second Embodiment FIG. 37 is a drawing that schematically shows the construction of a main part of a semiconductor memory device in accordance with a second embodiment of the present invention. In FIG. 37, memory sub-blocks MB0–MB2k–1 are divided into a lower block LB including memory sub-blocks MB0–MBk–1 and an upper block including memory sub-blocks MBk–MB2k–1. Local control circuits LCT0–LCT2k–1 are respectively arranged in these memory blocks MB0–MB2k–1.

Local control circuits LCT0–LCT2k–1 have the construction similar to that as described in the first embodiment. However, FIG. 37 shows a multiplexer MUX provided in each of local control circuits LCT0–LCT2k–1 and selecting one of normal word line address signal ADWL and refresh address signal RFAD.

A refresh activation transfer path 150 is provided for lower block LB constituted by memory sub-blocks MB0–MB2k–1, and a refresh activation transfer path 152 is provided for upper block UB constituted by memory sub-block MBk–MB2k–1. These refresh activation transfer paths 150 and 152 each transfer internal refresh instruction AREF. Internal refresh instruction is taken in a local control circuit provided corresponding to a memory sub-block on which refreshing can be performed. In the case in which no refreshing is carried out, block refresh skip instruction signals ABRFL and ABRFU are returned through respective return paths 140 and 142 of these refresh activation transfer paths 150 and 152.

Block refresh skip instruction ABRFL on the refresh skip instruction return path 140 is supplied to skip counter 154, and returned refresh instruction signal (block refresh skip instruction) ABRFU from refresh activation transfer path 152 is supplied to skip counter 156 through return path 142.

These skip counters 154 and 156 each decrement one from the count upon issuance of internal refresh instruction AREF, and when block refresh skip instructions ABRFL and ABRFU are applied thereto, the count is incremented by one. Here, similarly to the first embodiment, in these skip counters 154 and 156, in the decrementing operation of the count, the minimum value of the count is 0, and even when an internal refresh instruction is issued when the count is 0, the count is maintained at 0.

Skip flags RFSKL and RFSKU of these skip counters 154 and 156 are applied to refresh activation unit 160 as refresh skip flag RFSKP through OR circuit 158. When the count is 0, skip counters 154 and 156 respectively set flags RFSKL and RFSKU to the de-asserted state, and when the count is different from 0, these flags RFSKL and RFSKU are set to the asserted state.

In the construction shown in FIG. 4, refresh activation unit 160 corresponds to the construction including refresh timer 10, OR circuit 13, refresh flag generation circuit 14, refresh instruction generation circuit 16 and refresh decoder 15. During the asserted state of refresh skip flag RFSKP, internal refresh instruction AREF is repeatedly issued.

This internal refresh instruction AREF may be applied in a one-shot pulse signal form, or may be comprised of refresh activation signal RFACT and refresh pre-charge activation signal RFPRC. In the following description, unless otherwise mentioned, internal refresh instruction AREF is comprised of both of these signals.

Refresh activation transfer paths 150 and 152 respectively include internal refresh instruction transfer paths shown in FIG. 5. In other words, instead of the construction in which one transfer path is commonly arranged for memory sub-blocks MB0–MBm in FIG. 5, one transfer path for internal refresh instruction AREF is arranged in each of lower memory block LB and upper memory block UM.

Here, in these refresh activation transfer paths 150 and 152, internal refresh acceptance de-multiplexers are arranged corresponding to memory sub-blocks. These de-multiplexers are arranged in the local control circuit. However, for convenience of description, in FIG. 37, these de-multiplexers are shown being arranged outside the local control circuit.

In the case in which (n+1) word lines are arranged in each of memory sub-blocks MB0–MB2k–1 and the refresh period is tREF, the refresh cycle time required for refreshing all the word lines once is represented by tREFmax=tREF·(2k)·(n+1). Therefore, with respect to all the memory cells, it is necessary to ensure a data holding time of at least tREFmax.

By respectively setting this refresh cycle time tREFmax in refreshing activation transfer paths 150 and 152, the operation time is halved. In other words, internal refresh instruction AREF is issued concurrently onto refresh activation transfer paths 150 and 152. Therefore, in this case, refreshing operations are carried out in lower memory block LM and in upper memory block UM. In the case in which refreshing is skipped, the count of skip counter 154 or 156 is incremented, and internal refresh instruction AREF is repeatedly issued in the same manner as the first embodiment until refreshing is carried out on the skipped memory sub-block.

For example, in lower memory block LB, in the case when refreshing is carried out in accordance with a refresh address RFAD with refreshing being skipped in upper memory block UB, refresh skip flag (indication signal) RFSKL in skip counter 154 is in the de-asserted state, while refresh skip flag RFSKU outputted by skip counter 156 is in the asserted state. In this state, refresh skip RFSKP of OR circuit 158 attains the asserted state, and refresh activation unit 160 again transfers internal refresh instruction AREF concurrently onto refresh activation transfer paths 150 and 152 in the same manner as the construction of the first embodiment.

In this re-transferring of refresh instruction, refreshing might be carried out in another memory sub-block in lower memory block LB in accordance with the same refresh address RFAD. In this case, the numbers of refresh executing times are different between lower memory block LB and upper memory block UB. Therefore, complicated controlling processing may be required as to the generation timing of all block refresh completion signal ALBRFC, that is, as to the updating of refresh addresses.

In the re-transferring operation for skipping refresh instruction, internal refresh instruction AREF is issued only to the memory block having the refreshing skipped in accordance with refresh skip flag RFSKL and RFSKU from skip counters 154 and 156. Specifically, when refresh skip flag RFSKL is in the L level and refresh skip flag RFSKU is set in the H level, internal refresh instruction AREF is transferred only to upper block UB, and internal refresh instruction AREF is kept in the de-asserted state for lower block LB. In contrast, when refreshing is carried out in upper block UB and refreshing is skipped in lower block LB, internal refresh instruction AREF for upper block UB is maintained in the de-asserted state, and refresh instruction AREF for lower block LB is maintained in the asserted state.

In order to achieve the above-mentioned construction, a gate circuit is provided for the lower block LB, which maintains internal refresh instruction AREF in the de-asserted state when refresh skip flag RFSKL is in the L level and refresh skip flag RFSKU is set in the H level. For upper block UB, a gate circuit is provided, which maintains internal refresh instruction AREF in the de-asserted state when refresh skip flag RFSKU is in the L level and refresh skip flag RFSKL is set in the H level. In the case when both of refresh skip flags RFSKU and RFSKL are set in the H level or both of them are set in the L level, these gate circuits transfer internal refresh instruction AREF applied from the refresh activation unit to the corresponding refresh activation transfer paths.

As for a specific construction of the above-mentioned construction, a first AND circuit receiving an inversion signal of refresh skip flag RFSKU and refresh skip flag RFSKL and a second AND circuit receiving the output signal of the first AND circuit and internal refresh instruction AREF are arranged, for example, as gate circuits for lower block LB.

In place of the above-mentioned construction, the following construction may be used. Specifically, in the case in which refreshing is skipped in upper block UB with refreshing being carried out in lower block LB, refresh instruction AREF is again issued. In this case, refreshing is executed in the next memory sub-block also in lower block LB. After refreshing is carried out in all the memory sub-blocks in lower block LB, a lower block refresh completion flag is asserted. In the case when lower block refresh completion flag is asserted and refreshing is not completed with respect to upper block, the issuance of internal refresh instruction AREF to lower block LB is stopped.

When refreshing is completed in the upper block, upper block refresh completion flag is asserted. When both of these upper block refresh completion flag and lower block refresh completion flag are asserted, the refresh address is updated, and upper and lower block refresh completion flags are de-asserted.

Therefore, in the case of this construction, although refreshing timing is the same, the refreshing operation is allowed to individually proceed in each of upper block UB and lower block.

This construction is achieved by arranging counters for counting the numbers of times of internal refresh issuance respectively in upper block UB and lower block LB and stopping the counting operations of these counters when the corresponding refresh skip flags attain the asserted state. When the count reaches the number of memory sub-blocks of the corresponding block, block refresh completion flag is asserted. When both of upper and lower block refresh completion flags are asserted, refresh skip flag RFSKP is de-asserted, and the refresh address is updated when all block refresh completion flag is raised.

In any of the above-mentioned constructions, upon completion of refreshing in memory sub-blocks in upper block UB and lower block LB, refresh skip flag RFSKP is set to the de-asserted state, and in the refresh activation unit 160, all block refresh completion signal ALBRFC is activated, and the count of the refresh word line counter is incremented by one so that the next refresh address is generated.

In the case of the construction shown in FIG. 37, refreshing operations are concurrently carried out in upper block UB and lower block LB. Therefore, in comparison with the construction in which memory sub-blocks are refreshed one by one, it is possible to halve the refresh cycle time tRAFmax, and consequently to hold data more reliably.

Moreover, in the case in which refreshing is skipped in one block and refreshing is stopped on the other block until refreshing is completed on the skipped memory sub-block, internal refresh instruction AREF is repeatedly issued when data accessing is made during refresh skipping, and therefore, the refreshing operation is carried out in the skipped memory sub-block in a period shorter than the refreshing interval, thereby making it possible to prevent prolongation of the refreshing interval of the skipped memory sub-block.

As described above, in accordance with the second embodiment of the present invention, the memory block is divided into two blocks, and internal refresh instruction is issued to upper block and lower block in parallel with each other so as to carry out refreshing operations. Therefore, the refreshing is simultaneously carried out in a plurality of memory sub-blocks to that it becomes possible to shorten the refresh cycle time, and consequently to greatly improve the holding characteristic of memory cell storage data.

Third Embodiment

Figure 38:
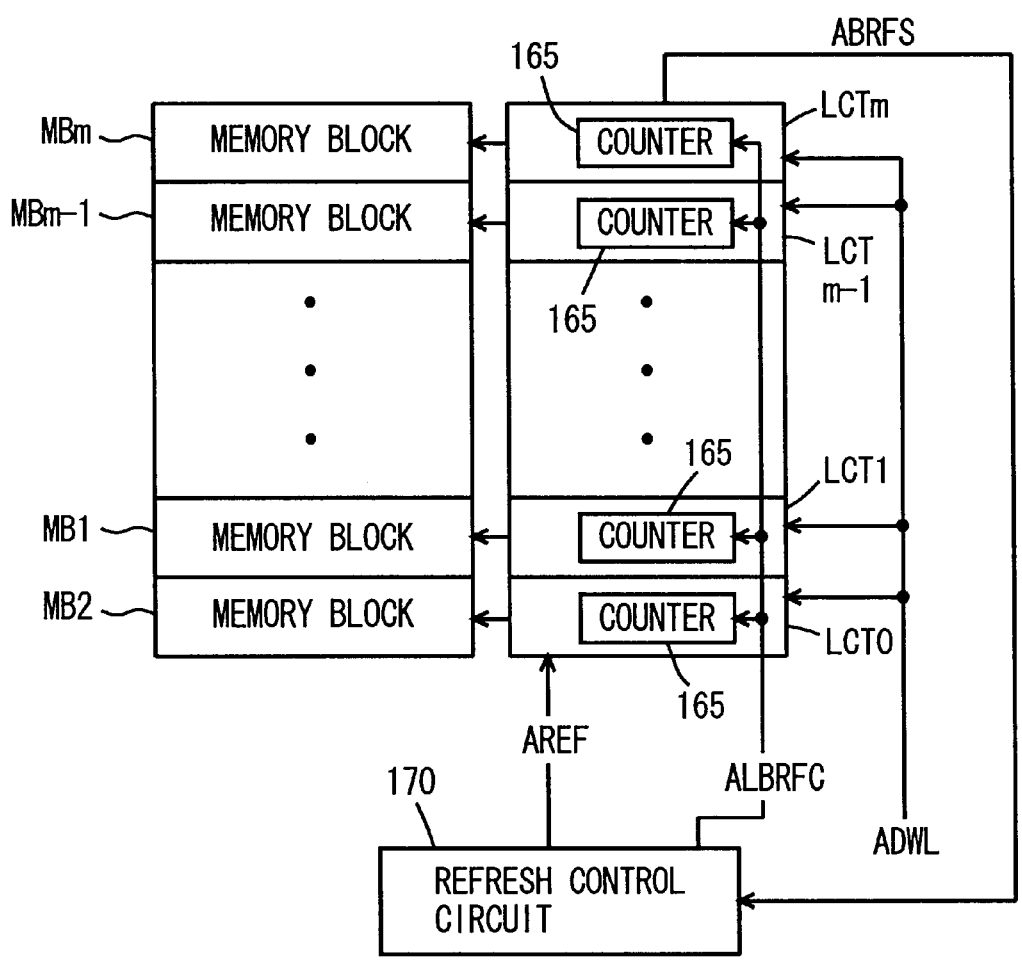
FIG. 38 is a drawing that schematically shows the construction of a main part of a semiconductor memory device in accordance with a third embodiment of the present invention.

FIG. 38 is a drawing that schematically shows the construction of a main part of a semiconductor memory device in accordance with a third embodiment of the present invention. In FIG. 38, in local control circuits LCT0–LTCm arranged corresponding to memory sub-blocks MB0–MBm, counters 165 for generating refresh addresses are provided. These counters 165 individually and independently execute counting operations to generate refresh addresses. In each of memory sub-blocks MB0–MBm, normal word lines and a spare word line are arranged. This counter 165 generates a normal word line refresh address for specifying a normal word line as well as a spare word line refresh address for specifying a spare word line.

Internal refresh instruction AREF is issued from refresh control circuit 170 arranged in the main control circuit to local control circuits LCT0–LCTm so that refreshing operation is carried out in are fresh executable memory block. Refresh skip instruction signal ABRFS is returned to refresh control circuit 170 through local control circuit LCTm.

Refresh control circuit 170 has the same construction as the construction (see FIG. 7) shown in the first embodiment, and refresh skip instruction signal ABRFS corresponding to the returned internal refresh instruction is counted, and based upon the count of the skip counter, determination is made as to whether or not refreshing is skipped in any memory sub-block, and in accordance with the results of determination, internal refresh instruction AREF is issued. The sequence of issuing internal refresh instruction AREF upon refresh skipping is the same as that of the first embodiment.

In this refresh control circuit 170, when refreshing is carried out on all the word lines once in memory sub-blocks MB0–MBm, all block refresh completion instruction signal ALBRFC is issued so that the count of counters 165 in local control circuits LCT0–LCTm are reset to the initial value.

Figure 39:
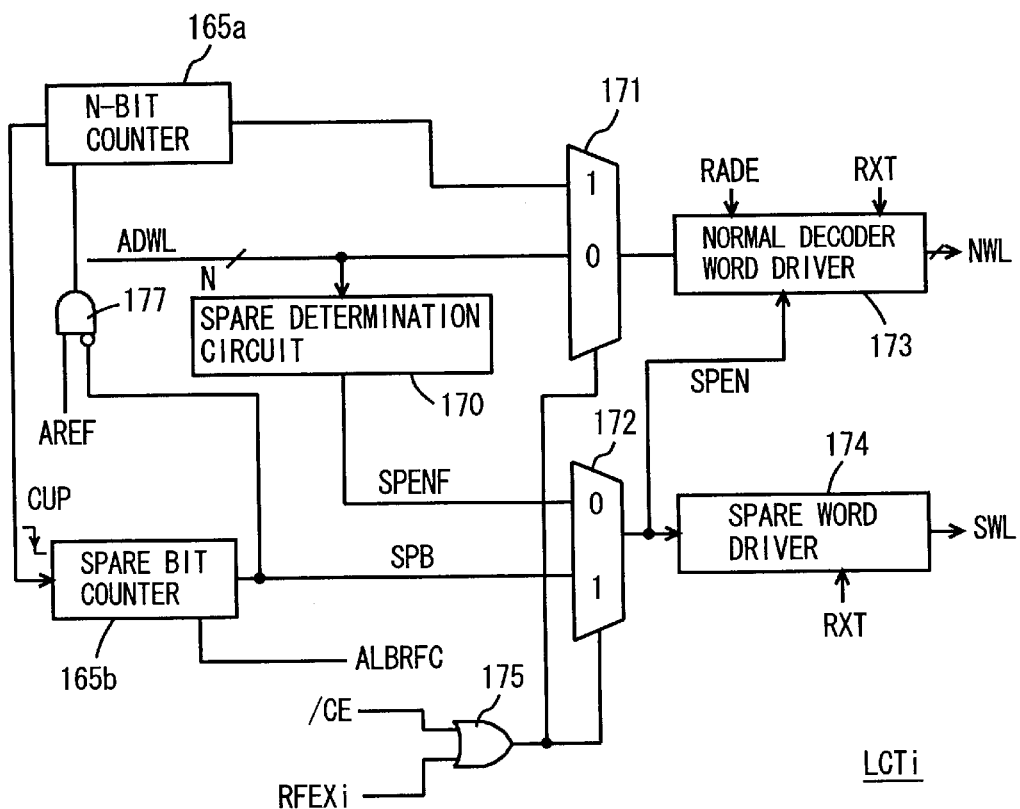
FIG. 39 is a drawing that schematically shows the construction of a main part of a local control circuit shown in FIG. 38.

FIG. 39 is a drawing that schematically shows the construction of a part related to word line addresses in local control circuit LCTi. In the construction shown in FIG. 39, one spare word line SWL is arranged.

In FIG. 39, counter 165 includes an N-bit counter 165$a$ for generating a word line address signal and a spare bit counter 165$b$ that increments its count by one in response to count-up signal CUP of the N-bit counter 165$a$. The spare bit counter 165$b$ is a one-bit counter, and when its count is "1", spare word line SWL is specified. The N-bit counter 165$a$ increments its count by one upon completion of refreshing in accordance with refresh instruction AREF. Spare bit counter 165$b$ has its count reset to the initial value upon activation of all block refresh completion instruction signal ALBRFC.

Local control circuit LCTi further includes: a spare determination circuit 170 for determining whether or not externally applied word line address signal ADWL specifies a defective normal word line; a multiplexer 171 for selecting one of the count of N-bit counter 165$a$ and externally applied word line address signal ADWL; a multiplexer 172 for selecting one of spare determination signal SPENF of spare determination circuit 170 and the count of spare bit counter 165$b$ to generate spare enable signal SPEN; a normal decoder/word driver 173 that, upon inactivation of spare enable signal SPEN from multiplexer 172, decodes an address signal applied from multiplexer 171 to drive the addressed normal word line NWL to the selected state; and a spare word driver 174 that, upon activation of spare enable signal SPEN from multiplexer 172, drives spare word line SWL to the selected state.

Externally applied word line address signal ADWL is an N-bit address signal. In inactivation of spare enable signal SPEN, normal decoder/word driver 173 drives the addressed normal word line NWL to the selected state in accordance with row address decode enable signal RADE from a local row related control circuit, not shown, and word line drive timing signal RXT. Here, this normal decoder/word driver 173 is inactivated upon activation of spare enable signal SREN to indicate that the addressed normal word line is a word line corresponding to a defective address, and does not carry out a driving of the addressed normal word line to the selected state.

Upon activation of spare enable signal SPEN, spare word driver 174 drives spare word line SWL to the selected state in accordance with word line driving timing signal RXT.

The multiplexers 171 and 172 are controlled in connecting path by the output signal of an OR circuit 175 receiving chip enable signal /CE and refresh execution block instruction signal RFEXi. Refresh execution block instruction signal RFEXi is generated by not shown local row related control circuit in the manner as described in the first embodiment, and when refreshing is carried out in the corresponding memory sub-block, refresh execution block instruction signal RFEXi is activated.

Therefore, multiplexers 171 and 172 select the output counts of N-bit counter 165$a$ and spare bit counter 165$b$, respectively, in the case when chip enable signal /CE is in the stand-by state and refresh execution block instruction signal RFEXi is in the activated state or at H level.

Spare determination circuit 170 is constituted by, for example, a fuse program circuit, and drives spare determination signal SPENF to the activated state when externally applied address signal ADWL specifies a defective normal word line.

Gate circuit 177 outputs a signal of the L level when output count SPB of spare bit counter 165$b$ is in the H level, so that internal refresh instruction AREF to N-bit counter 165$a$ is maintained in the de-asserted state. When the output signal of gate circuit 177 attains the H-level, N-bit counter 165$a$ updates the count value in accordance with refresh instruction AREF when the refreshing completes. Here, the N-bit counter 165$a$ may have an arrangement in which, when internal refresh instruction AREF is applied, it updates the count to generate a refresh address in the current refresh cycle.

Figure 40:
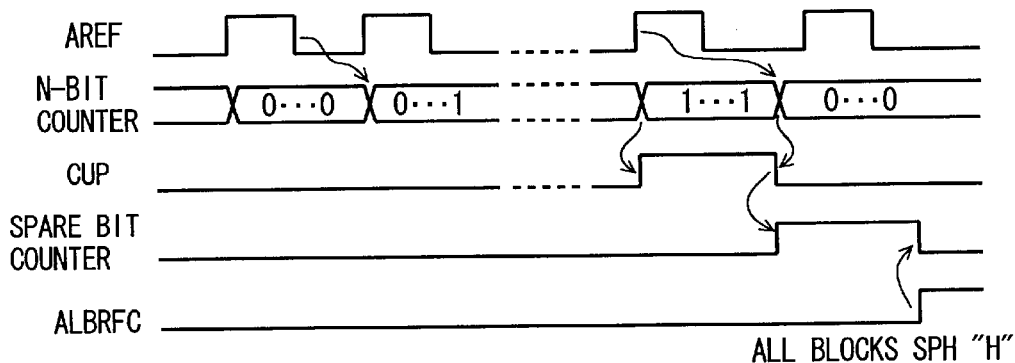
FIG. 40 is a timing chart that represents a counting operation of a counter shown in FIG. 39.

Here, upon receipt of all block refresh completion instruction signal ARBRFC, spare bit counter 165$b$ has its count SPB reset. This is activated at a predetermined timing after issuance of refresh instruction AREF when count SPB of spare bit counter 165$b$ is asserted in all the memory sub-blocks. Specifically, upon completion of refreshing of spare word lines in all the memory sub-blocks, all block refresh completion instruction signal ARBRFC is issued from the main control circuit. However, in each memory sub-block, accepted refresh instruction AREF is counted by N-bit counter and the count thereof reaches the maximum value, and then the count returns to the initial value at the time of the next counting. Therefore, it is not particularly necessary to issue all block refresh completion instruction signal ARBRFC from the main control circuit. Now, referring to a timing chart shown in FIG. 40, a description will be given of the operations of N-bit counter 165$a$ and spare bit counter 165$b$, shown in FIG. 39.

When output count SPB of spare bit counter 165$b$ is in the L level, N-bit counter 165$a$ carries out the counting operation in accordance with taken-in internal refresh instruction AREF. Therefore, each time internal refresh instruction AREF is accepted and refreshing is carried out, the count of N-bit counter 165$a$ is incremented by one, starting from the initial value (0 . . . 0).

When the output count of this N-bit counter 165$a$ reaches the maximum value (1 . . . 1), count-up signal CUP is set to the H level. In this state, when refresh instruction AREF is again taken in, the count of N-bit counter 165$a$ is returned to the initial value (0 . . . 0), and count-up signal CUP goes down to the L level. In response to the fall of the count-up signal, spare bit counter 165$b$ carries out the counting operation so that the output count SPB is raised to the H level.

During the refreshing operation, multiplexer 172 selects count SPB of spare bit counter 165$b$ and spare enable signal SPEN is in the activated state so that the word line selecting operation of normal decoder/word driver 173 is inhibited.

Moreover, in the refreshing operation of the spare word line, the output signal of gate circuit 177 is forced to the L level, and N-bit counter 165$a$ does not carry out the counting operation. Therefore, even when internal refresh instruction AREF is applied to refresh the spare word line, N-bit counter 165$a$ maintains its count in the initial value.

Therefore, in accordance with output count SPB of spare bit counter 165$b$, the spare word driver 174 is operated so that spare word line SWL is driven to the selected state.

Upon completion of refreshing of the spare word line, the issuance of all block refresh completion instruction signal ALBRFC is suspended until refreshing is completed on spare word lines in all the memory sub-blocks. This is done so as to make the refresh cycle equal in each memory sub-block.

Upon completion of refreshing on spare word lines in all the memory sub-blocks, all block refresh completion instruction signal ARBRFC is issued, and spare bit counter 165a is reset so that output count SPB thereof is set to the L level. Here, N-bit counter 165a is maintained at the initial value (0 . . . 0). Therefore, when the next internal refresh instruction AREF is taken in, in accordance with the output count of this N-bit counter 165a, refreshing is executed on a normal word line.

With respect to this construction in which refreshing is suspended until refreshing is completed on all the word lines in memory sub-blocks and all block refresh completion instruction signal ARBRFC is issued, a construction in which, when refreshing is completed with output count SPB of spare bit counter 165b being set to the H level, refresh completion instruction RFCOM of memory sub-blocks is activated can be used. A specific arrangement can be provided by the following construction. A flip-flop, set when refresh pre-charge activation signal RFPRC is taken in and local refresh activation signal RFPRCL is activated when count SPB is set in the H level, is used to generate refresh completion instruction RFCOM, Such configuration is arranged in the local control circuit to achieve the intended construction.

Figure 41:
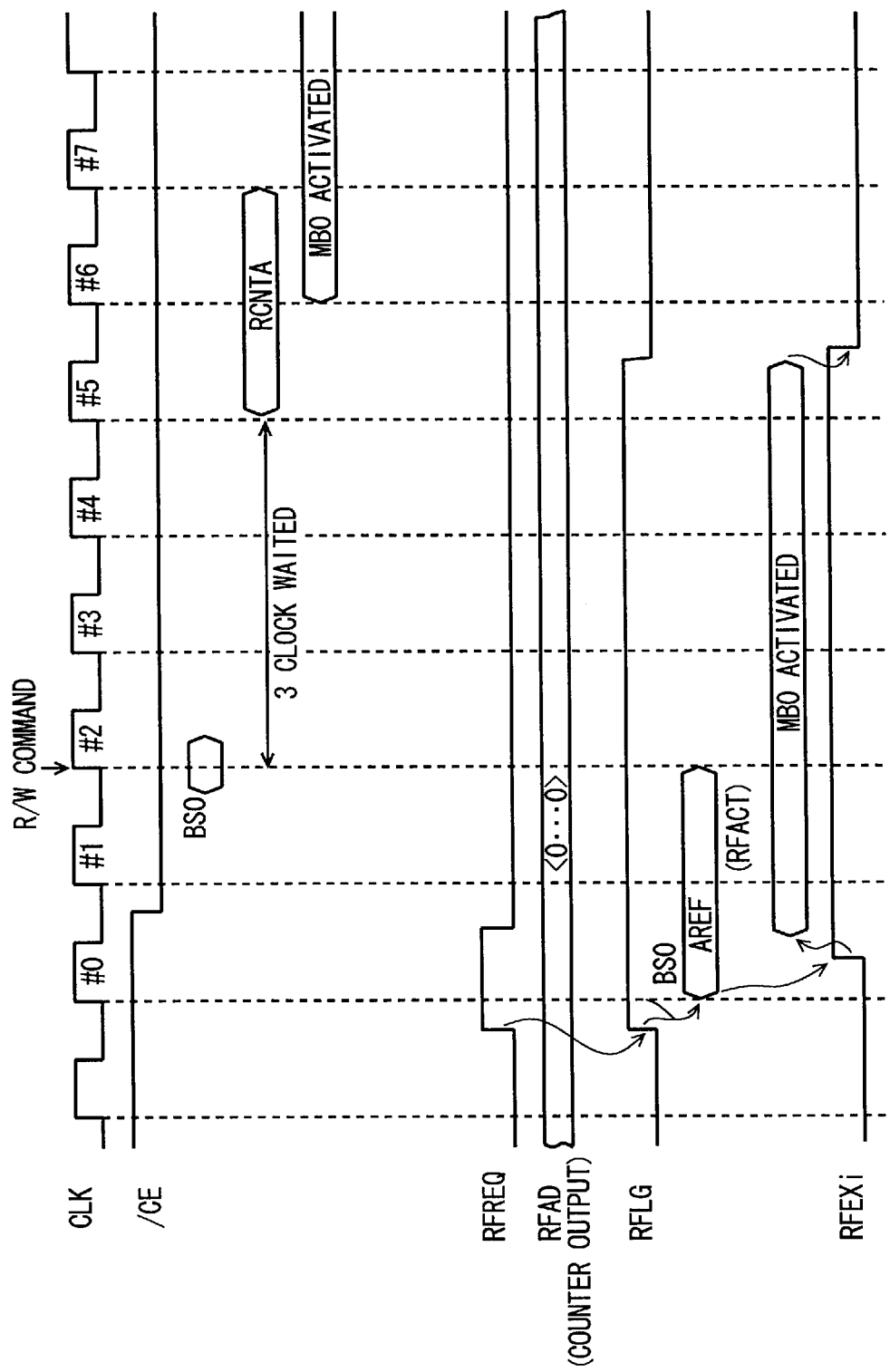
FIG. 41 is a timing chart that represents an operation of a semiconductor memory device in accordance with a modification of the third embodiment of the present invention.

FIG. 41 is a drawing that shows an example of a refresh execution sequence of the semiconductor memory device shown in FIGS. 38 and 39. In FIG. 41, in clock cycle #0, refresh request RFREQ is issued at the rising edge of clock signal CLK, and refresh flag RFLG is asserted to the H level. At this time, chip enable signal /CE is in the H level. Therefore, as shown in FIG. 39, multiplexers 171 and 172 select and supply the output count of N-bit counter 165a and spare bit counter 165b, respectively, to normal decoder/word driver 173 and spare word driver 174. Therefore, no spare determination is carried out by spare determination circuit 170 in this refreshing with the address signal having been in a definite state. In this clock cycle #0, internal refresh instruction AREF (refresh activation signal RFACT) is issued in synchronization with the rising edge of clock signal CLK.

In clock cycle #1, chip enable signal /CE goes down to the L level, and in the next clock cycle #2, normal access instruction R/W is issued, and the same memory block MB0 under refreshing is specified by block selection signal BS0. In this state, since there is a conflict between refreshing and normal accessing, the normal accessing operation is suspended for 3 clock cycles. Therefore, from clock cycle #0 to clock cycle #5, refreshing is carried out in memory block MB0, and in clock cycle #5, refresh flag RFLG is set to the inactivated state. Thus, after refreshing is completed in memory block MB0, main row activation signal RCNTA is issued from the control circuit so that an accessing operation is carried out on memory block MB0.

At this time, since, upon completion of refreshing, refresh execution block instruction signal RFEXi is set to the L level and the output of OR circuit 175 attains the L level, multiplexers 171 and 172 select the output signal of spare determination circuit 170 and externally applied address signal ADWL. In accordance with the externally applied address signal ADWL, the row selecting operation is carried out in memory block MB0.

In the operation sequence shown in FIG. 41, chip enable signal /CE is defined in its specification such that it should be set in the activated state of the L level 1 clock cycle before the issuance of data access command (R/W command). However, in the case in which the chip enable signal /CE is defined in its specification such that it should be inputted 4 clock cycles before the cycle in which data access command is inputted, no delay occurs in normal accessing.

Refresh counters are respectively arranged in local control circuits LCT0–LCTm, and during the refreshing cycle, the output signal of refresh address counter 165 is supplied to normal decoder/word driver 173 and spare ward driver 174. According to such arrangement, it is not necessary to carry out a redundancy determination in the decoding operation, and it becomes possible to save the time required for this redundancy determination in the decoding time period. In addition, it is possible to set the timing for activating memory block MBk faster, for example, by half a clock cycle, because of no necessity of transferring the refresh address signal from the central control circuit.

In other words, when main row activation signal RCNTA is applied in a normal accessing, a spare determination is made by spare determination circuit 170 by using the current word line address signal, and a row selecting operation is then carried out. Therefore, as shown in FIG. 41, when refresh request RFREQ is issued while chip enable signal /CE is in the de-asserted state, internal refresh instruction AREF is issued faster by half the clock cycle as compared to the case in which chip enable signal /CE is in the asserted state, that is, in response to the rise of clock signal CLK, thereby allowing the refresh start timing to advance by half a clock cycle.

Moreover, in the de-asserted state of chip enable signal /CE, since the row selection start timing for refreshing is made faster by half the clock cycle as compared with the normal accessing time. Therefore, the refresh cycle period is made shorter by the total of one clock cycle, thereby making it possible to shorten the waiting time period of an external processor by one clock cycle.

Figure 42:
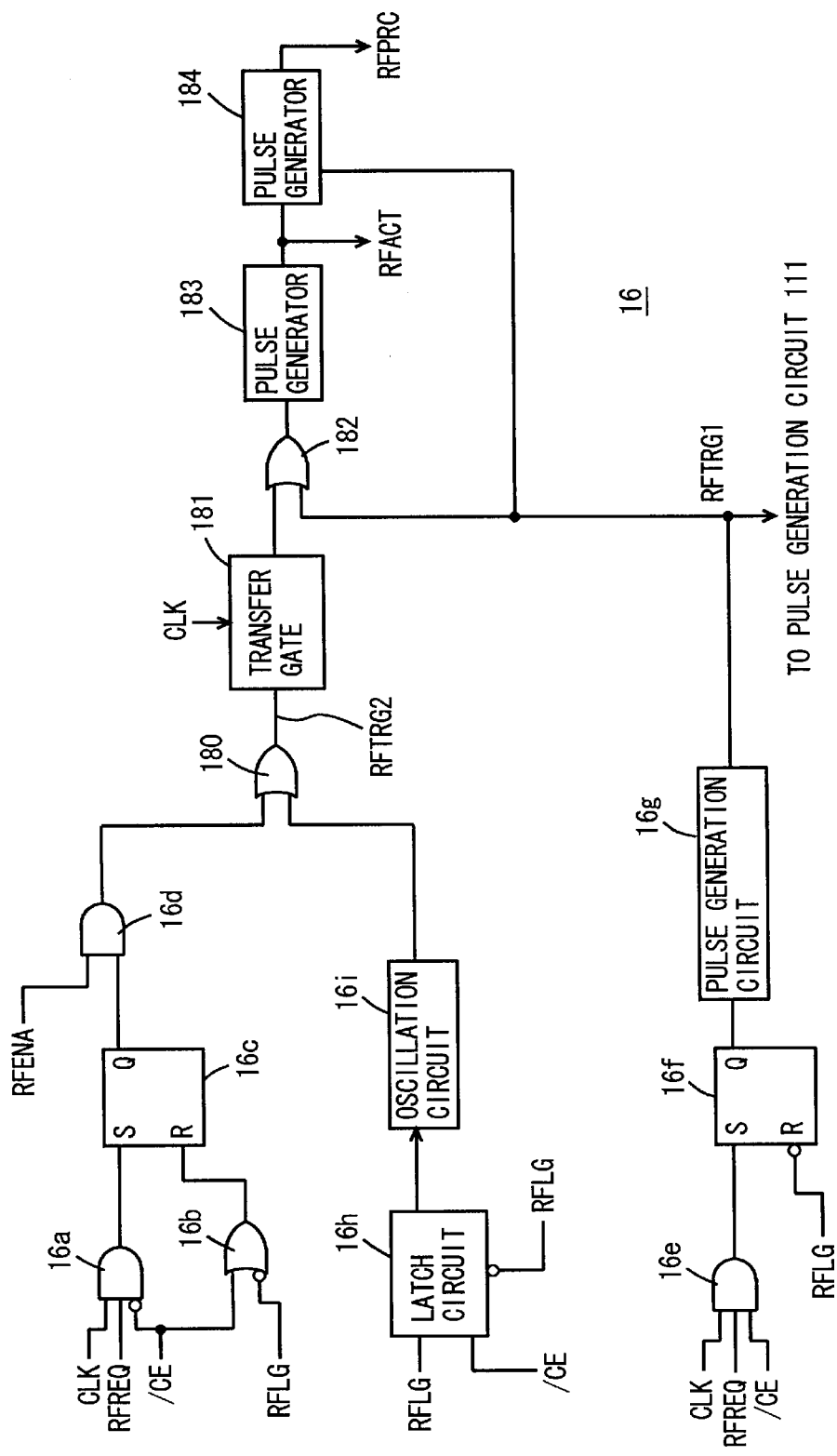
FIG. 42 is a drawing that schematically shows the construction of a refresh instruction generation circuit in accordance with the modification of the third embodiment of the present invention.

FIG. 42 is a drawing that schematically shows an example of the construction of a refresh instruction generation circuit in accordance with the third embodiment of the present invention. The construction of refresh instruction signal generation circuit 16 shown in FIG. 42 corresponds to the construction of the refresh instruction signal generation circuit shown in FIG. 19. Therefore, those parts corresponding to the components of the refresh instruction signal generation circuit shown in FIG. 19 are indicated by the same reference numerals, and the detailed description thereof is not repeated.

In the construction of the refresh instruction generation circuit 16 shown in FIG. 42, in order to advance the refresh start timing in the case when a refresh request is issued during activation of chip enable signal /CE, an output signal RFTRG1 of a pulse generation circuit 16g is applied to a pulse generator 183 through an OR circuit 182. The output signals of AND circuit 16d and oscillation circuit 16i are applied to a transfer gate 181 through an OR circuit 180.

The transfer gate 181, which has a construction similar to transfer circuit 70 shown in FIG. 22, takes in output signal RFTRG2 of OR circuit 180 when clock signal CLK is in the H level, and transfers the taken in refresh trigger signal RFTRG2 to OR circuit 182 when clock signal CLK attains the L level.

The output signal of OR circuit 182 is supplied to pulse generator 183. Refresh activation signal RFACT is outputted from pulse generator 183. After a lapse of a predetermined period of time since the generation of this refresh activation signal RFACT, refresh pre-charge instruction signal RFPRC is generated from pulse generator 184.

Refresh trigger signal RFTRG1 is also applied to this pulse generator 184. When this refresh trigger signal RFTRG1 is activated, pulse generator 184 advances the issuance timing of refresh pre-charge activation signal RFPRC by half the clock cycle. This is done for the following reason. When refresh activation signal RFACT is issued half the clock cycle faster, the local row related control circuit carries out the row selecting operation half the clock cycle faster. Therefore, it is needed to adapt to the timing advance by half the clock cycle to maintain the refresh cycle time constant.

The refresh trigger signal RFTRG1 is also supplied to pulse generation circuit 111 for generating row related control signals in local row related control circuit. When refresh trigger signal RFTRG1 is activated, pulse generation circuit 111 advances the row selection start timing by, for example, half the clock cycle when array activation signal ACT is activated. Since it is not necessary to carry out a redundancy determination and the like, it is possible to make the row selection start earlier when refresh trigger signal RFTRG1 is activated.

With the arrangement shown in FIG. 42, it becomes possible to provide the following operations. In the case when refresh request RFREQ is issued while chip enable signal /CE is in the H level, pulse generator 183 issues refresh activation signal RFACT in response to the rise of clock signal CLK. In the activated state of refresh trigger signal RFTRG1, pulse generator 184 issues refresh pre-charge activation signal RFPRC with its delay time made shorter by half the cycle after the generation of refresh activation signal RFACT.

In the case when refresh trigger signal RFTRG1 is activated, by shortening the period from the activation of array activation signal ACT to the row selection start by, for example, half the clock cycle, it is possible to make the array activation period in refreshing equal to that in the inactivated state of refresh trigger signal RFTRG1, and consequently refreshing can be more reliably.

With respect to a construction for making the row selecting start faster in the activated state of refresh trigger signal RFTRG1, for example, the following construction can be utilized. After a lapse of a predetermined period since array activation signal ACT is activated, row related control signals RADE, RTX, SAE and others are activated in a predetermined sequence by utilizing delay circuits and others. The number of stages of a delay circuit for delaying the activation of the row related control signal that is first activated among these row related control signals is changed by refresh trigger signal RFTRG1. Specifically, in the case when refresh trigger signal RFTRG1 is in the activated state, the number of the delay stages is reduced.

Alternatively, in the case when, upon activation of array activation signal, refresh trigger signal RFTRG1 is in the activated state, the activation of row related control signal is advanced half the clock cycle of clock signal. In this arrangement, a transfer circuit, which delays the trigger signal to first activated row related control signal by half the clock in accordance with the clock signal, is used, and in accordance with refresh trigger signal RFTRG1, one of the output signal of this transfer circuit and the trigger signal that is first activated among row related control signals is selected. The row related control signals are activated in a predetermined sequence in accordance with the selected trigger signal.

FIG. 43 is a drawing that schematically shows an example of the construction of a pulse generator 184 shown in FIG. 42. In FIG. 43, pulse generator 184 includes: a pulse generation circuit 184a for generating a one-shot pulse signal in response to the activation of refresh activation signal RFACT; a delay circuit 184b for delaying an output signal of pulse generation circuit 184a by a predetermined period of time; a half cycle delay circuit 184c for delaying the output signal of delay circuit 184b by half the cycle period of clock signal CLK; a set/reset flip-flop 184d which is reset in response to the activation of output signal RFTRG1 of pulse generation circuit 16g shown in FIG. 42, and reset in response to the inactivation of refresh flag RFLG; and a multiplexer 184e which selects one of the output signals of delay circuit 184b and half cycle delay circuit 184c to generate refresh pre-charge activation signal RFPRC in accordance with a signal from output Q of set/reset flip-flop 184d.

Delay circuit 184c may be constituted by a transfer gate carrying out a delay operation for a predetermined clock cycle period in synchronization with clock signal CLK. Half cycle delay circuit 184c has a logical level of the triggering signal for the transferring operation determined depending on whether the activation timing of refresh pre-charge activation signal RFPRC is at the rising edge of clock signal CLK or the falling edge thereof.

When output signal RFTRG1 of pulse generation circuit 16g shown in FIG. 42 is activated, set/reset flip-flop 184d is set, and multiplexer 184e selects the output signal of delay circuit 184b. Upon activation of this signal RFTRG1, refresh activation signal RFACT is activated half the clock cycle faster (by OR circuit 182 of FIG. 32). Therefore, pulse generation circuit 184a and delay circuit 184b activate their output signals half the clock cycle period of clock signal CLK faster.

In this state, multiplexer 184e selects the output signal of delay circuit 184b, and refresh pre-charge activation signal RFPRC is activated faster by half the clock cycle than the activation in the refreshing operation in the asserted state of chip enable signal /CE. By utilizing the construction in which delay circuits 184b and 184c complementarily carry out transferring operations in synchronization with clock signal CLK, it is possible to generate refresh pre-charge activation signal RFPRC accurately in synchronization with the clock signal.

Refresh activation signal RFACT is activated faster by half the clock cycle, and the output signal of delay circuit 184b is selected by multiplexer 184e. Thus, refresh pre-charge activation signal RFPRC is activated faster by half the clock cycle, and thus, the pre-charge operation is started faster by one clock cycle in total.

In the case in which refreshing is carried out in the de-asserted state of chip enable signal /CE, refresh pre-charge activation signal RFPRC is activated faster by one clock cycle period so that array activation signal ACT is also inactivated faster by one clock cycle period. The refreshing period of time is the same as that in the refreshing performed in the asserted state of chip enable signal /CE. Thus, in the refreshing in the de-asserted state of chip enable signal /CE, it becomes possible to make the internal refresh start timing advanced by one clock cycle.

With respect to a circuit for generating data output delay prediction signal WAIT externally, in place of 4-cycle delay circuits 84 and 94 shown in FIGS. 24 and 25, 3-cycle delay circuits may be adopted.

In the case in which it is defined in the specification that chip enable signal /CE should be asserted 3 clock cycles before data accessing, no delay occurs in normal accessing so that it is not necessary to externally issue data output delay prediction signal.

Modification

Figure 44:
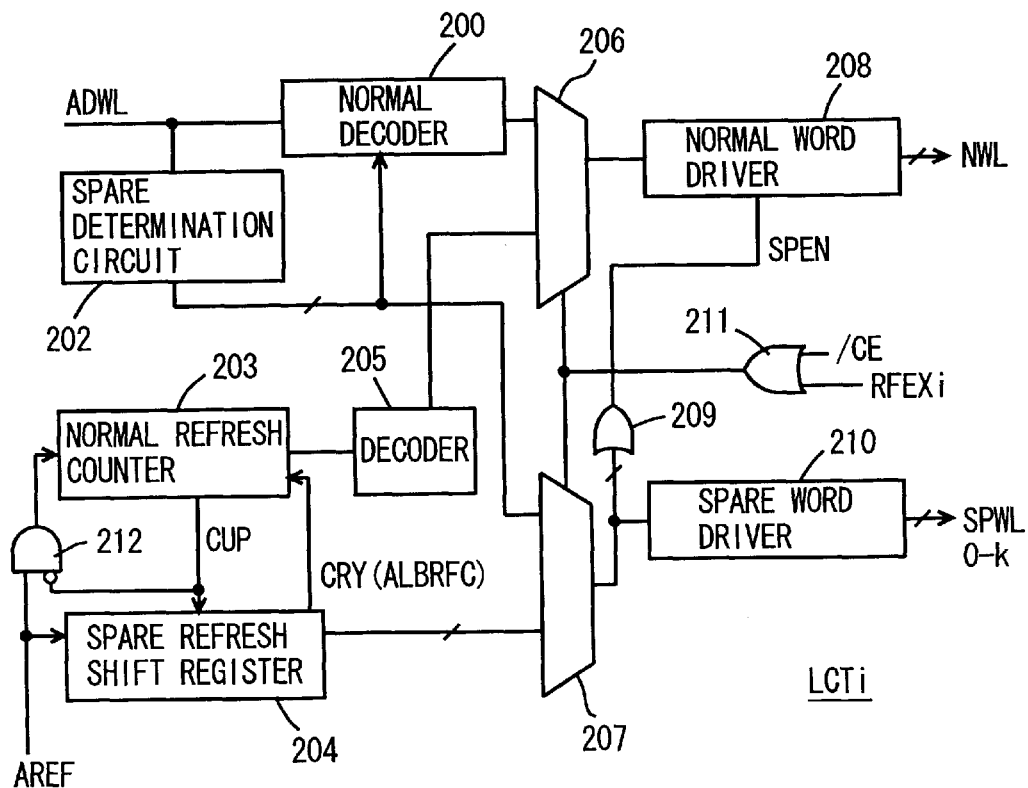
FIG. 44 is a drawing that schematically shows the construction of another modification of the third embodiment of the present invention.

FIG. 44 is a drawing that schematically shows a construction of a modification of the third embodiment in accordance with the present invention. In FIG. 44, a plurality of spare word lines are arranged.

In FIG. 44, a spare determination circuit 202, which determines whether or not a defective address is specified based upon externally applied address signal ADWL and programmed defective address, includes spare determination circuits that are arranged corresponding to a plurality of spare word lines SPWL0–SPWLk and outputs a spare determination result signal of a plurality of bits. This spare determination result signal corresponds to each of spare word lines SPWL0–SPWL3.

A word line selection unit includes: a normal decoder 200 for decoding an externally applied address signal ADWL; a normal refresh counter 203 for generating a refresh word line address; a spare refresh shift register 204 for generating a spare refresh address specifying a spare word line in refreshing operation; a decoder 205 for decoding the output signal of normal refresh counter 203; a multiplexer 206 for selecting one of the output signal of normal decoder 200 and the output signal of decoder 205 in accordance with the output signal of an OR circuit 211 receiving chip enable signal /CE and refresh execution block instruction signal RFEXi; a multiplexer 207 for selecting one of a multi-bit spare determination signal of spare determination circuit 202 and the output signal of spare refresh shift register 204 in accordance with the output signal of OR circuit 211; an OR circuit 209 which takes a logical sum of output signals of multiplexer 207 to generate spare enable signal SPEN; a normal word driver 208 for driving an addressed normal word line NWL to the selected state in accordance with the output signal of multiplexer 206; and a spare word driver 210 for driving one of spare word lines SPWL0–SPWLk to the selected state in accordance with the spare address signal supplied from multiplexer 207.

Normal word driver 208 has its word line selecting operation stopped upon activation of spare enable signal SPEN from OR circuit 209.

Normal refresh counter 203 carries out a counting operation in accordance with a count-up signal CUP of its own and the output signal of gate circuit 212 receiving taken in refresh instruction AREF and generates an address signal for specifying a normal word line NWL to be refreshed. Decoder 205 decodes the output count of this normal refresh counter 203 to generate a word line selection signal for specifying a normal word line.

Spare refresh shift register 204 has output nodes corresponding to respective spare word lines SPWL0–SPWLk, and carries out a counting operation (shifting operation) in accordance with taken in refresh instruction AREF upon activation of count-up signal CUP of normal refresh counter 203 and successively specifies the spare word lines. Normal refresh counter 203 is reset in accordance with carry CRY of this spare refresh shift register 204.

Gate circuit 212 counts refresh instruction AREF taken in when count-up signal CUP of this normal refresh counter 203 is in the L level and generates a refresh word line address signal for specifying a normal word line.

Figure 45:
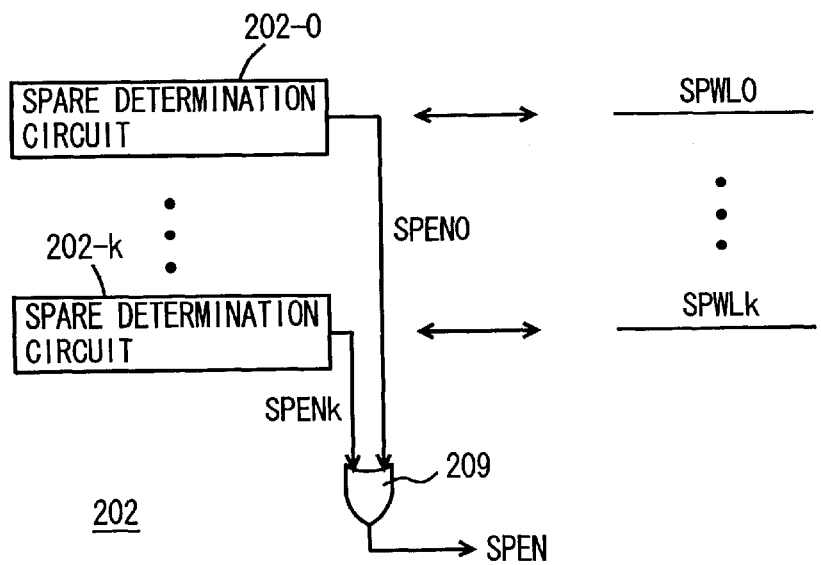
FIG. 45 is a drawing that schematically shows the correspondence relationship to a spare word line of a spare determination circuit shown in FIG. 44.

FIG. 45 is a drawing that specifically shows the construction of this spare determination circuit 202. As shown in FIG. 45, in spare determination circuit 202, spare determination circuits 202-0 to 202-k are arranged corresponding to spare word lines SPWL0–SPWLk. These spare determination circuits 202-0 to 202-k compare externally applied word line address signal ADWL with associated programmed defective addresses as to coincidence/non-coincidence, and in the case of coincidence, drive the corresponding spare determination result signals SPEN0–SPENk to the selected state. In the normal operation mode, OR circuit 209 activates spare enable signal SPEN in accordance with logical sum of spare determination result signals SPEN0–SPENk.

Spare determination result signals SPEN0–SPENk are respectively transferred to spare word drive circuits provided corresponding to spare word lines SPWL0–SPWLk so that a addressed spare word line is driven to the selected state.

Figure 46:
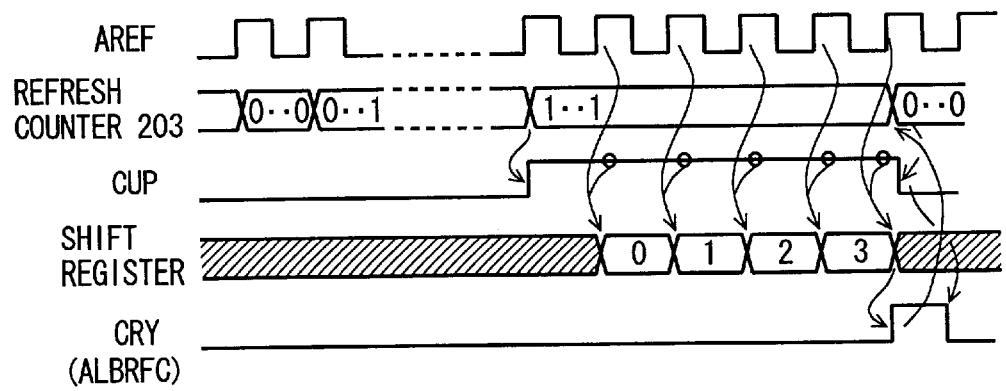
FIG. 46 is a timing chart that represents an operation of an address switching unit shown in FIG. 44.

FIG. 46 is a timing chart representing the operations of normal refresh counter 203 and spare refresh shift register 204, shown in FIG. 44. FIG. 46 represents the operation sequence in a case in which 4 spare word lines SPWL0–SPWL3 are arranged, as an example of the operation.

Each time internal refresh instruction AREF is taken in, refresh counter 203 carries out a counting operation, and increments the count by one successively from the initial value (0 . . . 0). Since count-up signal CUP is in the L level, spare refresh shift register 204 does not carry out the counting operation (shifting operation), and maintains this initial state with all the outputs being set to the non-selected state of the L level.

When the count of refresh counter 203 reaches the maximum value (1 . . . 1), the count-up instruction signal CUP is set to the H level. When the refreshing operation is completed in accordance with the count (1 . . . 1) of refresh counter 203, shift register 204 carries out a shifting operation in accordance with the next internal refresh instruction AREF and drives an output node for specifying spare word line SPWL0 to the asserted state. The output signal of gate circuit 212 is in the L level, and refresh counter 203 maintains the maximum count (1 . . . 1).

In refreshing of spare word line SPWL0, spare enable signal SPEN is activated and normal word driver 208 is maintained in the non-active state. Thus, the corresponding normal word line NWL is maintained in the non-selected state. Thereafter, each time shift register 204 takes in internal refresh instruction AREF, it carries out a shifting operation so that spare word lines SPWL1–SPWL3 are successively specified.

When spare word line SPWL3 is refreshed, carry CRY is outputted from spare refresh shift register 204 so that normal refresh counter is reset to the initial value (0 . . . 0). The resetting of this normal refresh counter 203 causes count-up signal CUP to go down to the L level to reset spare refresh shift register 204 into the initial state. In response to this initialization, carry CRY is again set to the L level. Thereafter, refresh counter 203 is started to successively carry out the counting operation again from the initial value.

Here, another construction may be used in which, in place of carry CRY, when all block refresh completion instruction signal ALBRFC is issued, these counter 203 and shift register 204 are reset. In this case, when carry CRY is generated from all the memory sub-blocks, all block refresh completion instruction signal ALBRFC is issued. With this arrangement, refresh cycles can be made substantially the same in all the memory sub-blocks.

As illustrated in FIG. 44, with the arrangement in which refresh address is decoded to be applied to normal word driver 208 through multiplexer 206, word line selection signal is already transmitted to normal word driver 208 when a refreshing is executed. Therefore, it is only necessary to drive the addressed normal word line to the selected state in accordance with word line drive timing signal RXT, and similarly to the construction shown in FIG. 39, it is possible to drive the word line to the selected state at a faster timing.

Moreover, by utilizing spare shift refresh shift register 204, in the case in which a plurality of spare word lines are arranged, a spare word line can be specified through a shifting operation, and it becomes possible to eliminate the necessity of providing a spare decoder, and consequently to simplify the circuit construction.

Here, in place of the construction of this spare refresh shift register 204, a spare refresh counter and a spare refresh decoder may be arranged.

The local row control circuit and main control circuit in this modification are the same in construction as those shown in FIGS. 42 and 43.

By providing refresh counters corresponding to these memory sub-blocks, while normal accessing is successively made to one memory sub-block, refreshing is carried out in another memory sub-block, and upon completion of this normal accessing, refreshing is carried out on memory sub-blocks having the refreshing skipped. A conflict between normal accessing and refreshing can be suppressed and thus, it becomes possible to reduce the possibility of causing a waiting for normal accessing, and consequently to improve the accessing efficiency.

As described above, according to the third embodiment of the present invention, an address counter for generating a refresh address is arranged in the local control circuit, and in the de-asserted state of chip enable signal, a refresh address from this refresh address counter is normally transmitted to the word line driving unit. Thus, a row selection is started at a faster timing in the refreshing operation and thus, it becomes possible to shorten the waiting time for normal accessing even at the time of a conflict with normal accessing.

Moreover, in the de-asserted state of chip enable signal, a refresh address is normally applied to the word line driving unit. Therefore, it is possible to supply a refresh activation signal at a faster timing. In addition, since no redundancy determination operation is required, it is possible to carry out the array activation at a faster timing, to shorten the waiting time for external accessing at the time of a conflict with normal accessing, and consequently to achieve a processing system having a reduced waiting time.

Fourth Embodiment

Figure 47:
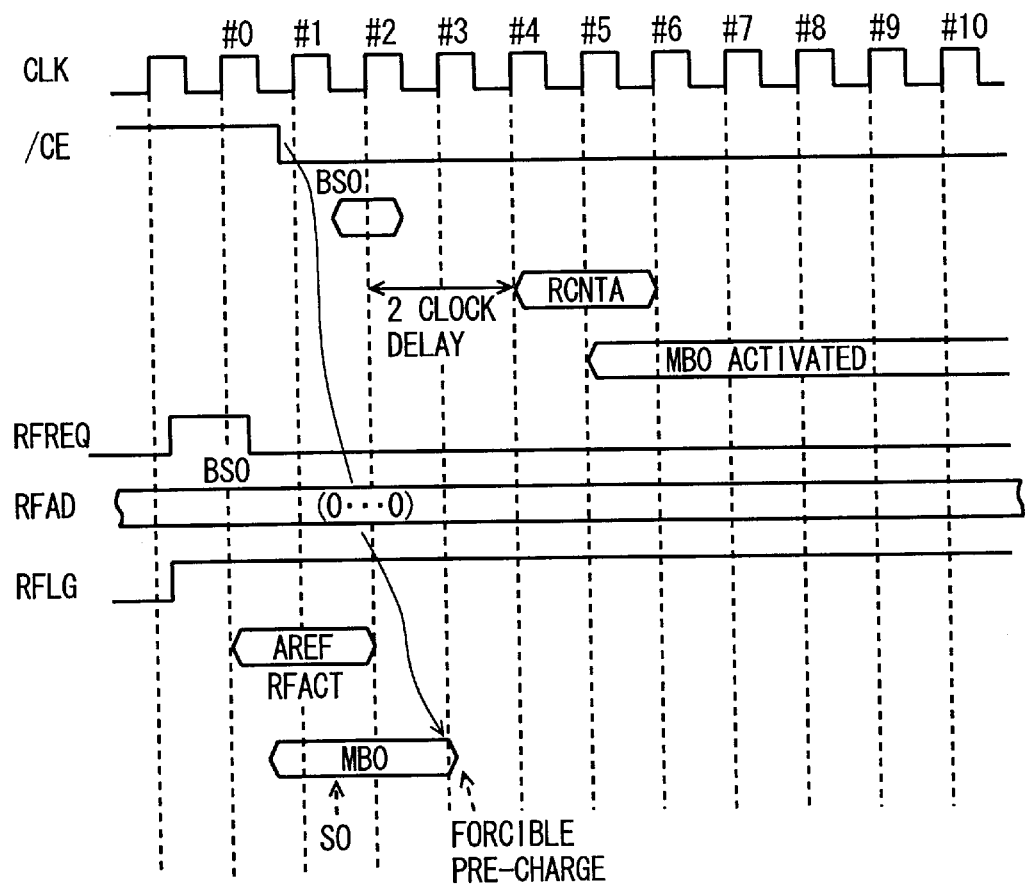
FIG. 47 is a timing chart that represents an operation of a semiconductor memory device in accordance with a fourth embodiment of the present invention.

FIG. 47 is a drawing that shows a refreshing operation sequence of a semiconductor memory device in accordance with a fourth embodiment of the present invention. In FIG. 47, in clock cycle #0, refresh request RFREQ is issued. Chip enable signal /CE is at the H level at the rising edge of clock signal CLK in clock cycle #0. When refresh flag RFLG is raised to the H level (asserted) in accordance with the refresh request, internal refresh instruction AREF (refresh row activation signal RFACT) is issued in synchronization with the rise of clock signal CLK in clock cycle #0. Thus, during clock cycle #0, memory block MB0 that allows refreshing is driven to the selected state in synchronization with the fall of clock signal CLK.

When chip enable signal /CE is fallen to the L level in clock cycle #0, and is at the L level at the rising edge of clock signal CLK in clock cycle #1, after a lapse of 2 clock cycles from this cycle, the refreshing operation is forcibly reset in synchronization with the rising edge of clock signal CLK in clock cycle #3, and memory block MB0 is forcibly driven to the pre-charged state. In this clock cycle #3, sense amplifier activation signal SO is in an activated state in memory sub-block MB0, and sensing, amplifying and latching operations are carried out on memory cell data by the associated sense amplifiers.

In this clock cycle #2, when normal access command (R/W command) is applied with memory sub-block MB0 being specified, main row activation signal RCNTA is issued after a lapse of 2 clock cycles so that memory block MB0 is activated in clock cycle #5.

In the forcible resetting of refreshing, refresh acceptance permission signal is maintained in the asserted state in memory block MB0. Moreover, at this time, the count of the refresh skip counter provided in the main control circuit is incremented by one so that refresh flag signal RFLG is maintained in the asserted state.

Since refresh flag RFLG is set to the H level in the case when chip enable signal /CE is in the L level, upon receipt of the next read/write (normal access instruction) command, refreshing is subsequently carried out in memory sub-block MB0.

In the case in which chip enable signal /CE is defined in the specification such that chip enable signal /CE should be set to the L level (asserted) one clock cycle before the clock cycle in which a normal access command is applied, when normal accessing is suspended due to a conflict occurring between normal accessing and refreshing, the refreshing is forcibly finished after a lapse of 2 cycles. According to such arrangement, normal accessing can be made with a delay of 2 clock periods, and consequently a high-speed accessing is achieved.

In this case, when it is defined in the specification that the assertion of chip enable signal /CE should be made 3 clock cycles before the application of a normal access instruction, no delay in normal accessing occurs.

Figure 48:
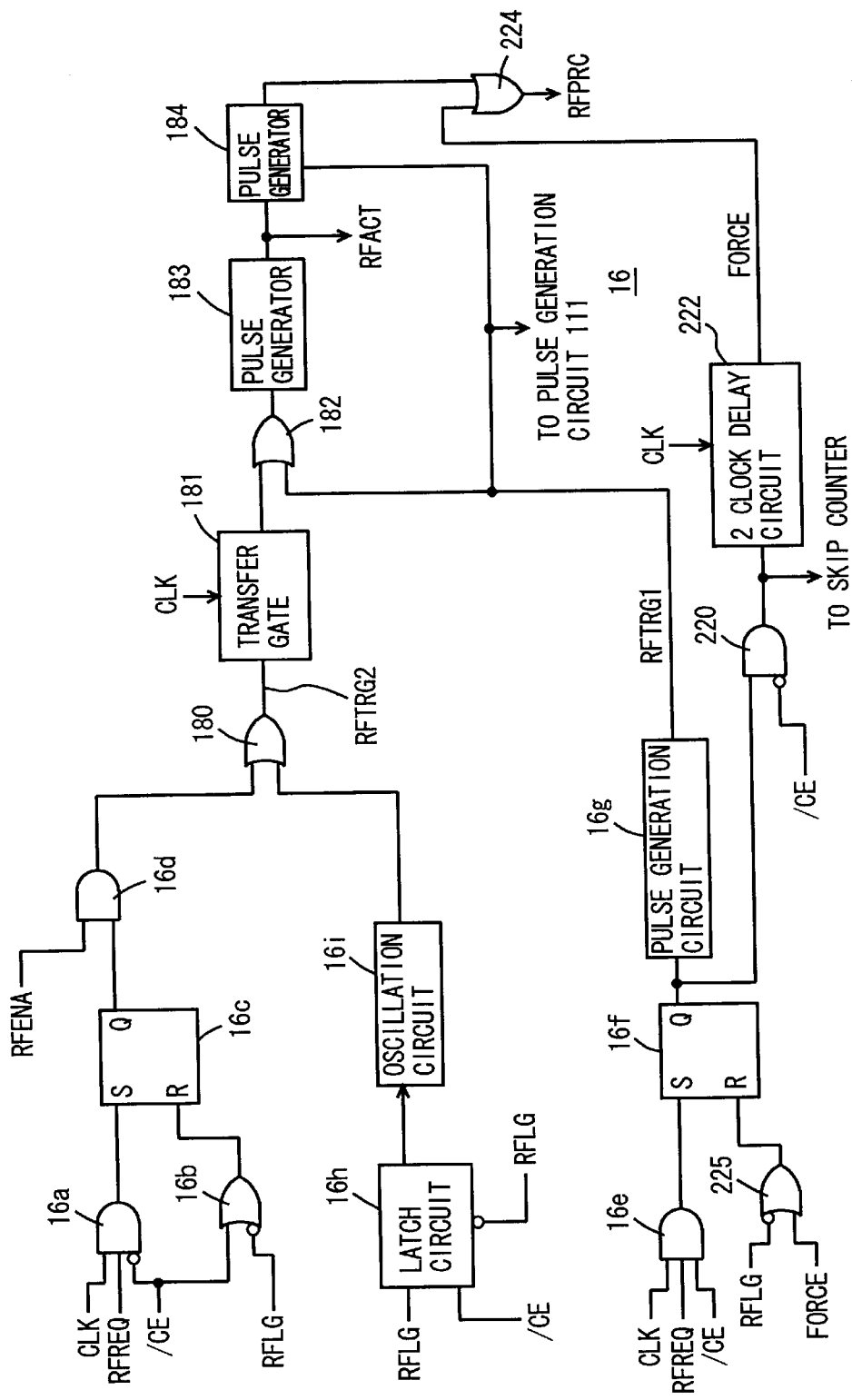
FIG. 48 is a drawing that schematically shows the construction of a refresh instruction generation circuit in accordance with the fourth embodiment of the present invention.

FIG. 48 is a drawing that schematically shows the construction of a refresh instruction signal generation section in accordance with the fourth embodiment of the present invention. The construction of the refresh instruction signal generation section shown in FIG. 48 is different from the construction of refresh signal generation circuit 16 shown in FIG. 42 in the following points. There is provided: a gate circuit 220 receiving the output signal of set/reset flip-flop 16f and chip enable signal /CE; a 2 clock delay circuit 222 for delaying the output signal of this gate circuit 220 by 2 clock cycles of clock signal CLK; and an OR circuit 224 for generating refresh pre-charge activation signal RFPRC in accordance with the output signal of pulse generator 184 and output signal FORCE of 2 clock delay circuit 222.

Moreover, in order to reset set/reset flip-flop 16f, there is provided a gate circuit 225 receiving refresh flag RFLG and refresh forceful reset instruction signal FORCE. This gate circuit 225 resets flip-flop 16f when refresh flag RFLG is de-asserted or refresh forcible reset instruction signal FORCE is asserted.

The other constructions shown in FIG. 48 are the same as those shown in FIG. 42; and the corresponding parts are indicated by the same reference numerals, and the detailed description thereof is not repeated.

In the construction of refresh instruction signal generation circuit 16 shown in FIG. 48, in the case when refresh request RFREQ is issued when chip enable signal /CE is in the H level, set/reset flip-flop 16f is set so that refresh trigger signal RFTRG1 is generated by pulse generation circuit 16g and refresh activation signal RFACT (internal refresh instruction AREF) is also issued.

When chip enable signal /CE goes down to the L level when set/reset flip-flop 16f is in the set state, the output signal of gate circuit 220 goes to the H level. The output signal of this gate circuit 220 is applied to refresh skip counter 12 shown in, for example, FIG. 4, so that its count is incremented by one.

Here, 2 clock delay circuit 222 takes in the output signal of gate circuit 220 in response to the rise of clock signal CLK, and after a lapse of 2 clock cycles, outputs the taken in signal in synchronization with the rise of clock signal CLK. Therefore, when there is a conflict between refreshing and normal accessing, refresh pre-charge activation signal RFPRC from OR circuit 224 is activated after a lapse of 2 clocks since the fall of chip enable signal /CE so that the memory block being refreshed is forcibly returned to the pre-charged state.

In this construction using refresh instruction signal generation circuit 16 shown in FIG. 48, no determination is made as to whether or not there is a conflict between refreshing and normal accessing in the same memory block. When chip enable signal /CE goes from the H level to the L level while refreshing is being executed in any of memory blocks, the refreshing operation is forcibly finished. Therefore, it is not particularly necessary to provide conflict detection circuit 80 shown in FIG. 24. By modifying 4 cycle delay circuits 84 and 90 for waiting normal access, utilized into 2 cycle delay circuits, main row activation signal RCNTA and main pre-charge activation signal RCNTP can be activated after the completion of forcible pre-charge in refreshing, thereby making it possible to carry out a normal accessing operation.

At the time of forcible resetting of refreshing, flip-flop 16f is reset by using gate circuit 225. Therefore, after the forcible resetting of the refreshing operation, each time refresh request RFREQ is issued, gate circuit 16a sets set/reset flip-flop 16c. Therefore, during the asserted state of refresh flag RFLG in accordance with the refresh request, refreshing is executed in accordance with refresh enable signal RFENA in the normal access execution.

Figure 49:
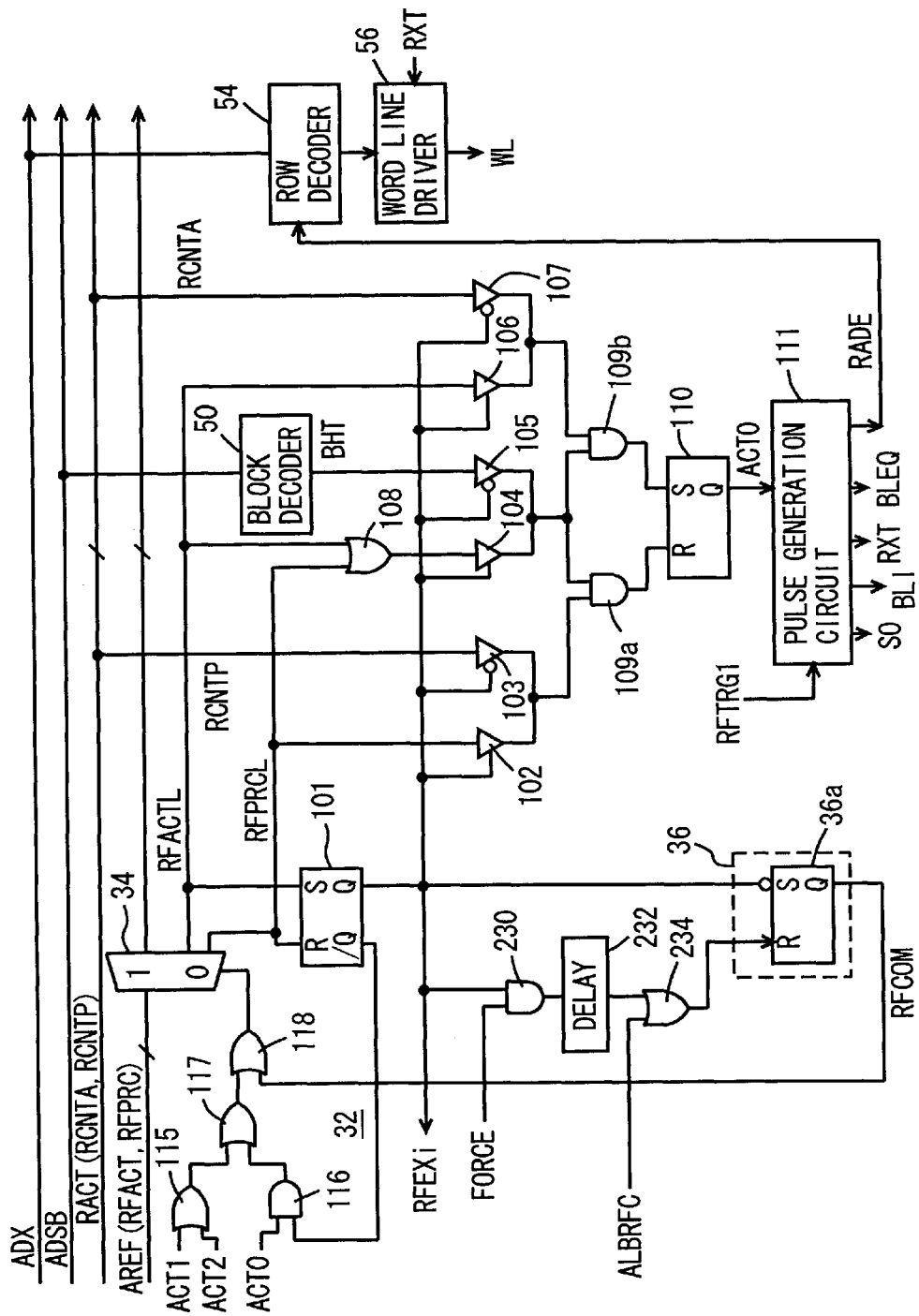
FIG. 49 is a drawing that schematically shows the construction of a local control circuit of a semiconductor memory device in accordance with the fourth embodiment of the present invention.

FIG. 49 is a drawing that shows an example of the construction of a local control circuit of a semiconductor memory device in accordance with the fourth embodiment of the present invention. The local control circuit shown in FIG. 49 is different from the local control circuit shown in FIG. 31 in the following points. There is provided: an AND circuit 230 receiving refresh execution block instruction signal RFEXi and refresh forceful reset instruction signal FORCE from 2 clock delay circuit 222 shown in FIG. 49; a delay circuit 232 for delaying the output signal of AND circuit 230 by a predetermined period of time; and an OR circuit 234 receiving the output signal of delay circuit 232 and all block refresh completion instruction signal ALBRFC. The output signal of this OR circuit 234 is applied to reset input R of set/reset flip-flop 36a.

The other constructions shown in FIG. 49 are the same as those shown in FIG. 31, and thus, the corresponding parts are indicated by the same reference numerals and the detailed description thereof is not repeated.

Delay circuit 232 is provided for timing adjustment. At the time of forcible resetting in refreshing, refresh forcible reset instruction signal FORCE is set to the H level and refresh pre-charge activation signal RFPRC is then activated so that refresh execution block instruction signal RFEXi is de-asserted. In accordance with de-assertion of refresh execution block instruction signal RFEXi, set/reset flip-flop 36a is set, and refresh completion instruction signal RFCOM attains the H level.

AND circuit 230 receives refresh forcible reset instruction signal FORCE and refresh execution block instruction signal RFEXi, and prior to the de-assertion of refresh execution block instruction signal RFEXi, the output signal of AND circuit 230 is set to the H level for a predetermined period. By delaying the output signal of AND circuit 230 by a predetermined period of time using delay circuit 232, after set/reset flip-flop 36a is set, set/reset flip-flop 36a is again reset by OR circuit 234. Therefore, refresh completion instruction signal RFCOM is set in the L level, to maintain the memory block in a state capable of accepting the refreshing. With utilization of the construction shown in FIGS. 48 and 49, a word line having the refreshing forcibly reset can be refreshed again in accordance to the next refresh request.

As described above, in accordance with the fourth embodiment of the present invention, in the case when there is a conflict between refreshing and normal accessing, this refreshing is forcibly reset, the refresh flag is asserted and refresh acceptance permission signal is set in a state of permitting the acceptance of refresh instruction and refreshing is again carried out on the memory sub-block having the refreshing forcible rest. Thus, it becomes possible to shorten the waiting time for normal accessing and consequently to achieve a high-speed accessing.

Fifth Embodiment

Figure 50:
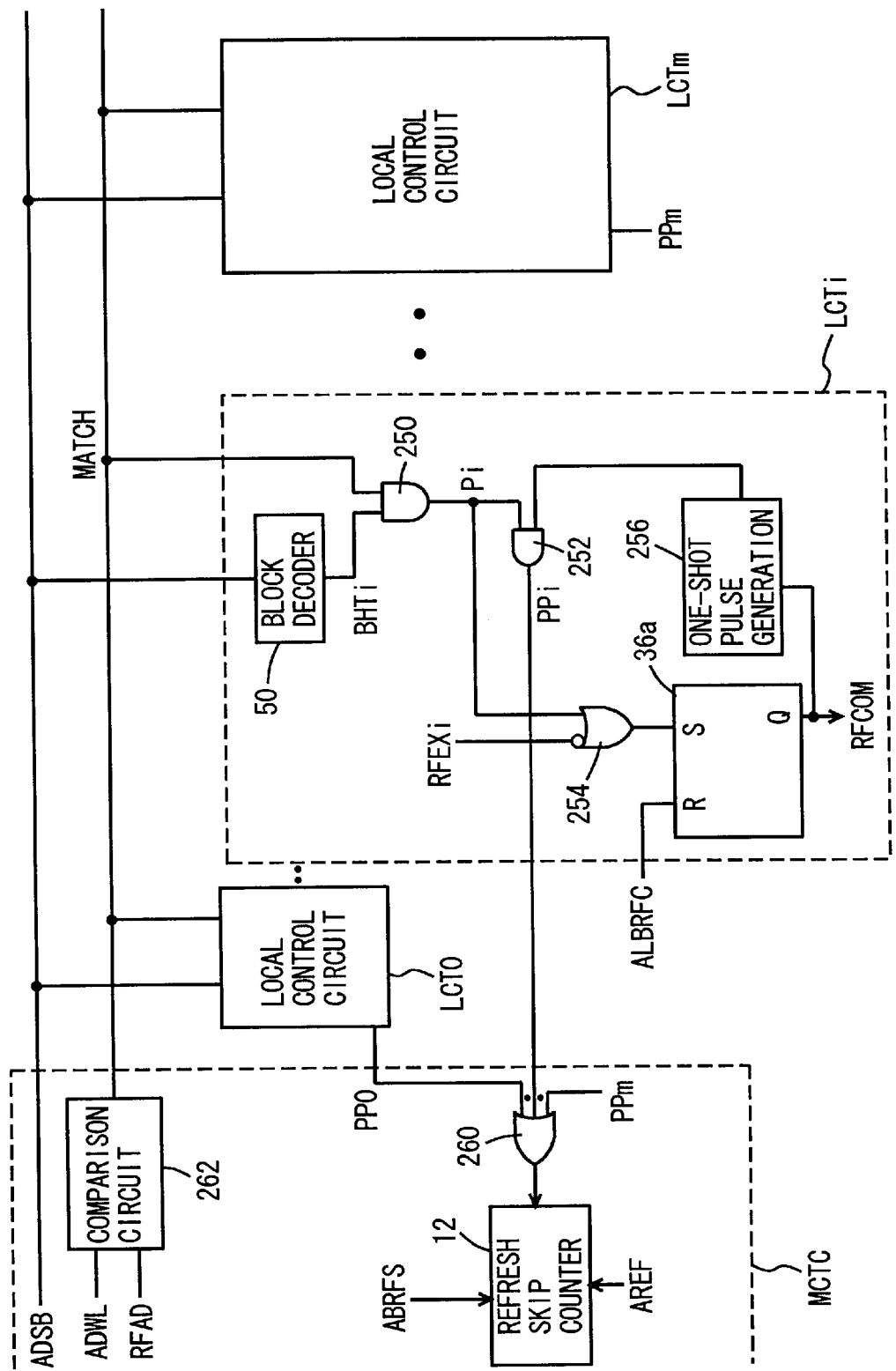
FIG. 50 is a drawing that schematically shows the construction of a main part of a semiconductor memory device in accordance with a fifth embodiment of the present invention.

FIG. 50 is a drawing that schematically shows the construction of a main part of a semiconductor memory device in accordance with a fifth embodiment of the present invention. In FIG. 50, main control circuit MCTL includes a comparison circuit 262 for comparing externally applied address signal ADWL with refresh address signal RFAD, and an OR circuit 260 receiving pseudo refresh completion signal PP0–PPm from local control circuits LCT0–LCTm. When the output signal of OR circuit 260 attains the H level, the count of refresh skip counter 12 is decremented by one.

Since local control circuits LCT0–LCTm each have the same construction, FIG. 50 shown the construction of a main part of local control circuit LCTi, representatively.

In FIG. 50, local control circuit LCTi includes: an AND circuit 250 receiving block hit signal BHTi outputted from block decoder 50 and coincidence detection signal MATCH from comparison circuit 262; a gate circuit 254 receiving output signal Pi of AND circuit 250 and refresh execution block instruction signal RFEXi; a set/reset flip-flop 36a which is set in response to the rise of the output signal of gate circuit 254, and reset in response to the activation of all block refresh completion instruction signal ALBRFC; a one-shot pulse generation circuit 256 for generating a one-shot pulse signal in response to the rise of refresh completion instruction signal RFCOM outputted by set/reset flip-flop 36a; and an AND circuit 252 receiving the output signal of one-shot pulse generation circuit 256 and output signal Pi of AND circuit 250 to generate pseudo refresh completion signal PPi.

In the case when refresh address RFAD and access address ADWL are coincident with each other, coincidence detection signal MATCH of comparison circuit 262 is asserted to be the H level. In the case when memory sub-block MBi corresponding to local control circuit LCTi is selected, block hit signal BHTi outputted from block decoder 50 attains the H level, and output signal Pi of AND circuit 250 attains the H level. In this case, the row to be refreshed and the row to be accessed are the same. Therefore, in the case in which the row of the corresponding memory sub-block has not been refreshed, set/reset flip-flop 36a is set through this gate circuit 254 so that a pseudo refresh completion state is set. Therefore, in the case when refreshing has not been carried out in accordance with refresh address RFAD, even when refresh instruction AREF is applied, this refresh instruction AREF is not taken in since the pseudo refresh completion state is set.

When this refresh completion instruction signal RFCOM goes to the H level, one-shot pulse generation circuit 256 generates one-shot pulse signal. AND circuit 252 composes the output signal of one-shot pulse generation circuit 256 and output signal Pi of AND circuit 250 to generate pseudo refresh completion signal PPi. Specifically, in the corresponding memory sub-block, in the case in which refreshing is not completed on the row specified by refresh address RFAD, if the corresponding refresh row is accessed in a normal access mode, the output signal PPi of AND circuit 252 is asserted. Responsively, local control circuit LCTi determines that refreshing is completed on the refresh row specified by refresh address RFAD, and sets refresh completion instruction signal RFCOM to the activated state, thereby inhibiting refresh address RFAD from being taken in.

Since it is determined that refreshing has been completed on the row specified by refresh address RFAD with respect to this memory sub-block MBi, the count of refresh skip counter 12 is decremented by one by pseudo refresh completion signal PPi from AND circuit 252. In the case in which count of the skip counter is set in the initial value, the count maintains the initial value.

In the case when in this local control circuit LCTi, the row specified by refresh address RFAD has already been refreshed, refresh completion instruction signal RFCOM is in the H level. At this time, even when externally applied address signal ADWL is coincident with refresh address RFAD to set coincident detection signal MATCH to the H level, the output signal of one-shot pulse generation circuit 256 is already returned to the L level. Thus, pseudo refresh completion signal PPi from AND circuit 252 maintains the L level.

By using one-shot pulse generation circuit 256 and AND circuit 252, pseudo refresh completion signal PPi is asserted only in the memory sub-block in which refreshing is not carried out and normal accessing is executed on the refresh row, and the count of refresh skip counter 12 is decremented by one to simulate or fictionalize that the refreshing is completed.

Here, for the other constructions of the local control circuit, the same construction as those described in the aforementioned first to fourth embodiments can be utilized, and the main control circuit can have the same construction as those described in the aforementioned first to fourth embodiments.

In the case when, upon successive accessing to one memory block, the row being accessed is identical to the refresh row, even if refreshing is skipped, it is simulated or fictionalized that the refreshing is performed without the refreshing skipping. Thus, it is possible to carry out refreshing more efficiently. It is also possible to prevent prolongation of the refreshing cycle time.

Here, in the case in which refresh counters are arranged in the respective memory sub-blocks, upon activation of block hit signal, the output count of the corresponding refresh counter is compared with the externally applied word line address so as to detect their coincidence/non-coincidence. In the case of coincidence, the count of refresh counter is incremented by one so that it can be fictionalized that refresh row is refreshed.

Sixth Embodiment

Figure 51:
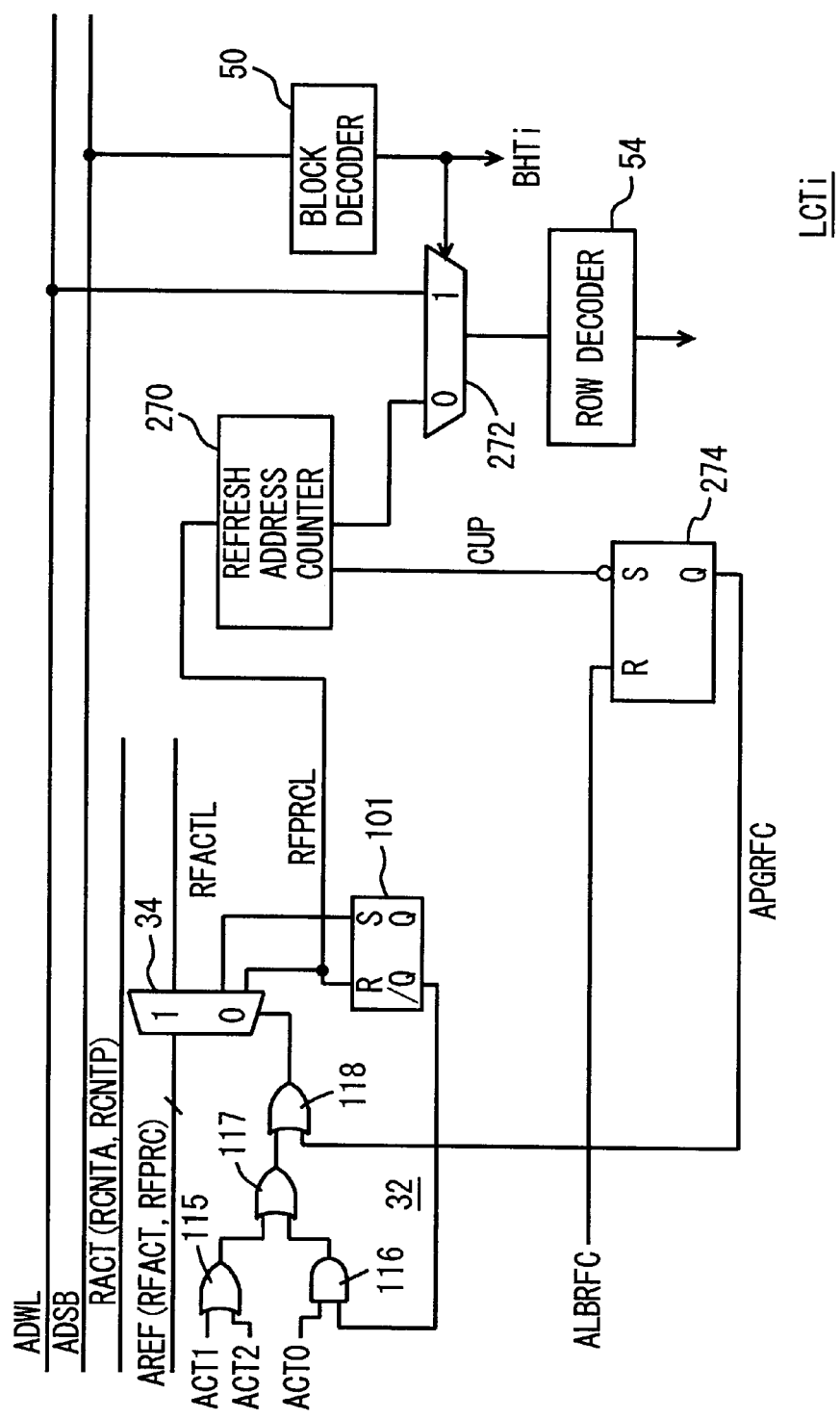
FIG. 51 is a drawing that schematically shows the construction of a main part of a local control circuit in accordance with a sixth embodiment of the present invention.

FIG. 51 is a drawing that schematically shows a main part of the construction of local control circuit LCTi in accordance with a sixth embodiment of the present invention. The construction of local control circuit LCTi shown in FIG. 51 corresponds to local control circuit LCTi shown in FIG. 31.

In FIG. 51, local control circuit LCTi includes a refresh address counter 270 responsive to the activation of local refresh pre-charge activation signal RFPRCL applied from multiplexer 34 for carrying out a counting operation, and a multiplexer 272 for selecting one of the externally applied word line address signal ADWL and the count of refresh address counter 270 and applying the selected one to row decoder 54, in accordance with block hit signal BHTi from block decoder 50.

Refresh counter 270 generates a refresh address to the corresponding memory sub-block.

When block bit signal BHTi is in the H level, multiplexer 272 selects the externally applied word line address signal ADWL, for application to row decoder 54. In the case when block hit signal BHTi is in the inactivated state, multiplexer 272 selects the output signal of refresh address counter 270. In a case other than the normal accessing to the corresponding memory sub-block, the output count of refresh address counter 270 is selected and applied to row decoder 54 by multiplexer 272, so that it is possible to prevent charging and discharging of the input section of this row decoder.

Local control circuit LCTi further includes a set/reset flip-flop 274 which is set in response to the fall of count-up signal CUP of refresh address counter 270 and outputs all page refresh completion indication signal APGRFC. This set/reset flip-flop 274 is reset in response to the activation of all block refresh completion indication signal ALBRFC. All page refresh completion instruction signal APGRFC outputted by this set/reset flip-flop 274 is supplied to OR circuit 118.

All page refresh completion instruction signal APGRFC indicates that all word lines are refreshed once in the corresponding memory sub-block.

The other constructions of this local control circuit LCTi are the same as those shown in FIG. 31.

In the construction shown in FIG. 51, when refreshing is operable, refreshing is carried out by selecting refresh row in accordance with refresh address from refresh address counter 270. When all the word lines (pages) are refreshed in the corresponding memory sub-block, refresh address counter 270 performs a counting operation in response to the activation of refresh pre-charge indication signal RFPRCL, and sets its count to the initial value, as well as setting count-up instruction signal CUP to the L level.

Set/reset flip-flop 274 is set in response to the rise of count-up instruction signal CUP so that all page refresh completion instruction signal APGRFC is set in the activated state and responsively, the output signal of OR circuit 118 is set to the H level to inhibit de-multiplexer 34 from accepting refresh activation instruction signal AREF (refresh activation signal RFACT and refresh pre-charge instruction signal RFPRC).

All page refresh completion instruction signal APGRFC is asserted in all the memory sub-blocks, and responsively, all block refresh completion instruction signal ALBRFC is activated, so that set/reset flip-flop 274 is reset. Thereafter, when internal refresh instruction AREF is taken in, a refresh row is specified at an address starting from the initial value of refresh address counter 270 and a refreshing operation is carried out.

In the construction shown in FIG. 51, all block refresh completion instruction signal ALBRFC may be generated by refresh counter 18 shown in FIG. 4. However, in this case, refresh counter 18 needs to count the number of all the refresh rows in sub-memory blocks MB0–MB0. Moreover, alternatively, an arrangement may be used in which, all page refresh completion instruction signals APGRFC from all the memory sub-blocks are transferred to the main control circuit, and when all page refresh completion instruction signal APGRFC is asserted in every memory sub-block in the main control circuit, all block refresh completion instruction signal ALBRFC is activated.

In the case of the construction shown in FIG. 51, when normal accessing is successively carried out on the same memory sub-block, refreshing is skipped for the memory sub-block under memory accessing, and refreshing is successively executed on the other memory sub-blocks that can accept refreshing. Upon completion of successive normal accessing to the memory sub-block, refreshing is again restarted on the memory sub-block.

Therefore, in the case of the construction shown in FIG. 51, the count of refresh address counter 270 is individually altered in each of the memory sub-blocks. A memory sub-block that can accept the refreshing exists even in normal accessing, and therefore, in the memory sub-block that can accept refreshing, refreshing is carried out in accordance with the count of refresh address counter 270. Consequently, it is possible to prevent refreshing from being skipped due to conflict between normal accessing and refreshing, and to prevent prolongation of the refresh cycle, ensuring the reliability of stored data in the memory cells.

Moreover, when refresh request is issued in assertion of the chip enable signal, a refresh instruction is issued when a subsequent normal accessing is made. In each local control circuit, it is possible to determine whether or not refreshing is acceptable, and refreshing is carried out in the memory sub-block allowing the refreshing. Therefore, it is possible to avoid conflict between normal accessing and refreshing, and consequently to achieve an efficient data accessing.

A conflict avoiding process is required when normal accessing is made when refreshing is being executed in the de-asserted state of chip enable signal /CE. In this case, by advancing the timing at which chip enable signal /CE is asserted, it is possible to avoid any delay in normal accessing.

As described above, in accordance with the sixth embodiment of the present invention, the refresh address counter for generating refresh addresses is arranged in each of local control circuits, and refreshing is carried out in accordance with the count of the corresponding refresh address counter in each of local control circuits. Thus, it is possible to prevent conflict between normal accessing and refreshing, and consequently to achieve an efficient refreshing.

Seventh Embodiment

Figure 52:
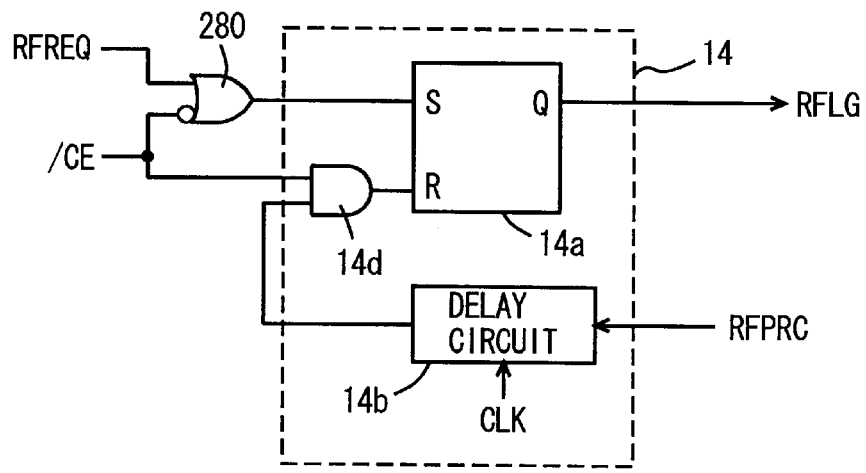
FIG. 52 is a drawing that schematically shows the construction of a refresh flag generation circuit in accordance with a seventh embodiment of the present invention.

FIG. 52 is a drawing that schematically shows the construction of refresh flag generation circuit 14 in accordance with a seventh embodiment of the present invention. The refresh flag generation circuit 14 shown in FIG. 52 is different from the refresh flag generation circuit 14 shown in FIG. 14 in the following points. First, set/reset flip-flop 14a for generating refresh flag RFLG is set when the output signal of gate circuit 280 receiving refresh request RFREQ and chip enable signal /CE attains the H level, and reset when the output signal of AND circuit 14d receiving the output signal of delay circuit 14b and chip enable signal /CE attains the H level.

Gate circuit 280 outputs a signal of H level when refresh request RFREQ is issued or when chip enable signal /CE is set in the L level.

In the construction of refresh flag generation circuit 14 shown in FIG. 52, when chip enable signal /CE goes to the L level (asserted), the output signal of gate circuit 280 attains the H level so that set/reset flip-flop 14a is set to maintain refresh flag RFLG in the asserted state. In this case, since chip enable signal /CE is in the L level, AND circuit 14d outputs a signal of L level. Therefore, even when refresh pre-charge activation signal RFPRC is activated, no resetting is carried out on set/reset flip-flop 14a and refresh flag RFLG is maintained in the asserted state during the L level of chip enable signal /CE.

When chip enable signal /CE is in the de-asserted state at the H level, this refresh flag is set in accordance with refresh request signal RFREQ. In the case when chip enable signal /CE rises from the L level to the H level, if refresh flag RFLG is maintained in the set state, as described with reference to FIG. 17, a refreshing operation is repeated at predetermined intervals, and refreshing flag RFLG is reset.

In the construction of refresh flag generation circuit 14 shown in FIG. 52, during the L level period of chip enable signal /CE, refresh flag RFLG is in the H level. Therefore, as shown in FIG. 16, irrespective of refresh request RFREQ, when data accessing is made, refreshing is successively executed. Thus, refreshing is carried out on memory cell data in a short refresh cycle.

Figure 53A:
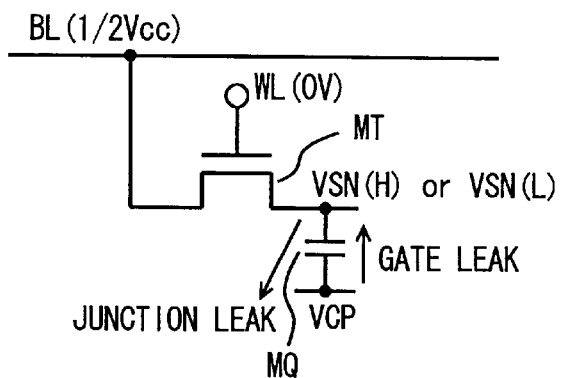
FIGS. 53A and 53B are drawings that schematically show leakage current paths in respective operation states of memory cells.

FIG. 53A is a drawing that schematically shows the applied voltage to a memory cell in a pause state. Each memory cell includes an access transistor MT constituted by insulated gate type field effect transistor (MOS transistor) and a memory cell capacitor MQ that is connected to bit lines BL through this access transistor MT. Memory cell capacitor MQ is connected between storage node SN and cell plate node. A cell plate voltage VCP is supplied to this cell plate node. The gate of access transistor MT is connected to word lines WL.

The pause state is a data holding state, and the memory cell peripheral circuitry is in a pre-charged state. In this state, bit lines BL are set at the pre-charge voltage level, and normally set at a voltage level of the intermediate voltage Vcc/2. Here, voltage Vcc represents an array power supply voltage that is a voltage corresponding to the H level of memory cell storage data.

A voltage VSN of storage node SN is VSN (H) or VSN (L) in accordance with storage data. In this state, there are a junction leakage due to a charge flowing from the storage node to the substrate region and a gate leakage current due to a charge flowing from the cell plate node to the storage node through memory capacitor MQ. In the pause state, word line WL is in the non-selected state, and is at the ground voltage (0 V) level.

Figure 53B:
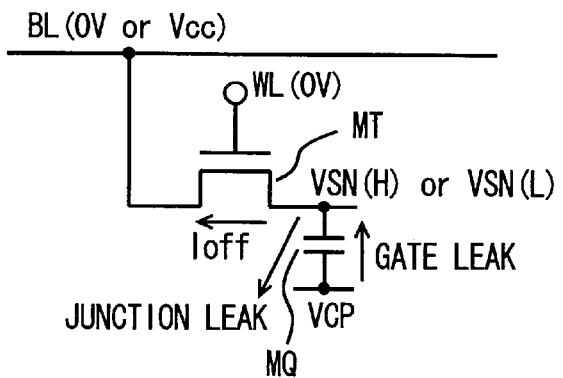

As illustrated in FIG. 53B, when a memory cell row is selected, with respect to a non-selected memory cell, even when the corresponding word line WL is in the non-selected state, the corresponding bit line BL changes to 0V or power supply voltage Vcc level in accordance with storage data in the selected memory cell. This state is generally referred to as "disturb state" in which a leakage current Ioff flows from the storage node to bit lines BL through memory transistor MT.

Therefore, in this disturb state, more charges flow out than in the normal pause state. Thus, as the time-based duty of entering disturb state is greater, the data holding characteristic of memory cells deteriorates. Therefore, the time period during which chip enable signal /CE is asserted corresponds to the time period in which memory cells are brought to the disturb state, and memory cells having a greater time-based duty of entering this disturb state might appear.

In the asserted state in chip enable signal /CE, refresh flag RFLG is forcibly maintained in the set state and refreshing is carried out on memory cell data for each normal access. Thus, a charge flow out during this disturb state in memory cells can be compensated for, to improve the data holding characteristics.

In the de-asserted state of chip enable signal /CE, refreshing is carried out in accordance with the issuance cycle of refresh request RFREQ.

In the asserted state of chip enable signal /CE, the refresh flag is forcibly maintained in the asserted state, and refreshing is carried out in a shorter cycle independently of the refresh request. Thus, it is possible to achieve a semiconductor memory device that is superior in data holding characteristic and can reduce the current consumption in the stand-by state.

Modification

Figure 54:
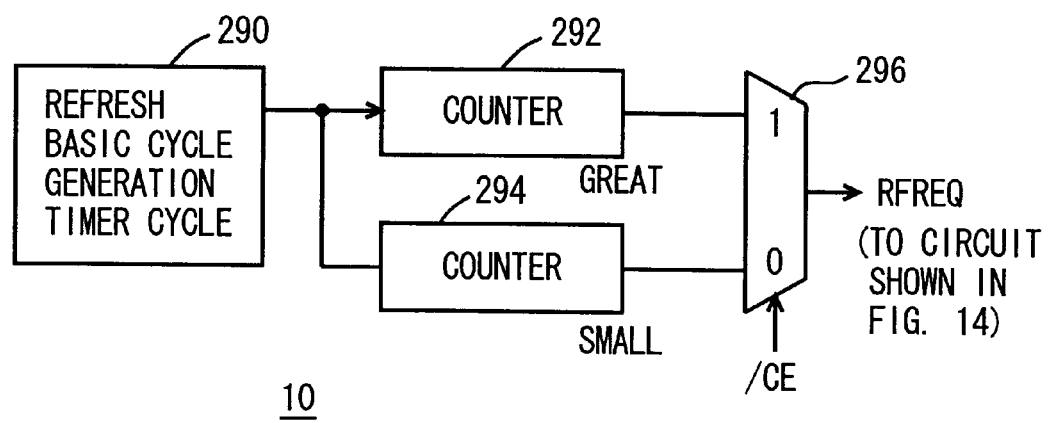
FIG. 54 is a drawing that schematically shows the construction of a modification of the seventh embodiment of the present invention.

FIG. 54 is a drawing that schematically shows the construction of a refresh timer 10 in accordance with a modification of the seventh embodiment of the present invention. In FIG. 54, refresh timer 10 includes: a refresh basic cycle generation timer circuit 290 for generating a signal having a constant cycle; a counter 292 for counting the output signal of refresh basic cycle generation timer circuit 290; a counter 292 for generating a refresh request trigger signal each time the output signal of this refresh basic cycle generation timer circuit 290 reaches a predetermined value; a counter 294 which counts the output signal of refresh basic cycle generation timer circuit 290, and generates a refresh request trigger signal each time the count reaches a predetermined value; and a multiplexer 296 which selects refresh request trigger signals outputted from counters 292 and 294 in accordance with chip enable signal /CE to output refresh request RFREQ. Refresh request RFREQ outputted from this multiplexer 296 is applied to the refresh flag generation circuit 14 shown in FIG. 14.

The count range of counter 292 is set to be greater, while the count range of counter 294 is set to be smaller. Therefore, counter 292 generates the refresh request trigger signal in a longer cycle than counter 294 does.

Refresh basic cycle generation timer circuit 290 is constituted by, for example, an oscillation circuit, and generates pulse signals in predetermined constant periods. Multiplexer 296 selects refresh request trigger signal outputted by counter 292 when chip enable signal /CE is in the H level, and selects refresh request trigger signal outputted by counter 294 when chip enable signal /CE is in the L level. Therefore, when chip enable signal /CE is in the H level, the issuance cycle of refresh request RFREQ is longer than the issuance cycle of refresh request RFREQ in the case when chip enable signal /CE is in the L level. Therefore, even with respect to memory cells that enter the disturb state when chip enable signal /CE is in the L level, since the refresh period is short, it is possible to reliably prevent degradation in data holding characteristics.

Here, in the construction as shown in FIG. 54, counters 292 and 294 always carry out counting operations. However, this counter 292 may be configured to perform a counting operation when chip enable signal /CE is in the H level, and counter 294 may be configured to perform a counting operation when chip enable signal /CE is in the L level.

Moreover, with respect to refresh timer 10, such an arrangement may be employed that two refresh basic reference frequency generation timer circuits having different oscillation cycles are provided, and these oscillation signals are selected in accordance with chip enable signal /CE, and applied to a counter so that refresh request RFREQ is issued from this counter. When chip enable signal /CE is in the H level, the output pulse of the oscillation circuit having a longer oscillation cycle is counted, while in the case when chip enable signal /CE is in the L level, the output pulse of the oscillation circuit having a shorter oscillation cycle is counted. In this manner, when chip enable signal /CE is in the L level, it is possible to shorten the refresh interval.

As described above, in accordance with the seventh embodiment, when chip enable signal /CE is in the L level, the refresh cycle is made shorter, and thus, it is possible to prevent degradation in the data holding characteristic of memory cells in the disturb state.

As described above, in accordance with the present invention, the refresh instruction is commonly issued to memory sub-blocks, and memory sub-blocks allowing refreshing are allowed to take in this refresh instruction to carry out refreshing. Thus, it is possible to fully hide the refreshing operation from outside, and consequently to achieve a semiconductor memory device that is compatible with an SRAM interface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory sub-blocks each having a plurality of memory cells; refresh instruction issuing circuitry for issuing a refresh instruction instructing refreshing of storage data of the memory cells;
    refresh address generation circuitry for generating a refresh address specifying a memory cell to be refreshed in each of said memory sub-blocks; and
    refresh control circuits, arranged corresponding to the respective memory sub-blocks, each for, upon receipt of said refresh instruction, permitting a refreshing operation to be carried out in a corresponding memory sub-block in accordance with said refresh address and transferring said refresh instruction to a subsequent memory sub-block at a subsequent stage in a transfer sequence of the refresh instruction when the refreshing operation is completed when a corresponding memory sub-block satisfies a condition different from a predetermined condition, while transferring the refresh instruction as received to the subsequent memory sub-block when the predetermined condition is satisfied in the corresponding memory sub-block.

2. The semiconductor memory device according to claim 1, wherein, each refresh control circuit suspends, upon completion of refreshing on said refresh address, an acceptance of said refresh instruction until said refresh address is updated.

3. The semiconductor memory device according to claim 1, wherein said refresh control circuits each comprise:

a latch circuit for taking in said refresh instruction and generating a block refresh instruction for instructing a refreshing operation on a corresponding memory sub-block; and a latch control circuit for determining whether said predetermined condition is satisfied for the corresponding memory sub-block, and permitting the taking in of said refresh instruction of said latch circuit in accordance with a result of determination, said predetermined condition being at least one of a condition that data accessing is being carried out on either of the corresponding memory sub-block and an adjacent memory sub-block adjacent to the corresponding memory sub-block and a condition that refreshing is completed on said refresh address in the corresponding memory sub-block.

4. The semiconductor memory device according to claim 1, wherein each refresh control circuit transfers said refresh instruction to a memory sub-block adjacent in a predetermined refresh sequence when said predetermined condition is satisfied.

5. The semiconductor memory device according to claim 1, wherein said refresh instruction is transferred to said plurality of memory sub-blocks in a predetermined sequence via a refresh instruction transfer path, and said semiconductor memory device further comprises a skip count circuit for counting the refresh instruction returned through said refresh instruction transfer path, and said refresh instruction issuing circuitry issues said refresh instruction repeatedly while a count of said skip count circuit is different from zero.

6. The semiconductor memory device according to claim 5, further comprising:

an all block refresh completion detection signal generation circuit for detecting that refreshing is completed on said plurality of memory sub-blocks in accordance with said refresh instruction and the count of said skip count circuit, and generating an all block refresh completion detection signal indicating that refreshing is completed in all the memory sub-blocks, wherein said refresh address generation circuit counts said all block refresh completion detection signal to generate said refresh address.

7. The semiconductor memory device according to claim 5, further comprising:

a refresh enable circuit for generating a refresh enable signal in accordance with an external access instruction signal; and a refresh flag issuing circuit for setting a refresh flag while the count of said skip counter circuit is different from zero, wherein said refresh instruction issuing circuitry issues said refresh instruction each time said refresh enable signal is activated while said refresh flag is set.

8. The semiconductor memory device according to claim 1, further comprising:

a comparison circuit for comparing a refresh block address designating a memory sub-block to be refreshed with an externally applied access block address specifying a memory sub-block to be accessed and producing a conflict detection signal in accordance with a result of comparison;

an access conflict detection circuit for detecting which of the refresh instruction and an external access instruction is issued earlier; and a conflict avoiding circuit coupled to said comparison circuit and said access conflict detection circuit, for delaying the external access until the refreshing is completed when there is a conflict between the refreshing and the external access and when said external access instruction is issued later than said refresh instruction.

9. The semiconductor memory device according to claim 1, wherein said plurality of memory sub-blocks are divided into a plurality of groups, a transfer path for the refresh instruction is arranged in parallel for each respective group of the memory sub-blocks, and the refreshing is carried out individually in each respective group in accordance with the refresh instruction on a corresponding refresh instruction transfer path.

10. The semiconductor memory device according to claim 1, wherein said refresh address generation circuitry comprises refresh address counters arranged corresponding to the respective memory sub-blocks, and said semiconductor memory device further comprises:

an internal address generation circuit commonly arranged for said plurality of memory sub-blocks, and generating an internal address signal corresponding to an external address signal to transmit said internal address signal commonly to said plurality of memory sub-blocks, and the refresh control circuit comprises:

a selection circuit responsive to a selection instruction signal generated according to whether the refreshing is executable, for selecting either of a refresh address signal corresponding to a count generated by a corresponding refresh counter and said internal address signal; and cell selection signal generation circuit for generating a cell selection signal for selecting a memory cell in a corresponding memory sub-block in accordance with an output signal of said selection circuit.

11. The semiconductor memory device according to claim 10, further comprising:

redundancy determining circuits, arranged corresponding to the respective memory sub-blocks, each for determining whether said internal address signal specifies a defective address in a corresponding memory sub-block, wherein said refresh address counter further generates a count for specifying a cell address for a redundancy replacement for repairing a defective memory cell at the defective address in the corresponding memory sub-block, and said selection circuit further comprises a circuit for selecting either of an output signal of a corresponding redundancy determining circuit and said refresh address signal.

12. The semiconductor memory device according to claim 1, further comprising:

a refresh reset circuit responsive to an external access instruction, for forcibly terminating a refreshing operation being executed in accordance with said refresh instruction.

13. The semiconductor memory device according to claim 12, wherein the refresh control circuit comprises a circuit responsive to forcible resetting by said refresh reset circuit, for holding a corresponding memory sub-block in a refresh uncompleted state.

14. The semiconductor memory device according to claim 1, further comprising:

an address coincidence determining circuit for determining whether an external address applied externally coincides with said refresh address, and generating a coincidence determination result instruction signal indicating a result of determination, wherein the refresh control circuit further comprises a circuit according to an externally applied block selection signal applied concurrently with said external address for specifying a memory sub-block and said coincidence determination result instruction signal, for setting a corresponding memory sub-block in a refresh finished state of the refreshing according to said refresh instruction being completed.

15. The semiconductor memory device according to claim 1, wherein said refresh address generation circuitry comprises, refresh address counters, arranged corresponding to the respective memory sub-blocks, each for performing a counting operation each time refreshing is executed in a corresponding memory sub-block, and the refresh control circuit comprises a control circuit for, after counting up to a predetermined count of a corresponding refresh counter, stopping acceptance of said refresh instruction until refreshing is completed on all the memory sub-blocks.

16. The semiconductor memory device according to claim 1, further comprising:

a circuit responsive to activation of an external access enable instruction, for setting said refresh instruction issuing circuitry in a regularly refresh enabled state, and causing said refresh instruction issuance circuit to issue said refresh instruction in accordance with an external access request.

17. The semiconductor memory device according to claim 1, wherein said refresh instruction issuing circuitry comprises a circuit for issuing, upon inactivation of external access enable instruction, a refresh request at a longer interval than in activation o f said external access enable instruction, for activating said refresh instruction.

18. The semiconductor memory device according to claim 1, wherein said predetermined condition includes a condition that a corresponding memory sub-block has the refreshing completed with respect to the refresh address, and a condition that an adjacent memory sub-block arranged adjacent in a refresh instruction transferring path to the corresponding memory sub-block is in an active state, and a condition that the corresponding memory sub-block is in an active state.

* * * * *